United States Patent
Mizutani et al.

(10) Patent No.: US 6,506,535 B1
(45) Date of Patent: Jan. 14, 2003

(54) POSITIVE WORKING PHOTORESIST COMPOSITION

(75) Inventors: Kazuyoshi Mizutani, Shizuoka (JP); Kenichiro Sato, Shizuoka (JP); Kunihiko Kodama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/698,221

(22) Filed: Oct. 30, 2000

(30) Foreign Application Priority Data

| Oct. 28, 1999 | (JP) | 11-307317 |
| Nov. 22, 1999 | (JP) | 11-331785 |
| Nov. 29, 1999 | (JP) | 11-338487 |
| Dec. 2, 1999 | (JP) | 11-343714 |

(51) Int. Cl.[7] ............... G03C 1/72; G08F 34/00
(52) U.S. Cl. ............... 430/270.1; 430/281.1; 430/286.1; 430/905; 526/281; 526/319; 526/321
(58) Field of Search ............... 430/270.1, 281.1, 430/286.1; 526/281, 319, 321

(56) References Cited

U.S. PATENT DOCUMENTS

| 5,843,624 | A |   | 12/1998 | Houlihan et al. | 430/296 |
| 5,985,524 | A | * | 11/1999 | Allen et al. | 430/326 |
| 6,013,413 | A | * | 1/2000 | Frechet et al. | 430/270.1 |
| 6,159,655 | A | * | 12/2000 | Sato | 430/270.1 |
| 6,159,656 | A | * | 12/2000 | Kawabe et al. | 430/270.1 |
| 6,245,485 | B1 | * | 6/2001 | Aoai et al. | 430/288.1 |
| 6,312,867 | B1 | * | 11/2001 | Kinsho et al. | 430/270.1 |
| 6,444,408 | B1 | * | 9/2002 | Brock et al. | 430/322 |
| 2002/0004569 | A1 | * | 1/2002 | Hatakeyama et al. | 526/242 |

FOREIGN PATENT DOCUMENTS

| JP | A-5-11450 | 1/1993 |
| JP | A-8-160623 | 6/1996 |
| JP | A-10-324748 | 12/1998 |
| JP | A-11-60733 | 3/1999 |
| JP | A-11-60734 | 3/1999 |

OTHER PUBLICATIONS

Sooriyakumaran, Ratnam et al., 193 nm positive–tone bilayer resist based on norbornene–maleic anhydride copolymers, 6/2000, Proc. SPIE vol. 3999, p. 1171–1180, Advances in Resist Technology and Processing XVII, Francis Houlihan, Ed.*

"Study of Bi–layer Silylation Process for 193 nm Lithography" in Advances in Resist Technology and Processing XVI, pp. 239–251 (Mar. 1999).

"Novel Silicon–Containing Resist for EUV and 193 nm Lithography" in Advances in Resist Technology and Processing XVI, pp. 214–221 (Mar. 1999).

"Chemical Aspects of Silicon–Containing Bilayer Resists" in Advances in Resist Technology and Processing XVI, pp. 562–573 (Mar. 1999).

* cited by examiner

*Primary Examiner*—Janet Baxter
*Assistant Examiner*—Yvette M. Clarke
(74) *Attorney, Agent, or Firm*—Sughrue Mion, PLLC

(57) ABSTRACT

Disclosed is a positive working photoresist composition comprising an acid-decomposable polymer containing at least a repeating unit represented by the following formula (I) and at least either one repeating unit represented by the following formula (IIa) or (IIb), and also disclosed is a positive working photoresist composition comprising (A) a compound capable of generating an acid upon irradiation with actinic rays or radiation, (B) an acid-decomposable polymer containing at least a repeating unit represented by the following formula (I) and at least either one repeating unit represented by the following formula (IIa) or (IIb), (C) at least one solvent capable of dissolving the components (A) and (B), (D) an organic basic compound and (E) at least one surfactant selected from fluorine-containing surfactants, silicon-containing surfactants and nonionic surfactants:

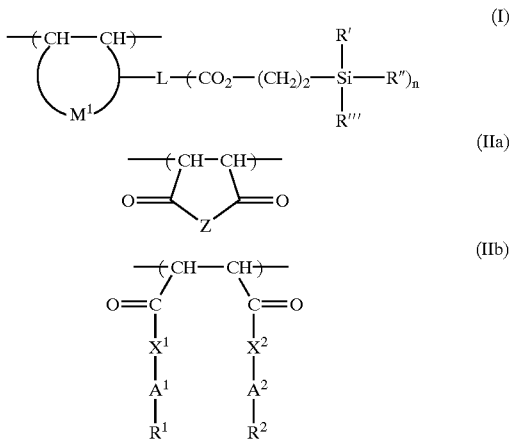

19 Claims, No Drawings

POSITIVE WORKING PHOTORESIST COMPOSITION

FIELD OF THE INVENTION

The present invention relates to a positive working photoresist composition for use in the production of semiconductor integrated circuit devices, mask for the production of integrated circuits, printed wiring boards, liquid crystal panels and the like.

BACKGROUND OF THE INVENTION

In the formation of a pattern for the production of electric parts of a semiconductor device, a magnetic bubble memory, an integrated circuit and the like, a method of using a photoresist sensitive to ultraviolet ray or visible light has heretofore been widely used in practice. The photoresist includes a negative working photoresist where the area irradiated with light is insolubilized in the developer, and a positive working photoresist where the area is solubilized. The photoresist has been predominated by the negative working photoresist until recent years because the sensitivity of the negative working photoresist is higher than that of the positive working photoresist and also is favored with excellent properties necessary for the wet etching, namely, adhesive property to the substrate and resistance against chemicals.

However, with the progress of the semiconductor device and the like toward higher densification and higher integration, the pattern is extremely reduced in the line width or space. Furthermore, dry etching is employed for the etching of the substrate and to keep up with this, the photoresist is demanded to have high resolution and high dry etching resistance. Because of these reasons, the positive working photoresist occupies the major part at present. Particularly, out of the positive working photoresists, an alkali development-type positive working photoresist using as the base an alkali-soluble novolak resin described, for example, in J. C. Strieter, *Kodak Microelectronics Seminar Proceedings*, 116 (1976) is excellent in the sensitivity, resolution and dry etching resistance and therefore, predominating in the current process.

However, in recent years, the electronic equipment tends to have multiple functions and higher performance and in order to attain higher densification and higher integration, formation of a finer pattern is strongly demanded.

More specifically, the integrated circuit is not so much reduced in the vertical dimension as compared with the reduction in the transverse direction, therefore, the ratio of the height to the width of the resist pattern must be necessarily large. Due to this, as the pattern becomes finer, the resist pattern on a wafer having a complicated structure with different heights encounters more difficulties in suppressing its dimensional change.

Furthermore, in various exposure systems, a problem arises accompanying the reduction of the minimum dimension. For example, in the exposure by light, the interference action of the reflected light ascribable to the difference in height on a substrate greatly affects the dimensional precision and in the electronic beam exposure, the ratio of the height to the width of a fine resist pattern cannot be increased due to the proximity effect generated by the back scattering of electrons.

It has been found that a large number of these problems can be solved by using a multi-layer resist system. The multi-layer resist system in general is described in *Solid State Technology*, 74 (1981) and other publications also report studies on this system.

Generally, the multi-layer resist system includes a three-layer resist system and a two-layer resist system. The three-layer resist system is a method of coating an organic flattening film on a substrate having different heights, superposing thereon an inorganic intermediate layer and a resist, patterning the resist, dry-etching the inorganic intermediate layer using the resist as the mask, and patterning the organic flattening foil by $O_2RIE$ (reactive ion etching) using the inorganic intermediate layer as the mask. In this system, conventional techniques can be fundamentally used, therefore, studies thereon have been started from an early time. However, this system has problems in that the process is very complicated or since three layers different in the physical properties, namely, organic film, inorganic film and organic film are superposed, cracks or pinholes are readily generated in the intermediate layer.

As compared with this three-layer resist system, the two-layer resist system uses a resist having the properties both of the resist and the inorganic intermediate layer of the three-layer resist system, namely, a resist having resistance against oxygen plasma, therefore, cracks or pinholes are prevented from occurring. Furthermore, the reduction from three layers to two layers simplifies the process. However, unlike the three-layer resist system where a conventional resist can be used as the upper layer resist, the two-layer resist system must disadvantageously develop a new resist having resistance against oxygen plasma.

Under these circumstances, it has been demanded to develop a high-sensitivity and high-resolution positive working photoresist having excellent oxygen plasma resistance and capable of being used as the upper layer resist in the two-layer resist system and the like, particularly an alkali development-system resist for which the current process can be used without any change.

In the production of ultra-LSI comprising lines having a width of half micron or less, the wavelength used in the exposure apparatus for lithography becomes shorter and shorter and at the present time, studies are being made on the use of KrF eximer laser ray or ArF eximer laser ray. In the formation of a pattern for lithography using such a short wavelength, a resist called chemical amplification-type resist is generally used.

Particularly, in the case of using ArF eximer laser rays, it is not suitable in view of the optical transparency of the film to introduce a phenol structure into the binder resin as a main component of the resist. The binder generally used is a resin polymer such that a structure capable of decomposing by an acid and generating a carboxylic acid, such as tertiary ester (e.g., tert-butyl ester), 1-alkyladamantyl ester or THP protected entity of carboxylic acid, is contained as the image-forming site. The Si-containing polymer containing an image-forming site transparent to ArF eximer laser rays is disclosed, for example, in JP-A-8-160623 (the term "JP-A" as used herein means an "unexamined published Japanese patent application"), JP-A-10-324748, JP-A-11-60733 and JP-11-60734.

*SPIE*, Vol. 3678, Item 241, discloses a chemical amplification-type resist using a vinyl polymer containing a tris(trimethylsilyl)silylethyl group at the acid-decomposable ester terminal. Also, *SPIE*, Vol. 3678, Items 214 and 562, discloses a chemical amplification-type resist using a vinyl polymer containing a trimethyl-bis(trimethylsilyl) disilaheptylmethylpropyl ester at the acid-decomposable ester terminal. However, these techniques have a problem in the exposure margin. The term "exposure margin" as used herein means a phenomenon such that when the exposure amount is changed, the line width of the pattern obtained is changed in accordance therewith.

The storage stability of the resist solution is also in need of improvements. For example, when a chemical amplification-type photoresist is stored in the liquid state, due to the poor compatibility between the resin and the photo-acid generator, particles may be generated in the solution or the resist performance may be deteriorated.

Also, the above-described techniques have a problem in the defocus latitude depended on line pitch. Recent devices have a tendency to contain various patterns, therefore, the resist is required to have various capabilities. One of these capability is the defocus latitude depended on line pitch. More specifically, a device has a portion where lines are crowded, a pattern where the space is broad as compared with lines, and isolated lines. Therefore, it is important to resolve various lines with high reproducibility. However, reproduction of various lines cannot be easily attained because of optical factors and the resist is not yet succeeded in undertaking the part of solving this problem at present.

As an example of the Si-containing resist having an image-forming site transparent to ArF eximer laser rays, a terpolymer comprising maleic acid anhydride-unsaturated tert-butyl carboxylate-allyltrimethylsilane is disclosed in J-P-A-5-11450. This resist exhibits excellent resolution in the working of an ultrafine pattern but the resulting resist pattern has roughness (asperities) at the edges. The term "edge roughness" as used herein means the fact that due to the properties of the resist, the edges at the top and bottom of a resist line pattern irregularly fluctuate in the direction perpendicular to the line direction and asperities are observed on the edges when the pattern is viewed from right above.

These resists have problems in that due to the reduction in the wettability to the developer, development defects are readily generated and also, due to failure in the formation of a rectangular pattern, the dimensional shift increases at the transfer of the pattern to the lower layer in the subsequent oxygen plasma etching step.

In the production of semiconductor devices, apart from the purpose of forming a fine line width pattern, the hole for piecing an electrode metal of the semiconductor device up to the semiconductor surface, namely, the contact hole is also becoming finer, and a positive working photoresist composition suitable therefor is demanded. However, it has been heretofore not known at all how to design the raw materials for the resist so as to make such a fine contact hole. It is known that a resist suitable for obtaining the above-described fine line width pattern is not necessarily suitable for making such a contact hole.

SUMMARY OF THE INVENTION

Accordingly, an object of the present invention is to provide a positive working resist composition for use in the production of semiconductor devices, which has high sensitivity, ensures high resolution of 0.15 µm or less and provides a photoresist having a rectangular shape.

Another object of the present invention is to provide a positive working resist composition favored with good wettability to the developer and reduced in the development defects.

Still another object of the present invention is to provide a positive working photoresist composition reduced in the dimensional shift at the transfer of a pattern to the lower layer in the oxygen plasma etching process.

Still another object of the present invention is to provide a positive working photoresist composition for use in the production of semiconductor devices, which ensures sufficiently high sensitivity and resolution at the formation of a contact hole pattern.

Still another object of the present invention is to provide a positive working photoresist composition reduced in the generation of particles in the resist solution and further favored with excellent defocus latitude depended on line pitch.

Still another object of the present invention is to provide a positive working photoresist composition for use in the production of semiconductor devices, which forms a resist pattern improved in the edge roughness.

Still another object of the present invention is to provide a positive working photoresist composition favored with excellent storability, more specifically, reduced in the aging change (e.g., increase of particles, fluctuation in sensitivity) particularly under elevated temperature conditions, for example, at 40° C.

Still another object of the present invention is to provide a positive working photoresist composition having excellent defocus latitude depended on line pitch.

Still another object of the present invention is to provide a positive working photoresist composition for use in the production of semiconductor devices, which has an effect of improving the exposure margin (particularly exposure margin of isolated lines), more specifically, reducing the fluctuation in the line width of isolated lines when the exposure amount is changed.

As a result of extensive investigations on the resist composition in the positive working chemical amplification system, the present inventors have found that by using an acid-decomposable resin obtained by copolymerizing specific repeating units, the objects of the present invention can be attained.

More specifically, the above-described objects can be attained by using the following positive working photoresist compositions containing an acid-decomposable resin (acid-decomposable polymer).

(1) A positive working photoresist composition comprising an acid-decomposable polymer containing at least a repeating unit represented by the following formula (I) and at least either one repeating unit represented by the following formula (IIa) or (IIb):

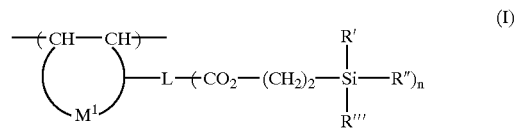

wherein $M^1$ represents an atomic group for forming an alicyclic structure which contains two bonded carbon atoms (C—C) and which may have a substituent, n represents 1 or 2, L represents a single bond or a (n+1)-valent linking group with one end being connected to the carbon atom participating in the formation of a ring, R', R" and R'" each independently represents an alkyl, phenyl, trialkylsilyl or trialkylsilyloxy group having a linear or branched chain:

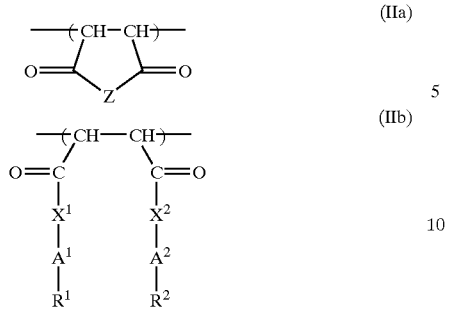

wherein Z represents oxygen atom or —N(R³)—, R³ represents hydrogen atom, a hydroxyl group, an alkyl group having a linear or branched chain or —O—SO₂—R⁴, R⁴ represents an alkyl group or a trihalomethyl group, X¹ and X² each independently represents oxygen atom, sulfur atom, —NH— or —NHSO₂—, A¹ and A² each independently represents a single bond or a divalent linking group, R¹ and R² each represents hydrogen atom, a cyano group, a hydroxyl group, —COOH, —COOR⁵, —CO—NH—R⁶, an alkyl group which may be substituted, an alkoxy group which may be substituted, or a cyclic hydrocarbon group (which may have an ester group or a carbonyl group in the bond of forming a ring) which may be substituted, R⁵ represents an alkyl group which may be substituted, or a cyclic hydrocarbon group (which may have an ester group or a carbonyl group in the bond of forming a ring) which may be substituted, and R⁶ represents an alkyl group which may be substituted.

(2) The positive working photoresist composition as described in (1) above, wherein the acid-decomposable polymer further contains a repeating unit represented by the following formula (III):

wherein M² represents an atomic group for forming an alicyclic structure which contains two bonded carbon atoms (C—C) and which may have a substituent, and R¹¹ and R¹² each independently represents hydrogen atom, a cyano group, a halogen atom or an alkyl group which may have a substituent.

(3) A positive working photoresist composition comprising:
(A) a compound capable of generating an acid upon irradiation with actinic rays or radiation,
(B) an acid-decomposable polymer containing at least a repeating unit represented by the following formula (I) and at least either one repeating unit represented by the following formula (IIa) or (IIb),
(C) at least one solvent capable of dissolving the components (A) and (B),
(D) an organic basic compound, and
(E) at least one surfactant selected from fluorine-containing surfactants, silicon-containing surfactants and nonionic surfactants:

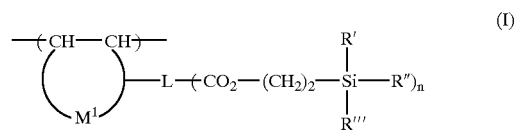

wherein M¹ represents an atomic group for forming an alicyclic structure which contains two bonded carbon atoms (C—C) and which may have a substituent, n represents 1 or 2, L represents a single bond or a (n+1)-valent linking group with one end being connected to the carbon atom participating in the formation of a ring, R', R" and R'" each independently represents an alkyl, phenyl, trialkylsilyl or trialkylsilyloxy group having a linear or branched chain:

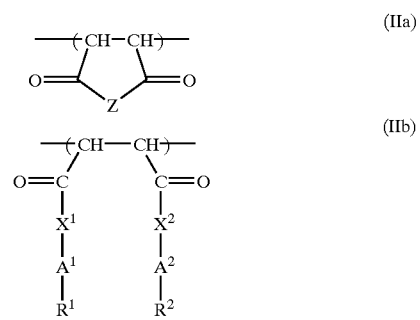

wherein Z represents oxygen atom or —N(R³)—, R³ represents hydrogen atom, a hydroxyl group, an alkyl group having a linear or branched chain or —O—SO₂—R⁴, R⁴ represents an alkyl group or a trihalomethyl group, X¹ and X² each independently represents oxygen atom, sulfur atom, —NH— or —NHSO₂—, A¹ and A² each independently represents a single bond or a divalent linking group, R¹ and R² each represents hydrogen atom, a cyano group, a hydroxyl group, —COOH, —COOR⁵, —CO—NH—R⁶, an alkyl group which may be substituted, an alkoxy group which may be substituted, or a cyclic hydrocarbon group (which may have an ester group or a carbonyl group in the bond of forming a ring) which may be substituted, R⁵ represents an alkyl group which may be substituted, or a cyclic hydrocarbon group (which may have an ester group or a carbonyl group in the bond of forming a ring) which may be substituted, and R⁶ represents an alkyl group which may be substituted.

(4) The positive working photoresist composition as described in (3) above, wherein the compound (A) capable of generating an acid upon irradiation with actinic rays or radiation generates an acid having one structure selected from the following groups (A1) to (A3) upon irradiation with actinic rays or radiation:
(A1) CF₃SO₃H,
(A2) CF₃(CF₂)ₙSO₃H (wherein n represents an integer of 1 to 9), and (A3) $C_6F_mH_{5-m}SO_3H$ (wherein m represents an integer of 1 to 5).

(5) The positive working photoresist composition as described in (3) above, wherein the compound (A) capable of generating an acid upon irradiation with actinic rays or radiation is a sulfonium salt compound represented by the following formula (PAG4):

(PAG4)

wherein Rs1 to Rs3 each independently represents an alkyl group which may have a substituent or an aryl group which may have a substituent, each pair out of Rs1 to Rs3 may be combined through a single bond or a substituent, and $Z^-$ represents a counter anion.

(6) The positive working photoresist composition as described in (3) above, wherein the compound (A) is a sulfonium salt compound capable of generating an acid upon irradiation with actinic rays or radiation, represented by the following formula (sI):

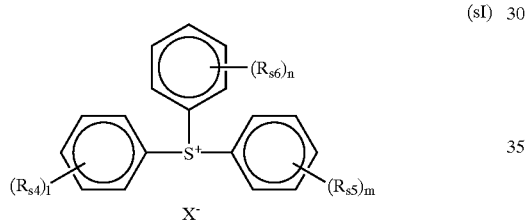

(sI)

wherein Rs4 to Rs6 each represents hydrogen atom, an alkyl group which may have a substituent, a cycloalkyl group which may have a substituent, an alkoxy group which may have a substituent, an alkoxycarbonyl group which may have a substituent, an acyl group which may have a substituent, an acyloxy group which may have a substituent, a nitro group, a halogen atom, a hydroxyl group or a carboxyl group, l represents a number of 1 to 5, m represents a number of 0 to 5, and n represents a number of 0 to 5, with the proviso that when l+m+n is 1, Rs4 represents an alkyl group which may have a substituent, a cycloalkyl group which may have a substituent, an alkoxy group which may have a substituent, an alkoxycarbonyl group which may have a substituent, an acyl group which may have a substituent, or an acyloxy group which may have a substituent, X represents $R-SO_3$, and R represents an aliphatic hydrocarbon group which may have a substituent or an aromatic hydrocarbon group which may have a substituent.

(7) The positive working photoresist composition as described in (3) above, wherein the polymer (B) further contains a repeating unit represented by the following formula (III):

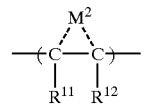

(III)

wherein $M^2$ represents an atomic group for forming an alicyclic structure which contains two bonded carbon atoms (C—C) and which may have a substituent, and $R^{11}$ and $R^{12}$ each independently represents hydrogen atom, a cyano group, a halogen atom or an alkyl group which may have a substituent.

(8) The positive working photoresist composition as described in (3) above, wherein the solvent (C) is a mixture of at least one selected from propylene glycol monoalkyl ether acetates and at least one selected from alkyl lactates.

(9) The positive working photoresist composition as described in (3) above, wherein the solvent (C) is a mixed solvent containing at least one solvent selected from the following Group A and at least one solvent selected from the following Group B or containing at least one solvent selected from Group A and at least one solvent selected from the following Group C:
Group A: propylene glycol monoalkyl ether alkoxylate
Group B: propylene glycol monoalkyl ether, alkyl lactate and alkoxyalkyl propionate
Group C: γ-butyrolactone, ethylene carbonate and propylene carbonate.

(10) The positive working photoresist composition as described in (3) above, wherein the solvent (C) is a mixed solvent containing at least one solvent selected from the following Group A, at least one solvent selected from the following Group B and at least one solvent selected from the following Group C:
Group A: propylene glycol monoalkyl ether alkoxylate
Group B: propylene glycol monoalkyl ether, alkyl lactate and alkoxyalkyl propionate
Group C: γ-butyrolactone, ethylene carbonate and propylene carbonate.

(11) The positive working photoresist composition as described in (3) above, wherein the solvent (C) is a mixed solvent containing at least one alkyl lactate and at least one of an ester solvent and an alkoxyalkyl propionate.

(12) The positive working photoresist composition as described in (3) above, wherein the solvent (C) is a solvent containing heptane.

(13) The positive working photoresist composition as described in (12) above, wherein the solvent (C) further contains at least one of propylene glycol monoalkyl ether, alkyl lactate and alkoxyalkyl propionate.

(14) The positive working photoresist composition as described in (11) above, wherein the solvent (C) further contains at least one of γ-butyrolactone, ethylene carbonate and propylene carbonate.

(15) The positive working photoresist composition as described in (3) above, wherein the compound (A) capable of generating an acid upon irradiation with actinic rays or radiation is at least one compound represented by the following formula (I'), (II') or (III'):

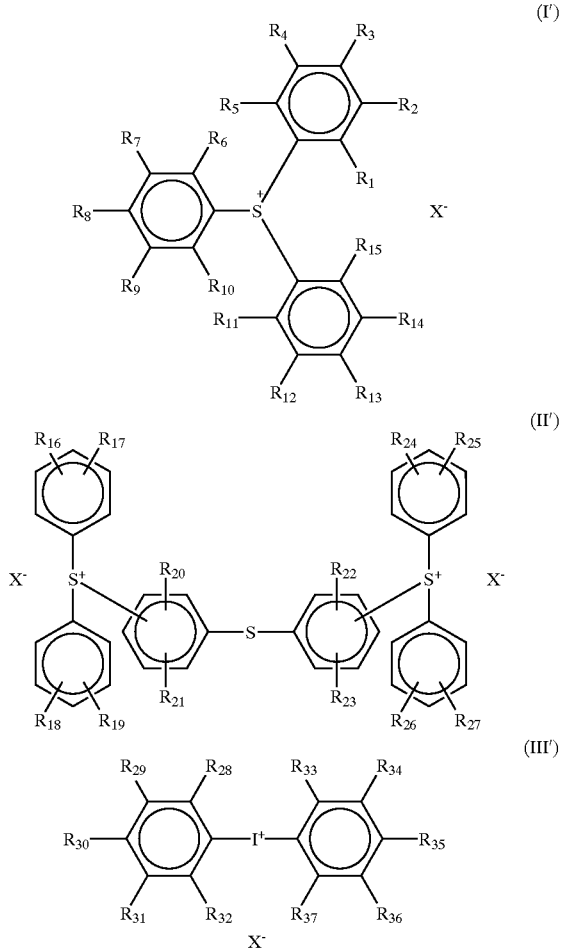

wherein $R_1$ to $R_{37}$, which may be the same or different, each represents hydrogen atom, a linear, branched or cyclic alkyl group, a linear, branched or cyclic alkoxy group, a hydroxyl group, a halogen atom or —S—$R_{38}$ group; $R_{38}$ represents a linear, branched or cyclic alkyl group or an aryl group; two or more of $R_1$ to $R_{15}$, two or more of $R_{16}$ to $R_{27}$, or two or more of $R_{28}$ to $R_{37}$ may be combined to form a ring containing one or more selected from a single bond, carbon, oxygen, sulfur and nitrogen; and $X^-$ represents $R^FSO_3^-$ (wherein $R^F$ represents a fluorine-substituted linear, branched or cyclic alkyl group having two or more carbon atoms.

(16) The positive working photoresist composition as described in (3) above, wherein RF represented by $X^-$ is a fluorine-substituted linear alkyl group represented by $CF_3(CF_2)_y$ (wherein y is an integer of 1 to 15).

(17) The positive working photoresist composition as described in (16) above, wherein y is an integer of 3 to 13.

(18) The positive working photoresist composition as described in (17) above, wherein y is an integer of 7 to 11.

(19) The positive resist composition as described in (3) above, wherein the acid-decomposable polymer (B) is a resin which increases in the solubility in an alkali developer under the action of an acid.

DETAILED DESCRIPTION OF THE INVENTION

In the present invention, an acid-decomposable resin obtained by copolymerizing specific repeating units is used, whereby a positive photoresist composition having excellent capabilities described above can be obtained. In a preferred embodiment, as in (3) above, the acid-decomposable polymer (component (B)) is used in combination with a compound capable of generating an acid upon irradiation with actinic rays or radiation (photo-acid generator, component (A)), a solvent capable of dissolving the components (A) and (B) (component (C)), an organic basic compound (component (D)), and a surfactant (component (E)) The compounds which can be used in the present invention are described in detail one by one.

(A) Compound Capable of Generating an Acid Upon Irradiation With Actinic Rays or Radiation (Photo-acid Generator)

The photo-acid generator for use in the present invention is a compound which generates an acid upon irradiation with actinic rays or radiation.

The compound capable of generating an acid upon irradiation with actinic rays or radiation for use in the present invention may be appropriately selected from photocationic polymerization initiators, photoradical polymerization initiators, photo-decoloring agents for dyes, photo-discoloring agents, compounds capable of generating an acid upon irradiation with a known ray used for a microresist or the like (for example, ultraviolet or far ultraviolet ray of 200 to 400 nm, preferably g ray, h ray, i ray and KrF eximer laser ray), an ArF eximer laser ray, an electron beam, an X ray, a molecular beam or an ion beam, and a combination thereof.

Other examples of the compound capable of generating an acid upon irradiation with actinic rays or radiation for use in the present invention include onium salts such as diazonium salts described in S. I. Schlesinger, *Photogr. Sci. Eng.*, 18, 387 (1974), T. S. Bal et al., *Polymer*, 21, 423 (1980), etc., ammonium salts described in U.S. Pat. Nos. 4,069,055, 4,069,056 and Re27,992, JP-A-3-140140, etc., phosphonium salts described in D. C. Necker et al., *Macromolecules*, 17, 2468 (1984), C. S. Wen et al., *Teh, Proc. Conf. Rad. Curing ASIA*, p. 478, Tokyo, October (1988), U.S. Pat. Nos. 4,069,055 and 4,069,056, etc., iodonium salts described in J. V. Crivello et al., *Macromolecules*, 10 (6) 1307 (1977), *Chem. & Eng. News*, November 28, p. 31 (1988), European Patent 104,143, U.S. Pat. Nos. 339,049 and 410,201, JP-A-2-150848, JP-A-2-296514, etc., sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci., Polymer Ed.*, 17, 2877 (1979), European Patents 370,693, 161,811, 410,201, 339,049, 233,567, 297, 443 and 297,442, U.S. Pat. Nos. 3,902,114, 4,933,377, 4,760,013, 4,734,444 and 2,833,827, German Patent 2,904, 626, 3,604,580 and 3,604,581, JP-A-7-28237, JP-A-8-27102, etc., selenonium salts described in J. V. Crivello et al., *Macromolecules*, 10 (6), 1307 (1977), J. V. Crivello et al., *J. Polymer Sci., Polymer Ed.*, 17, 1047 (1979), etc., and arsonium salts described in C. S. Wen et al., *Teh, Proc. Conf. Rad. Curing ASIA*, p. 478, Tokyo, October (1988), etc.; organic halogen compounds described in U.S. Pat. Nos. 3,905,815, JP-B-46-4605 (the term "JP-B" as used herein means an "examined Japanese patent publication"), JP-A-48-36281, JP-A-55-32070, JP-A-60-239736, JP-A-61-

169835, JP-A-61-169837, JP-A-62-58241, JP-A-62-212401, JP-A-63-70243, JP-A-63-298339, etc.; organic metals/organic halides described in K. Meier et al., *J. Rad. Curing*, 13 (4), 26 (1986), T. P. Gill et al., *Inorg. Chem.*, 19, 3007 (1980), D. Astruc, *Acc. Res.*, 19 (12), 377 (1896), JP-A-2-161445, etc.; photo-acid generators having an O-nitrobenzyl type protective group described in S. Hayase et al., *J. Polymer Sci.*, 25, 753 (1987), E. Reichmanis et al., *J. Polymer Sci., Polymer Ed.*, 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Soc.*, 3571 (1965), P. M. Collins et al., *J. Soc.*, Perkin I, 1695 (1975), M. Rudinstein et al., *Tetrahedron Lett.*, (17), 1445 (1975), J. W. Walker et al., *J. Am. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Soc., Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290,750, 046,083, 156, 535, 271,851 and 0,388,343, U.S. Pat. Nos. 3,901,710 and 4,181,531, JP-A-60-198538, JP-A-53-133022, etc.; compounds which are photochemically decomposed to generate sulfonic acid, represented by iminosulfonate, described in M. TUNOOKA et al., *Polymer Preprints Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), European Patents 0,199,672, 84,515, 044,115, 618,564 and 0,101,122, U.S. Pat. Nos. 4,371,605 and 4,431,774, JP-A-64-18143, JP-A-2-245756, JP-A-3-140109, etc.; disulfone compounds described in JP-A-61-166544, JP-A-2-71270, etc.; and diazoketosulfone and diazosulfone compounds described in JP-A-3-103854, JP-A-3-103856 and JP-A-4-210960, etc.

In addition, compounds in which the above-described group or compound capable of generating an acid by light is introduced in the main chain or side chain may also be used and examples thereof include the compounds described in M. E. Woodhouse et al., *J. Am. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc.

Furthermore, the compounds capable of generating an acid by light described in V. N. R. Pillai, *Synthesis*, (1), 1 (1980), A. Abad et al., *Tetrahedron Lett.*, (47) 4555 (1971), D. H. R. Barton et al., *J. Soc.*, (C), 329 (1970), U.S. Pat. No. 3,779,778, European Patent 126,712, etc. may also be used.

Among these compounds capable of decomposing upon irradiation with actinic rays or radiation and thereby generating an acid, particularly effective compounds are described below. These compounds can be used in combination.

1) Oxazole derivative represented by formula (PAG1) and S-triazine derivative represented by formula (PAG2), each substituted by trihalomethyl group:

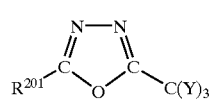
(PAG1)

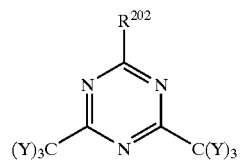
(PAG2)

wherein $R^{201}$ represents a substituted or unsubstituted aryl group or a substituted or unsubstituted alkenyl group, $R^{202}$ represents a substituted or unsubstituted aryl group, a substituted or unsubstituted alkenyl group, a substituted or unsubstituted alkyl group or —$C(Y)_3$, and Y represents chlorine atom or bromine atom.

Specific examples thereof include the following compounds, however, the present invention is by no means limited thereto.

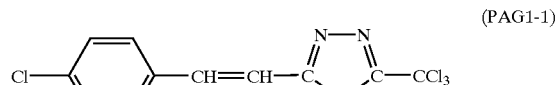
(PAG1-1)

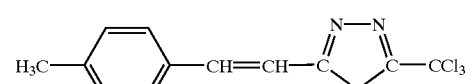
(PAG1-2)

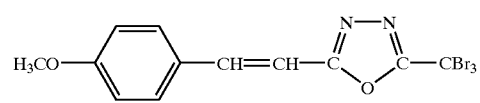
(PAG1-3)

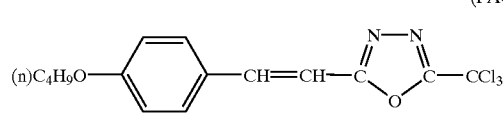
(PAG1-4)

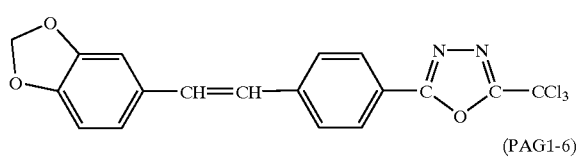
(PAG1-5)

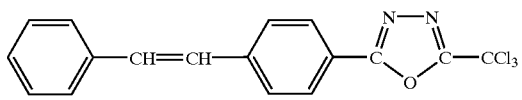
(PAG1-6)

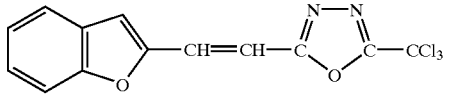
(PAG1-7)

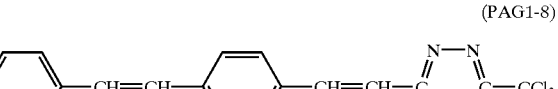
(PAG1-8)

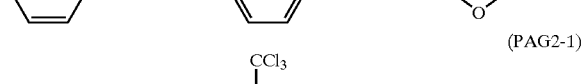
(PAG2-1)

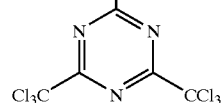

-continued
(PAG2-2)
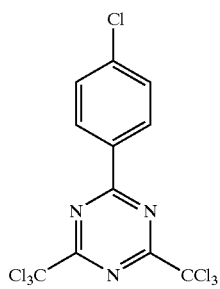
(PAG2-3)
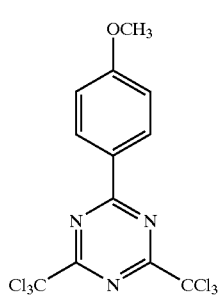
(PAG2-4)
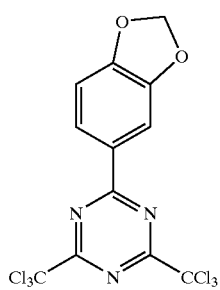
(PAG2-5)
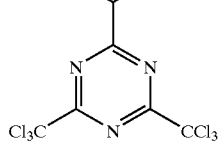
(PAG2-6)
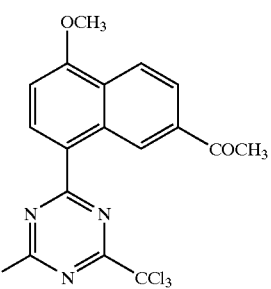
(PAG2-7)
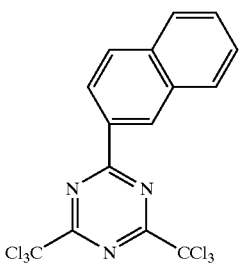
(PAG2-8)
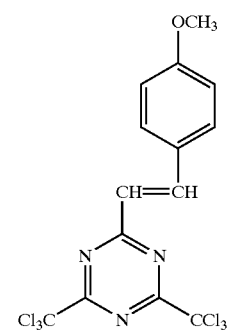
(PAG2-9)
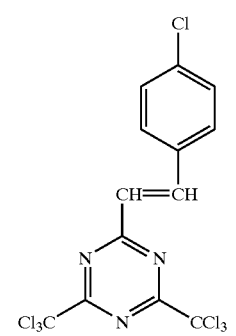
(PAG2-10)
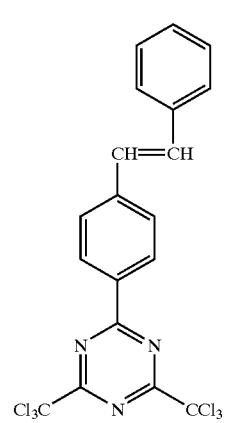
2) Iodonium salt represented by formula (PAG3):
(PAG3)
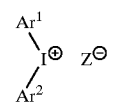

wherein $Ar^1$ and $Ar^2$ each independently represents a substituted or unsubstituted aryl group (the substituent is preferably an alkyl group, a haloalkyl group, a cycloalkyl group, an aryl group, an alkoxy group, a nitro group, a carboxyl group, an alkoxycarbonyl group, a hydroxy group, a mercapto group or a halogen atom), $Z^-$ represents a counter anion (for example, $BF_4^-$, $AsF_6^-$, $PF_6^-$, $SbF_6^-$, $SiF_6^{2-}$, $ClO_4^-$, perfluoroalkane sulfonate anions such as $CF_3SO_3^-$, pentafluorobenzene sulfonate anions, condensed polynuclear aromatic sulfonate anions such as naphthalene-1-sulfonate anion, anthraquinone sulfonate anions and sulfonic acid group-containing dyes, but the anion is not limited thereto), and $Ar^1$ and $Ar^2$ may be bonded through a single bond or a substituent.

Specific examples thereof include the following compounds, however, the present invention is by no means limited thereto.

(PAG3-1)
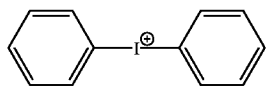 

(PAG3-2)
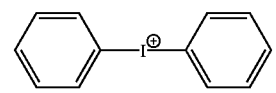 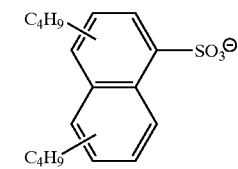

(PAG3-3)
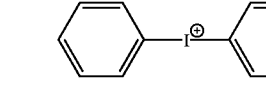 

(PAG3-4)
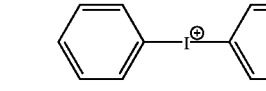 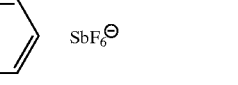

(PAG3-5)
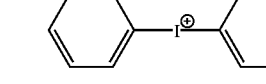 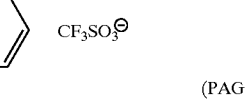

(PAG3-6)
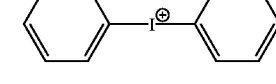 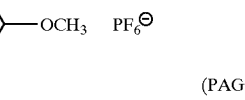

(PAG3-7)
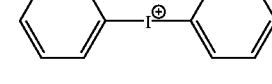 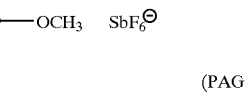

(PAG3-8)
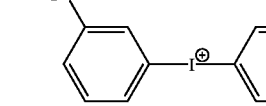 

(PAG3-9)
 

-continued (PAG3-10)
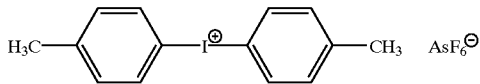

(PAG3-11)
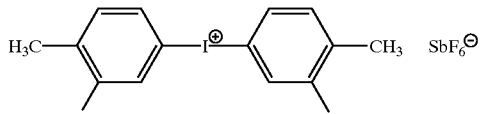

(PAG3-12)
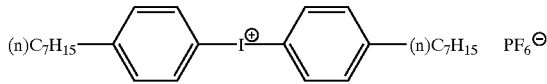

(PAG3-13)
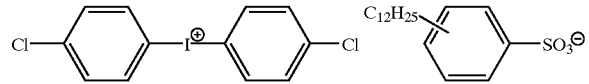

(PAG3-14)
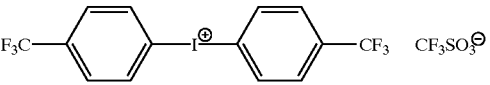

(PAG3-15)
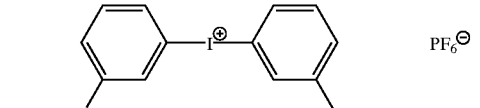

(PAG3-16)
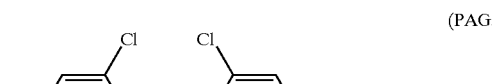

(PAG3-17)
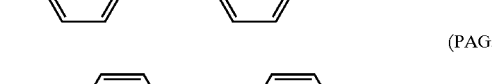

(PAG3-18)
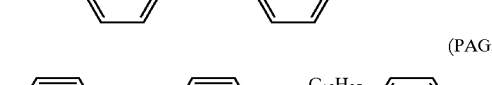

(PAG3-19)
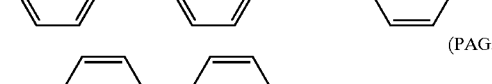

(PAG3-20)
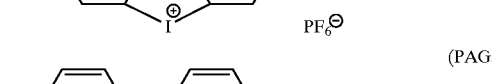

(PAG3-21)
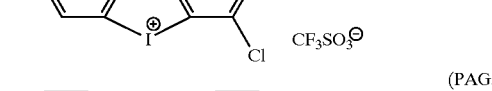

-continued

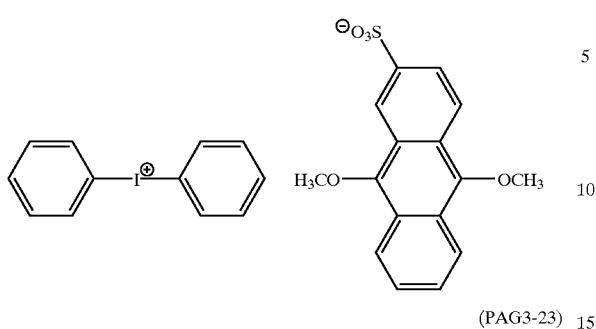

(PAG3-22)
(PAG3-23)
(PAG3-24)

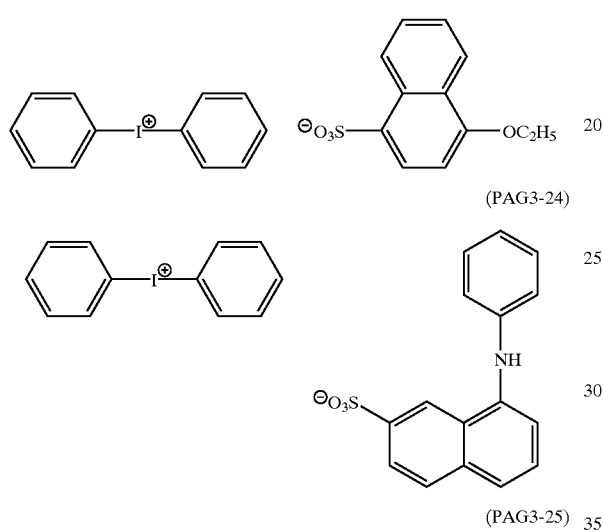

(PAG3-25)
(PAG3-26)
(PAG3-27)

-continued (PAG3-28)

(PAG3-29)

The above-described iodonium salt represented by formula (PAG3) is known and can be synthesized by the method described, for example, in J. W. Knapczyk et al., *J. Am. Soc.*, 91, 145 (1969), A. L. Maycok et al., *J. Org. Chem.*, 35, 2532 (1970), E. Goethas et al., *Bull. Soc. Belg.*, 73, 546 (1964), H. M. Leicester, *J. Am. Soc.*, 51, 3587 (1929), J. V. Crivello et al., *J. Polym. Ed.*, 18, 2677 (1980), U.S. Pat. Nos. 2,807,648 and 4,247,473, JP-A-53-101331, etc.

3) Sulfonium salt represented by formula (PAG4):

$$\text{Rs1}-\overset{\overset{\text{Rs2}}{|}}{\underset{Z^-}{S^+}}-\text{Rs3} \qquad \text{(PAG4)}$$

wherein Rs1 to Rs3 each independently represents an alkyl group which may have a substituent or an aryl group which may have a substituent, each pair out of Rs1 to Rs3 may be combined through a single bond or a substituent, and $Z^-$ represents a counter anion.

The sulfonium salt compound represented by (PAG4) is a sulfonium salt compound capable of generating an acid upon irradiation with actinic rays or radiation. Examples of the acid generated here include a sulfonic acid, a carboxylic acid, disulfonylimide and N-sulfonylimide.

In the present invention, by using the sulfonium salt represented by formula (PAG4) together with the component (B), the resolution of contact holes can be improved.

In formula (PAG4), Rs1 to Rs3 each independently represents an alkyl group which may have a substituent or an aryl group which may have a substituent.

The substituent of the aryl group is preferably an alkoxy group having from 1 to 8 carbon atoms, an alkyl group having from 1 to 8 carbon atoms, a nitro group, a carboxyl group, a hydroxy group or a halogen atom. The substituent of the alkyl group is preferably an alkoxy group having from 1 to 8 carbon atoms, a carboxyl group or an alkoxycarbonyl group.

Rs1 to Rs3 each is preferably an aryl group having from 6 to 14 carbon atoms, an alkyl group having from 1 to 8 carbon atoms, or a substituted derivative thereof, more preferably an aryl group. Examples of the aryl group include a phenyl group, a naphthyl group, an anthracene group and a phenanthracene group, and examples of the alkyl group include a methyl group, an ethyl group, a propyl group, an isopropyl group, a n-butyl group, an isobutyl group, a sec-butyl group, a pentyl group, a hexyl group, a heptyl group and an octyl group. Preferred examples of the substituent of these aryl group and alkyl group include an alkyl group, a haloalkyl group, a cycloalkyl group, an aryl group, an alkoxy group, a nitro group, a carboxyl group, an alkoxycarbonyl group, an acyl group, an acyloxy group, a hydroxy group, a mercapto group and a halogen atom.

Z⁻ represents a counter anion and examples thereof include $BF_4^-$, $AsF_6^-$, $PF_6^-$, $SbF_6^-$, $SiF_6^{2-}$, $ClO_4^-$, perfluoroalkane sulfonate anions such as $CF_3SO_3^-$, pentafluorobenzene sulfonate anions, condensed polynuclear aromatic sulfonate anions having an aliphatic hydrocarbon group or an aromatic hydrocarbon group, such as naphthalene-1-sulfonate anion, anthraquinone sulfonate anions, sulfonic acid group-containing dyes, and alkylsulfonic acids such as methanesulfonic acid, however, the present invention is by no means limited thereto.

Each pair out of Rs1 to Rs3 may be combined through a single bond or a substituent.

Specific examples of the compound (photo-acid generator) include the following compounds, however, the present invention is by no means limited thereto.

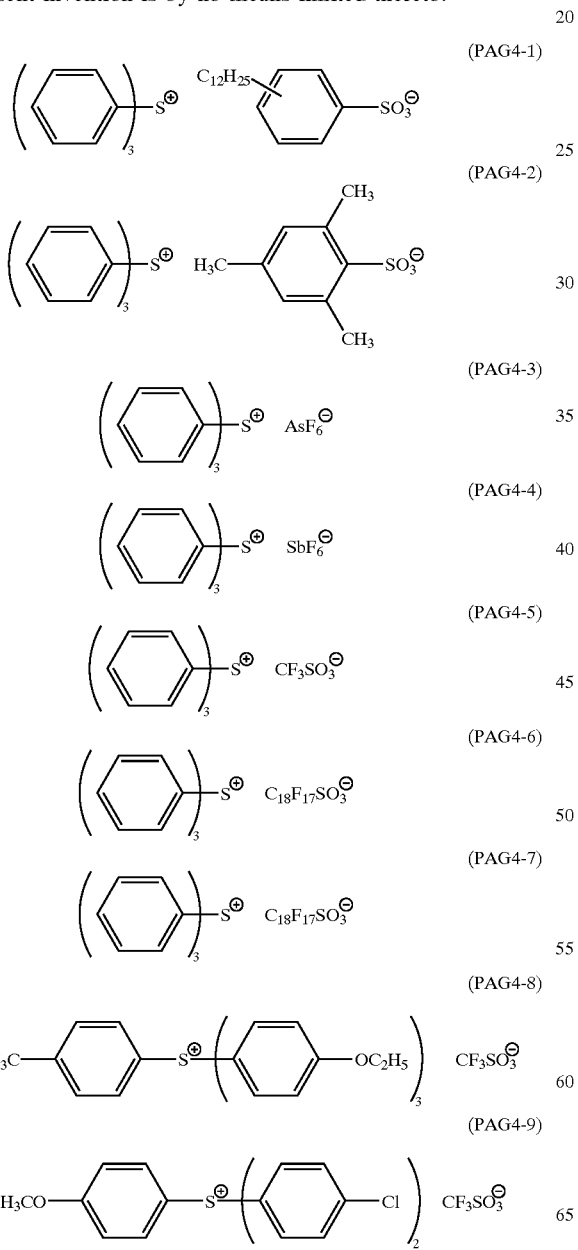

(PAG4-1)
(PAG4-2)
(PAG4-3)
(PAG4-4)
(PAG4-5)
(PAG4-6)
(PAG4-7)
(PAG4-8)
(PAG4-9)

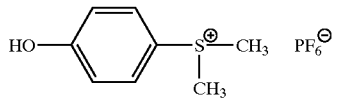

(PAG4-10)

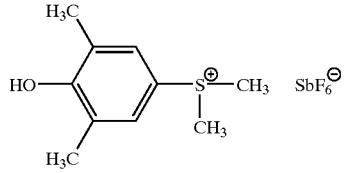

(PAG4-11)

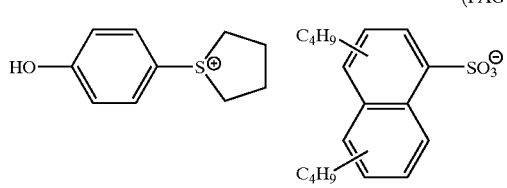

(PAG4-12)

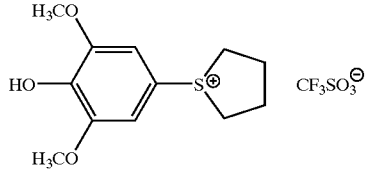

(PAG4-13)

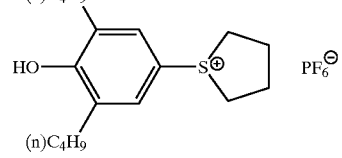

(PAG4-14)

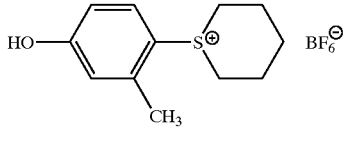

(PAG4-15)

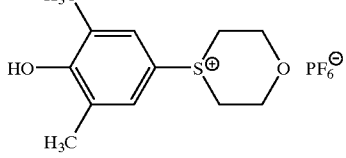

(PAG4-16)

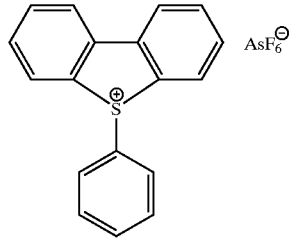

(PAG4-17)

-continued
(PAG4-18)
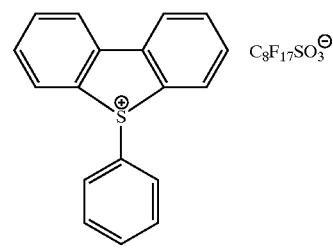
(PAG4-19)
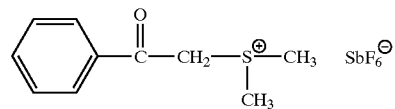
(PAG4-20)
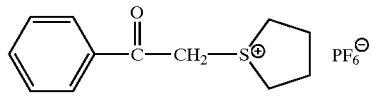
(PAG4-21)
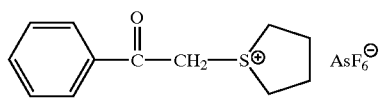
(PAG4-22)
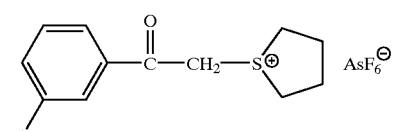
(PAG4-23)
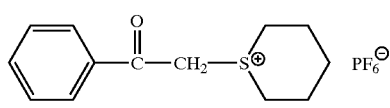
(PAG4-24)
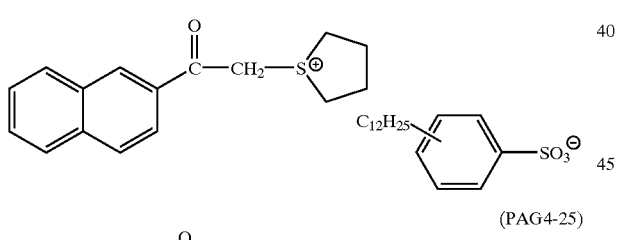
(PAG4-25)
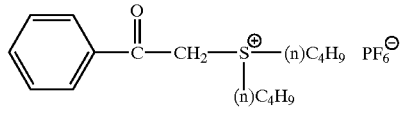
(PAG4-26)
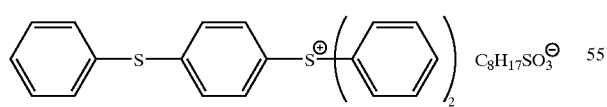
(PAG4-27)
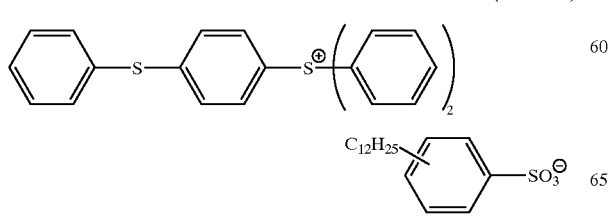
-continued
(PAG4-28)
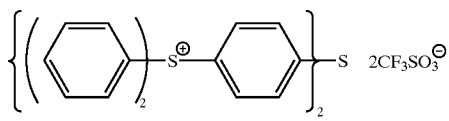
(PAG4-29)
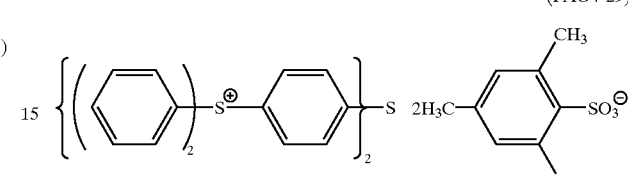
(PAG4-30)
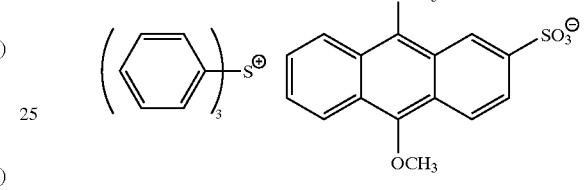
(PAG4-31)
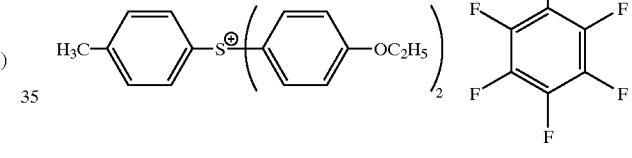
(PAG4-32)
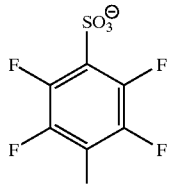
(PAG4-33)
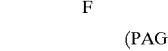
(PAG4-34)
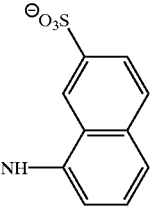

-continued (PAG4-35)
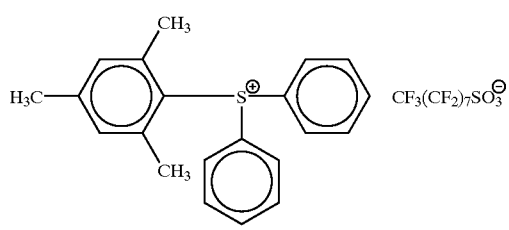

(PAG4-36)
(PAG4-37)
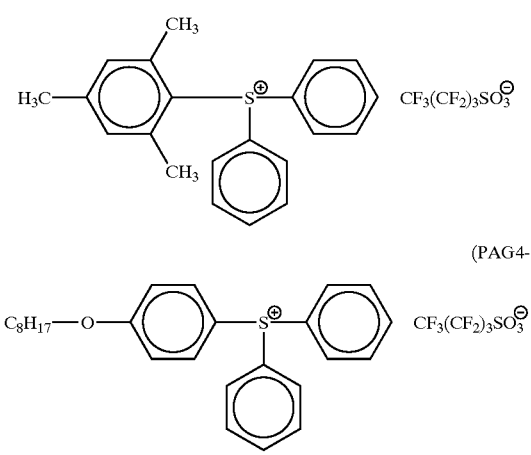

The sulfonium salt represented by formula (PAG4) is known and can be synthesized by the method described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polym. Chem. Ed.*, 18, 2677 (1980), U.S. Pat. Nos. 2,807,648 and 4,247,473, JP-A-53-101331, etc.

4) Disulfonic derivative represented by formula (PAG5) and iminosulfonate derivative represented by formula (PAG6):

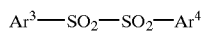
(PAG5)

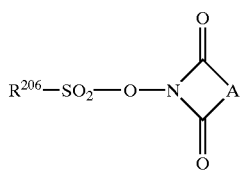
(PAG6)

wherein $Ar^3$ and $Ar^4$ each independently represents a substituted or unsubstituted aryl group, $R^{206}$ represents a substituted or unsubstituted alkyl group or a substituted or unsubstituted aryl group, and A represents a substituted or unsubstituted alkylene, alkenylene or arylene group.

Specific examples thereof include the following compounds, however, the present invention is by no means limited thereto.

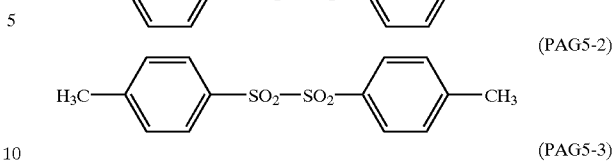
(PAG5-1)

(PAG5-2)

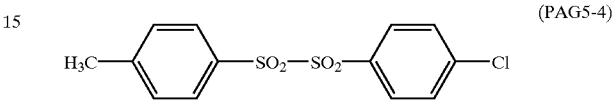
(PAG5-3)

(PAG5-4)

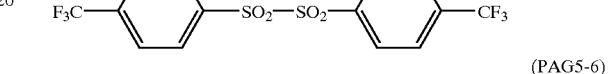
(PAG5-5)

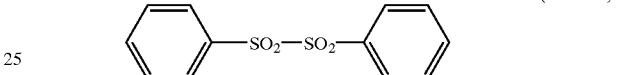
(PAG5-6)

(PAG5-7)

(PAG5-8)

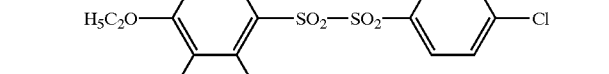
(PAG5-9)

(PAG5-10)

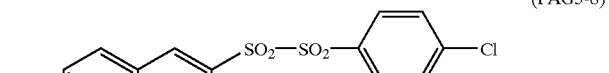
(PAG5-11)

(PAG5-12)

(PAG5-13)
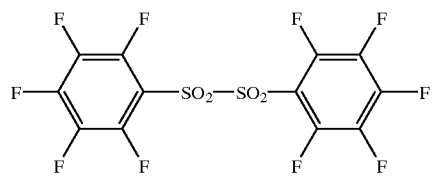
(PAG5-14)
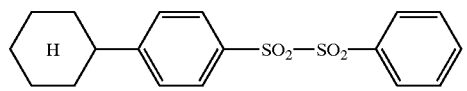
(PAG5-15)
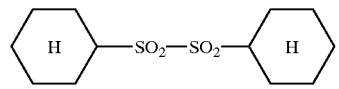
(PAG6-1)
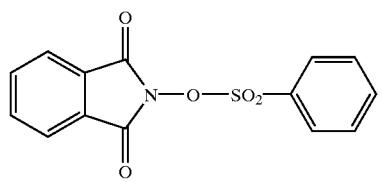
(PAG6-2)
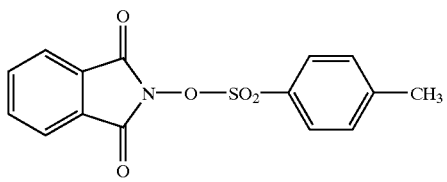
(PAG6-3)
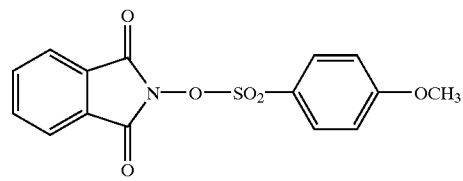
(PAG6-4)
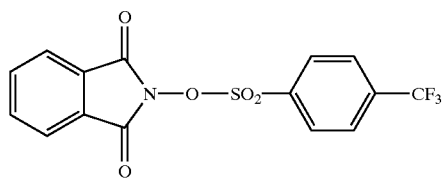
(PAG6-5)
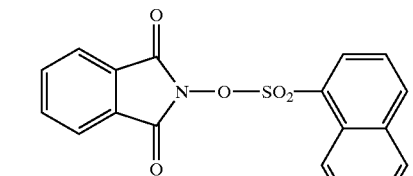
(PAG6-6)
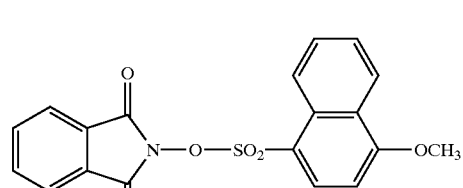
(PAG6-7)
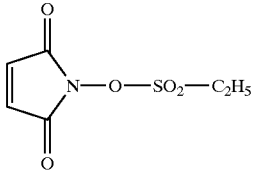
(PAG6-8)
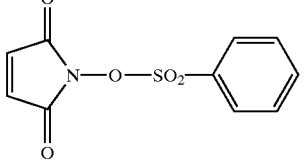
(PAG6-9)
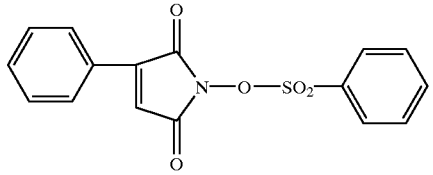
(PAG6-10)
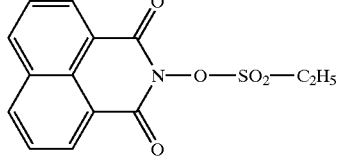
(PAG6-11)
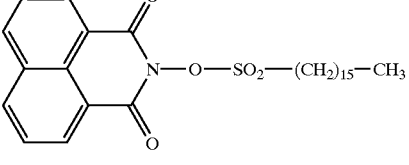
(PAG6-12)
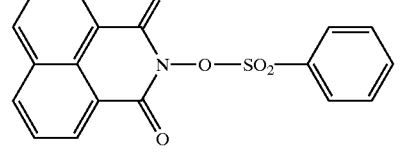
(PAG6-13)
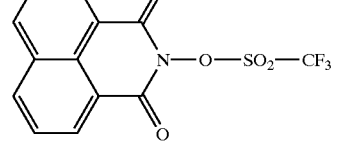
(PAG6-14)
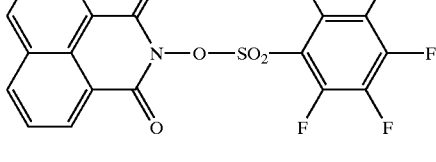
(PAG6-15)
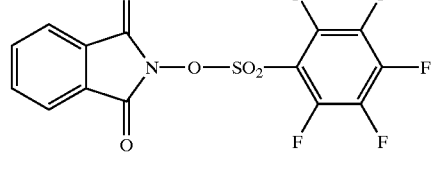

(PAG6-16)

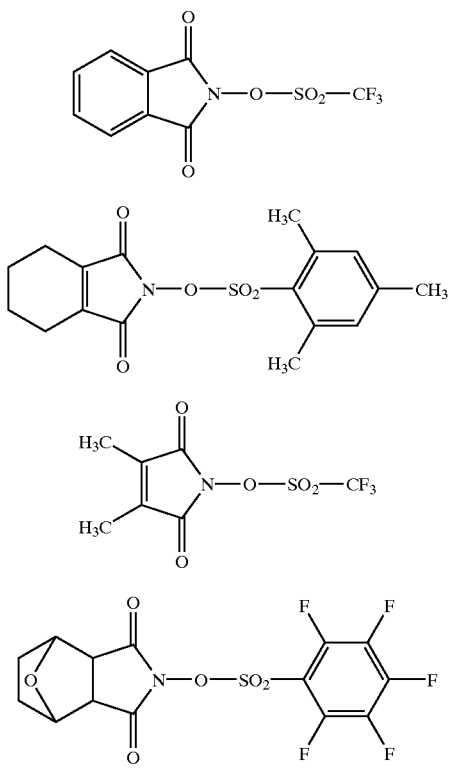

(PAG6-17)

(PAG6-18)

(PAG6-19)

In the present invention, the sulfonic acid generating compound is preferably the compound of the formula described in 4) above.

In the present invention, the amount of the sulfonic acid generating compound added is preferably from 0.01 to 10 wt %, more preferably from 0.05 to 5 wt %, based on the solid contents of the composition.

5) Diazodisulfone derivative

The diazodisulfone derivative includes those represented by formula (PAG7):

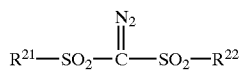

(PAG7)

wherein $R^{21}$ and $R^{22}$ each independently represents an alkyl group which may have a substituent, a cycloalkyl group or an aryl group which may have a substituent.

The alkyl group is preferably a linear or branched alkyl group having from 1 to 20 carbon atoms, more preferably a linear or branched alkyl group having from 1 to 12 carbon atoms. The cycloalkyl group is preferably a cyclopentyl group or a cyclohexyl group. The aryl group is preferably an aryl group having from 6 to 10 carbon atoms, which may have a substituent.

Examples of the substituent include an alkyl group such as methyl group, ethyl group, n-propyl group, i-propyl group, n-butyl group, i-butyl group, sec-butyl group, tert-butyl group, n-pentyl group, n-hexyl group, n-octyl group, 2-ethylhexyl group, nonyl group, decyl group and dodecyl group, an alkoxy group such as methoxy group, ethoxy group, propoxy group and butoxy group, a halogen atom, a nitro group and an acetyl group.

Specific examples of the diazodisulfone derivative compound include the following compounds:

bis(methylsulfonyl)diazomethane, bis(ethylsulfonyl)-diazomethane, bis(propylsulfonyl)diazomethane, bis(1-methylpropylsulfonyl)diazomethane, bis(butylsulfonyl) diazomethane, bis(1-methylbutylsulfonyl)diazomethane, bis-(heptylsulfonyl)diazomethane, bis(octylsulfonyl) diazomethane, bis(nonylsulfonyl)diazomethane, bis (decylsulfonyl)diazomethane, bis(dodecylsulfonyl) diazomethane, bis(trifluoromethylsulfonyl)diazomethane, bis(cyclohexylsulfonyl)diazomethane, bis(benzylsulfonyl) diazomethane, bis(2-chlorobenzylsulfonyl)diazomethane, bis(4-chlorobenzylsulfonyl)diazomethane, bis (phenylsulfonyl)diazomethane, bis(4-methoxyphenylsulfonyl)diazomethane, bis(2-methylphenylsulfonyl)diazomethane, bis(3-methylphenylsulfonyl)diazomethane, bis(4-methylphenylsulfonyl)diazomethane, bis(2,4-dimethylphenylsulfonyl)diazomethane, bis(2,5-dimethylphenylsulfonyl)diazomethane, bis(3,4-dimethylphenylsulfonyl)diazomethane, bis(2,4,6-trimethylphenylsulfonyl)diazomethane, bis(4-fluorophenylsulfonyl)diazomethane, bis(2,4-difluorophenylsulfonyl)diazomethane, bis(2,4,6-trifluorophenylsulfonyl)diazomethane and bis (4nitrophenylsulfonyl)diazomethane.

6) Diazoketosulfone derivative compound

The diazoketosulfone derivative compound include those represented by formula (PAG8):

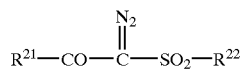

(PAG7)

wherein $R^{21}$ and $R^{22}$ have the same meanings as $R^{21}$ and $R^{22}$ of (PAG7), respectively.

Specific examples of the diazoketosulfone derivative compounds include the following compounds:

methylsulfonyl-benzoyl-diazomethane, ethylsulfonylbenzoyl-diazomethane, methylsulfonyl-4-bromobenzoyl-diazomethane, ethylsulfonyl-4-bromobenzoyl-diazomethane, phenylsulfonyl-benzoyl-diazomethane, phenylsulfonyl-2-methylphenyl-diazomethane, phenylsulfonyl-3-methylphenyl-diazomethane, phenylsulfonyl-4-methylphenyl-diazomethane, phenylsulfonyl-3-methoxyphenyl-diazomethane, phenylsulfonyl-4-methoxylphenyl-diazomethane, phenylsulfonyl-3-chlorobenzoyl-diazomethane, phenylsulfonyl-4-chlorophenyl-diazomethane, tolylsulfonyl-3-chlorobenzoyl-diazomethane, tolylsulfonyl-4-chlorophenyl-diazomethane, phenylsulfonyl-4-fluorophenyl-diazomethane and tolylsulfonyl-4-fluorophenyl-diazometheane.

In the compound capable of generating an acid upon irradiation with actinic rays or radiation (component (A)) for use in the present invention, the acid generated upon irradiation with actinic rays or radiation preferably has one structure selected from (A1) to (A3) so as to ensure high sensitivity and provide a rectangular pattern shape.

6) Compounds represented by formulae (I') to (III')

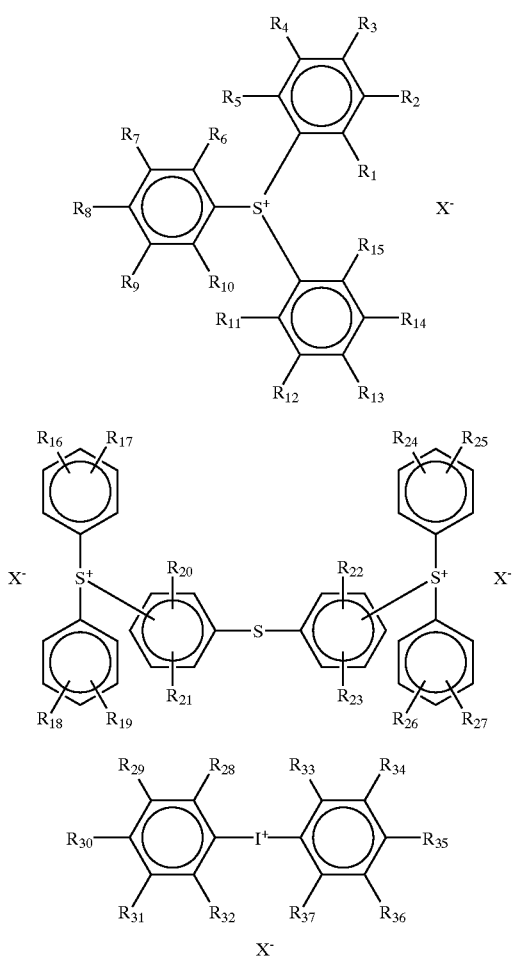

wherein $R_1$ to $R_{37}$, which may be the same or different, each represents hydrogen atom, a linear, branched or cyclic alkyl group, a linear, branched or cyclic alkoxy group, a hydroxyl group, a halogen atom or a —S—$R_{38}$ group; $R_{38}$ represents a linear, branched or cyclic alkyl group or an aryl group; two or more of $R_1$ to $R_{15}$, two or more of $R_{16}$ to $R_{27}$, or two or more of $R_{28}$ to $R_{37}$ may be combined to form a ring containing one or more selected from a single bond, carbon, oxygen, sulfur and nitrogen; and X⁻ represents $R^FSO_3^-$ (wherein $R^F$ represents a fluorine-substituted linear, branched or cyclic alkyl group having two or more carbon atoms).

In the present invention, at least one of the compounds represented by formulae (I') to (III') is preferably used as the photo-acid generator.

The linear or branched alkyl group represented by $R_1$ to $R_{38}$ in formulae (I') to (III') includes a linear or branched alkyl group having from 1 to 4 carbon atoms, which may have a substituent, and examples thereof include a methyl group, an ethyl group, a propyl group, an n-butyl group, a sec-butyl group and a tert-butyl group. The cyclic alkyl group include a cyclic alkyl group having from 3 to 8 carbon atoms, which may have a substituent, and examples thereof include a cyclopropyl group, a cyclopentyl group and a cyclohexyl group.

The linear or branched alkoxy group represented by $R_1$ to $R_{37}$ include a linear or branched alkoxy group having from 1 to 4 carbon atoms, such as methoxy group, ethoxy group, hydroxyethoxy group, propoxy group, n-butoxy group, isobutoxy group, sec-butoxy group and tert-butoxy group.

The cyclic alkoxy group include a cyclopentyloxy group such as cyclopentyloxy group and cyclohexyloxy group.

The halogen atom represented by $R_1$ to $R_{37}$ includes fluorine atom, chlorine atom, bromine atom and iodine atom.

The aryl group represented by $R_{38}$ include an aryl group having from 6 to 14 carbon atoms, which may have a substituent, and examples thereof include a phenyl group, a tolyl group, a methoxyphenyl group and a naphthyl group.

The substituent is preferably an alkoxy group having from 1 to 4 carbon atoms, a halogen atom (e.g., fluorine, chlorine, iodine), an aryl group having from 6 to 10 carbon atoms, an alkenyl group having from 2 to 6 carbon atoms, a cyano group, a hydroxy group, a carboxy group, an alkoxycarbonyl group and a nitro group.

Examples of the ring containing one or more selected from a single bond, carbon, oxygen, sulfur and nitrogen formed by combining two or more of $R_1$ to $R_{15}$, two or more of $R_{16}$ to $R_{27}$, or two or more of $R_{28}$ to $R_{37}$ include a furan ring, a dihydrofuran ring, a pyran ring, a trihydropyran ring, a thiophene ring and a pyrrole ring.

In formulae (I') to (III'), X⁻ is an anion represented by $R^FSO_3^-$. $R^F$ is a fluorine-substituted linear, branched or cyclic alkyl group having 2 or more carbon atoms, preferably from 2 to 10 carbon atoms, still more preferably from 2 to 8 carbon atoms, yet still more preferably from 2 to 5 carbon atoms.

$R^F$ is preferably a fluorine-substituted linear alkyl group represented by $CF_3(CF_2)_y$, wherein y is an integer of 1 to 15, more preferably from 3 to 13, still more preferably from 7 to 11. By using this fluorine-substituted linear alkyl group $[CF_3(CF_2)_y]$, good balance is attained between sensitivity and resolution and also the change of capability can be reduced even in aging from the exposure to the post-heating.

$R^F$ is specifically $CF_3CF_2$—, $CF_3(CF_2)_2$—, $CF_3(CF_2)_3$—, $CF_3(CF_2)_4$—, $CF_3(CF_2)_5$—, $CF_3(CF_2)_7$—, $CF_3(CF_2)_9$—, $CF_3(CF_2)_{11}$—, $CF_3(CF_2)_{13}$— or $CF_3(CF_2)_{15}$—, preferably $CF_3(CF_2)_3$—, $CF_3(CF_2)_4$—, $CF_3(CF_2)_5$—, $CF_3(CF_2)_7$—, $CF_3(CF_2)_9$—, $CF_3(CF_2)_{11}$— or $CF_3(CF_2)_{13}$—, more preferably $CF_3(CF_2)_7$—, $CF_3(CF_2)_9$— or $CF_3(CF_2)_{11}$—, still more preferably $CF_3(CF_2)_7$—.

The photo-acid generator is particularly preferably a compound presented by formula (I') wherein X⁻ is $CF_3(CF_2)_3 SO_3^-$.

When the compound represented by formula (I'), (II') or (III') where the anion moiety is constructed by a sulfonate anion having a fluorine-substituted alkyl group is used as the photo-acid generator and combined with the resin component (A) having a specific structure, the positive working resist composition of the present invention can have sufficiently high sensitivity and resolution for the exposure with a far ultraviolet ray, particularly ArF eximer laser ray (wavelength: 193 nm) and also can maintain excellent pattern profile and resolution in aging after the exposure.

Specific examples of the photo-acid generators represented by formulae (I') to (III') include the following compounds (I-1) to (I-32), (II-1) to (II-11) and (III-1) to (III-22).

(I-1)

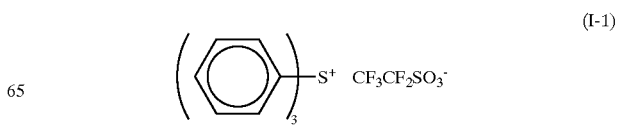

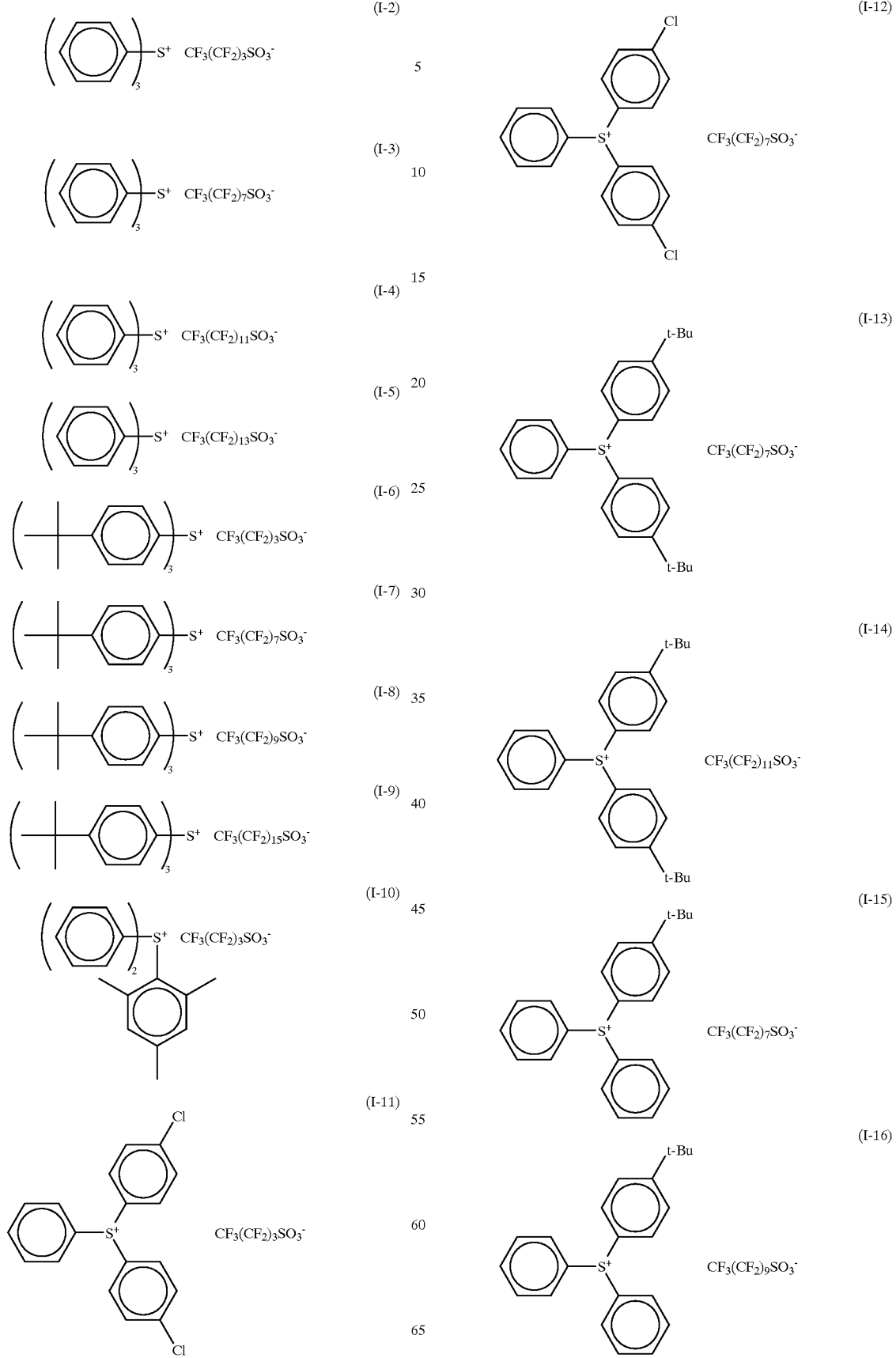

(I-17)
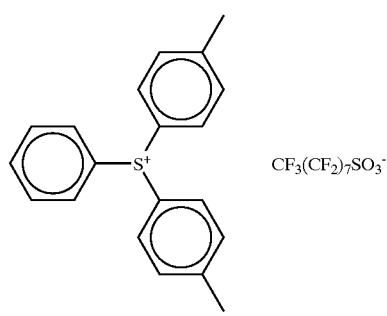
$CF_3(CF_2)_7SO_3^-$
(I-18)
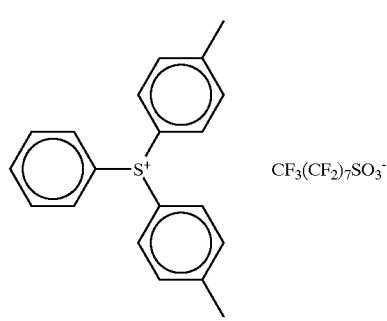
$CF_3(CF_2)_7SO_3^-$
(I-19)
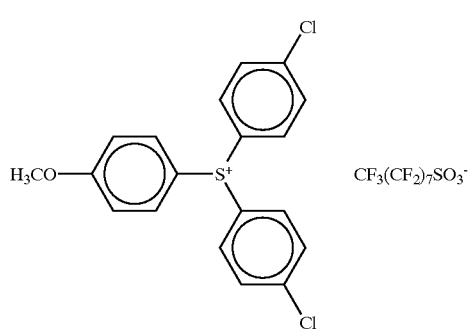
$CF_3(CF_2)_7SO_3^-$
(I-20)
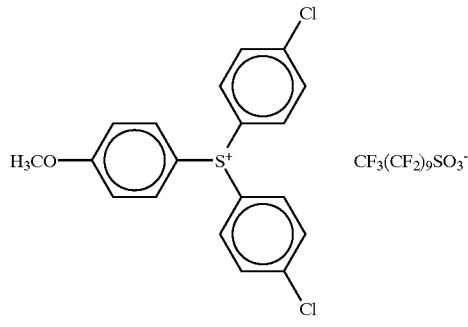
$CF_3(CF_2)_9SO_3^-$
(I-21)
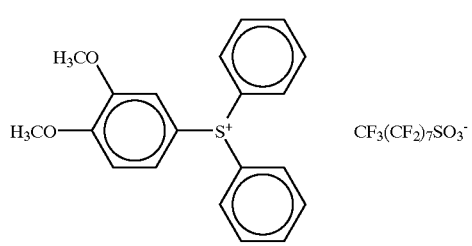
$CF_3(CF_2)_7SO_3^-$
(I-22)
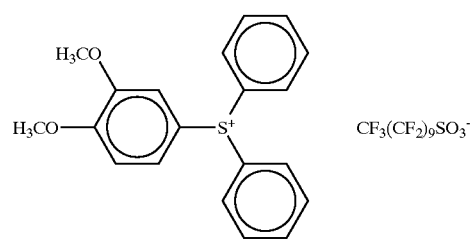
$CF_3(CF_2)_9SO_3^-$
(I-23)
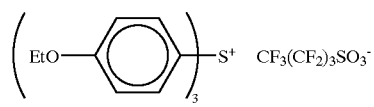
$CF_3(CF_2)_3SO_3^-$
(I-24)
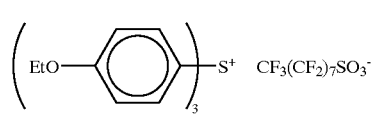
$CF_3(CF_2)_7SO_3^-$
(I-25)
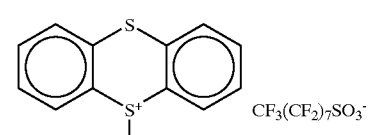
$CF_3(CF_2)_7SO_3^-$
(I-26)
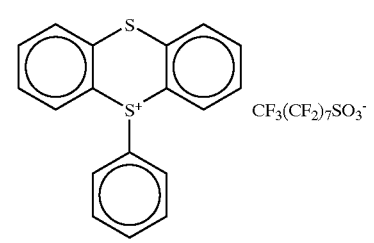
$CF_3(CF_2)_9SO_3^-$
(I-27)
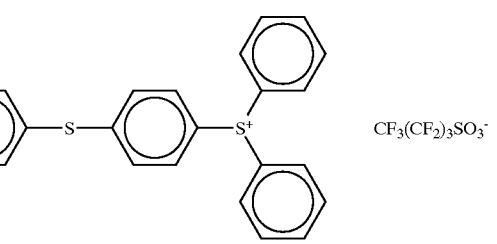
$CF_3(CF_2)_3SO_3^-$
(I-28)
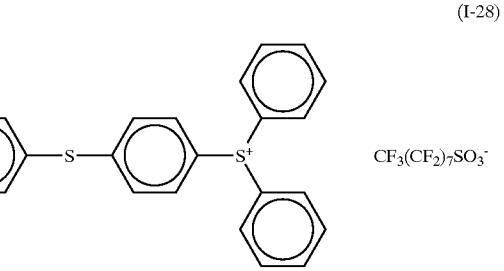
$CF_3(CF_2)_7SO_3^-$

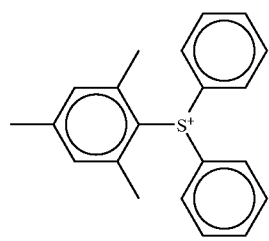 (I-29)
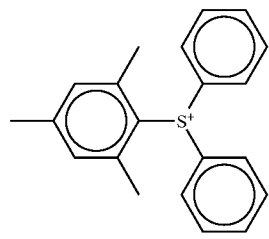 (I-30)
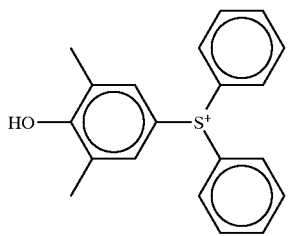 (I-31)
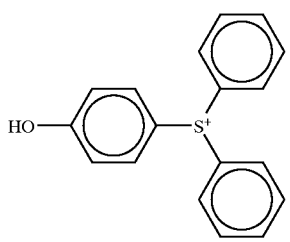 (I-32)
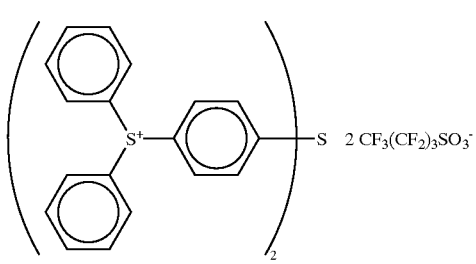 (II-1)
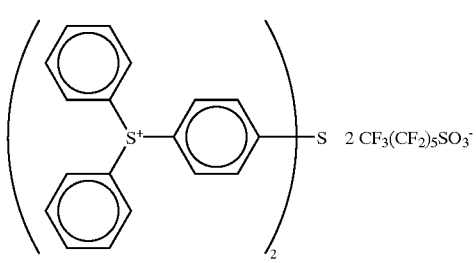 (II-2)
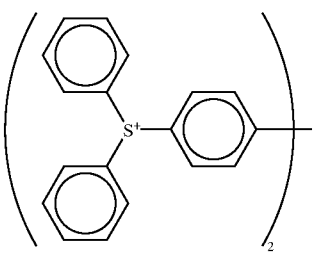 (II-3)
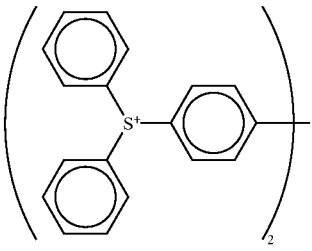 (II-4)
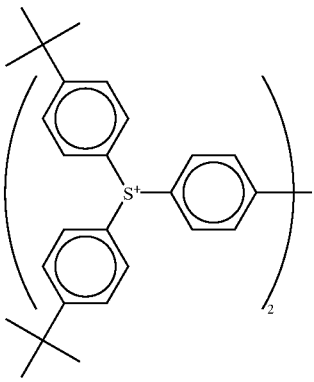 (II-5)
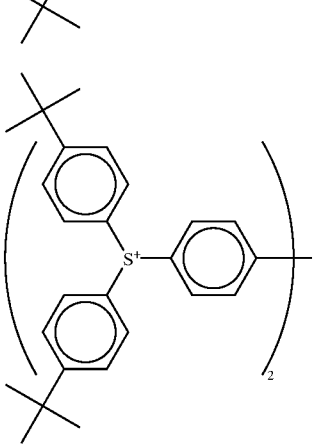 (II-6)
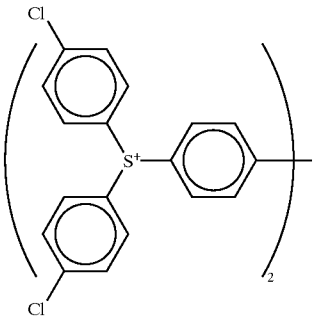 (II-7)

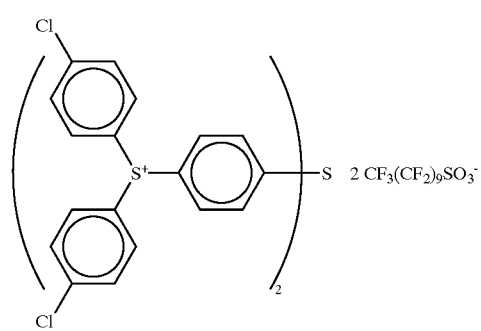
(II-8)
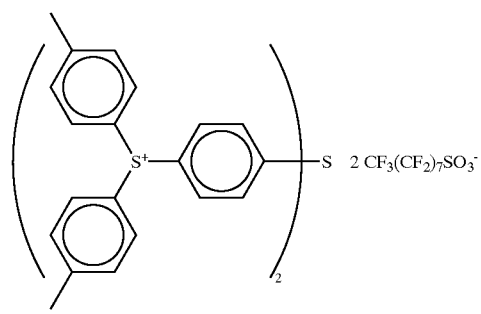
(II-9)
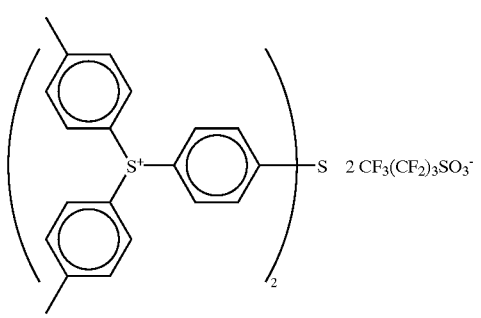
(II-10)
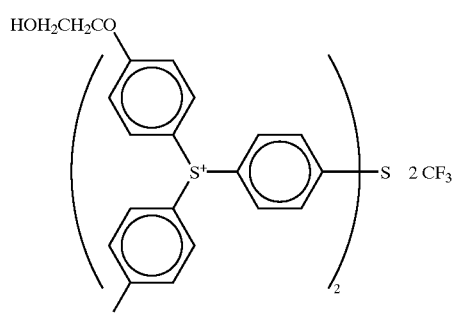
(II-11)
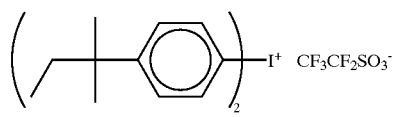
(III-1)
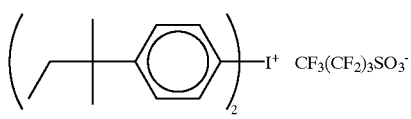
(III-2)
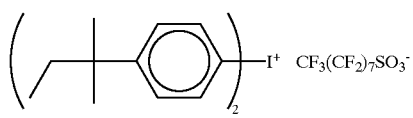
(III-3)
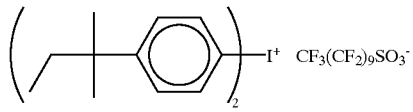
(III-4)
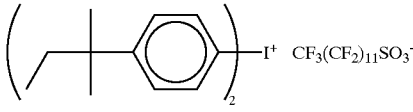
(III-5)
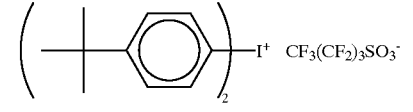
(III-6)
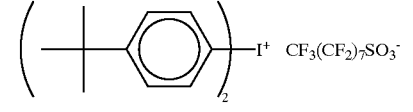
(III-7)
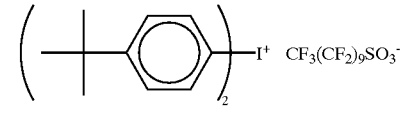
(III-8)
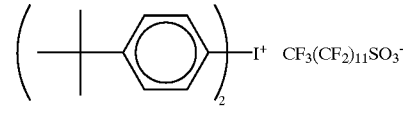
(III-9)
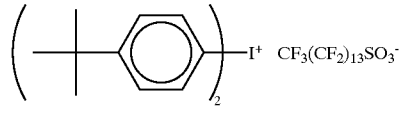
(III-10)
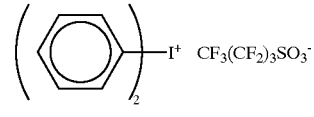
(III-11)
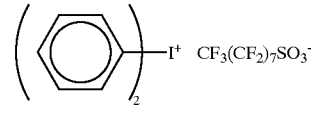
(III-12)
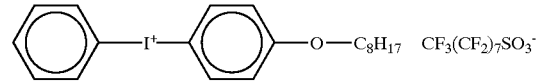
(III-13)
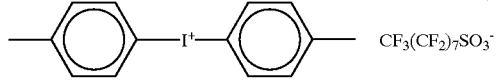
(III-14)
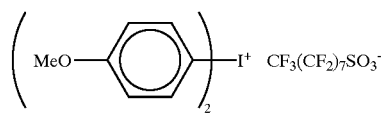
(III-15)

-continued

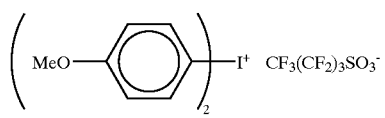
(III-16)

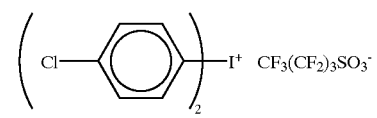
(III-17)

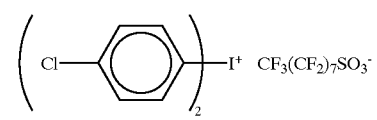
(III-18)

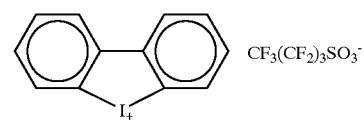
(III-19)

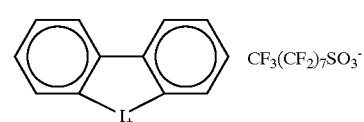
(III-20)

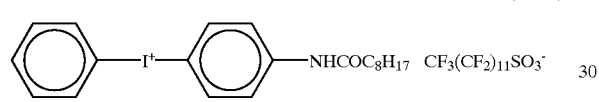
(III-21)

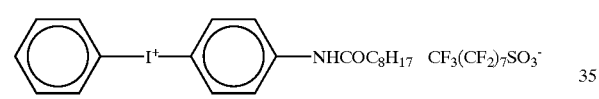
(III-22)

The added amount of the compound capable of decomposing and thereby generating an acid upon irradiation with actinic rays or radiation is usually from 0.001 to 40 wt %, preferably from 0.001 to 20 wt %, more preferably from 0.01 to 20 wt %, still more preferably from 0.01 to 15 wt %, yet more preferably from 0.1 to 15 wt %, still more preferably from 0.1 to 10 wt %, still more preferably from 0.5 to 10 wt %, and most preferably from 0.5 to 5 wt %, based on the total weight of the resist composition (excluding the coating solvent). If the added amount of the compound capable of decomposing and thereby generating an acid under irradiation with actinic rays or radiation is less than 0.001 wt %, the sensitivity decreases, whereas if the added amount exceeds 40 wt %, the light absorption by the resist excessively increases and the profile changes for the worse or the process (particularly bake) margin is disadvantageously reduced. The amount of the photo-acid generator which can be used in combination is 300 wt % or less, preferably 200 wt % or less, more preferably 100 wt % or less, based on the added amount of the photo-acid generator of the present invention.

The acid-decomposable polymer (sometimes also called an acid-decomposable resin) as the component (B) is described below.

In formula (I), $M^1$ represents an atomic group for forming an alicyclic structure which contains two bonded carbon atoms (C—C) and which may have a substituent, n represents 1 or 2, L represents a single bond or a (n+1)-valent linking group with one end being connected to the carbon atom participating in the formation of a ring, R', R", and R'" each independently represents an alkyl, phenyl, trialkylsilyl or trialkylsilyloxy group having a linear or branched chain.

The atomic group for forming an alicyclic structure, represented by $M^1$ is an atomic group for forming in the resin a repeating unit of an alicyclic hydrocarbon which may have a substituent, and the atomic group is preferably an atomic group for forming a 5-, 6-, 7- or 8-membered monocyclic alicyclic structure or a 5-, 6-, 7- or 8membered cross-linked alicyclic structure in which a repeating unit of cross-linked alicyclic hydrocarbons is formed.

Examples of the skeleton for the cross-linked alicyclic hydrocarbons include those having the following structures.

(1)

(2)

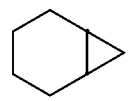
(3)

(4)

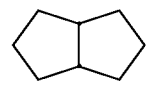
(5)

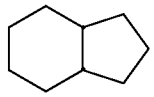
(6)

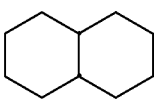
(7)

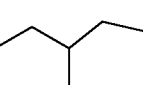
(8)

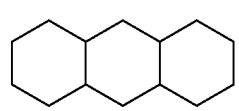
(9)

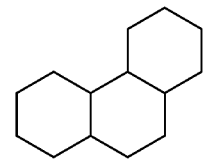
(10)

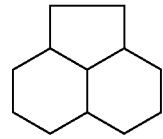
(11)

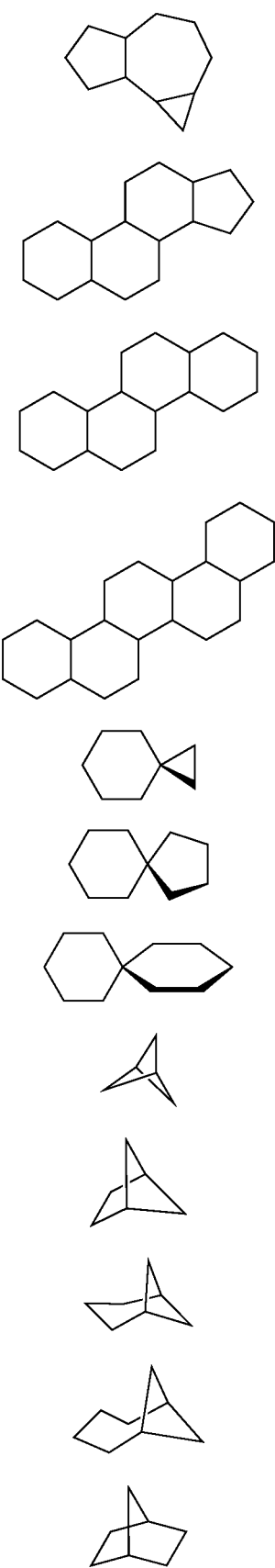
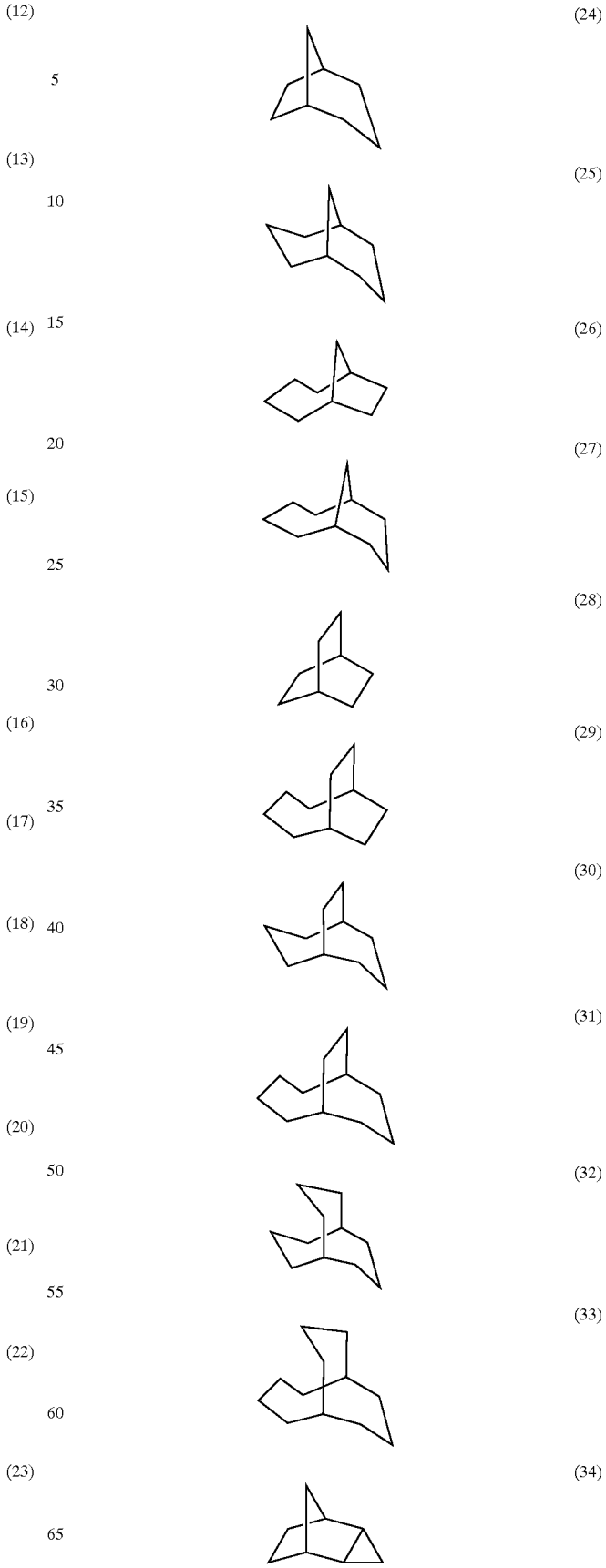

(35) 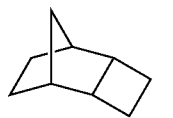

(36) 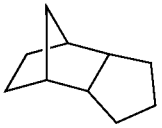

(37) 

(38) 

(39) 

(40) 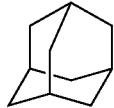

(41) 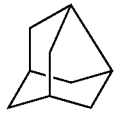

(42) 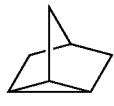

(43) 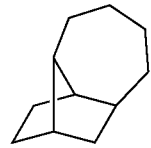

(44) 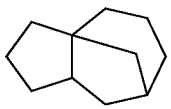

(45) 

(46) 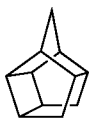

(47) 

The skeleton of the alicyclic hydrocarbon may have a substituent. Examples of the substituent include a halogen atom, a cyano group, —COOH, —COOR (wherein R represents an alkyl group, a cyclic hydrocarbon group or a group capable of decomposing under the action of an acid), —CO—X—A—R (wherein X, A and R are the same as $X^1$, $A^1$ and $R^1$ in formula (IIb), respectively), an alkyl group which may have a substituent, or a cyclic hydrocarbon group which may have a substituent.

The divalent linking group represented by L is a group selected from the group consisting of an alkylene group, a substituted alkylene group, an ether group, a thioether group, a carbonyl group, an ester group, an amide group, a sulfonamide group, a urethane group and a urea group, or a combination of two or more thereof.

The alkyl group represented by R', R" and R''' is preferably a linear or branched alkyl group having from 1 to 10 carbon atoms, more preferably a linear or branched alkyl group having from 1 to 6 carbon atoms, still more preferably a methyl group, an ethyl group, a n-propyl group, an i-propyl group, a n-butyl group, an i-butyl group, a sec-butyl group or a tert-butyl group.

The alkyl group in the trialkylsilyl group is a linear or branched alkyl group having from 1 to 6 carbon atoms, preferably a methyl group, an ethyl group, a n-propyl group, an i-propyl group, a n-butyl group, an i-butyl group, a sec-butyl group or a tert-butyl group, and most preferably a methyl group.

The alkyl group in the trialkylsilyloxy group is a linear or branched alkyl group having from 1 to 6 carbon atoms, preferably a methyl group, an ethyl group, a n-propyl group, an i-propyl group, a n-butyl group, an i-butyl group, a sec-butyl group or a tert-butyl group, and most preferably a methyl group.

Specific examples of the repeating unit represented by formula (I) include the followings, however, the present invention is by no means limited to these specific examples.

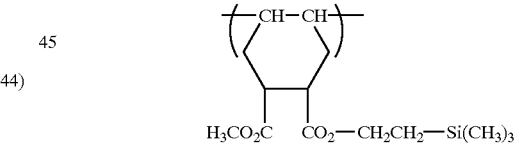

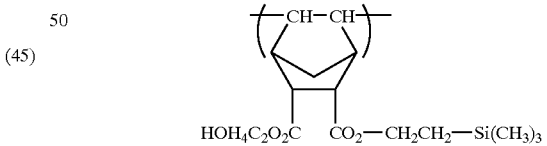

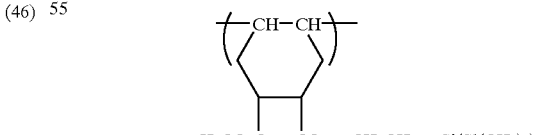

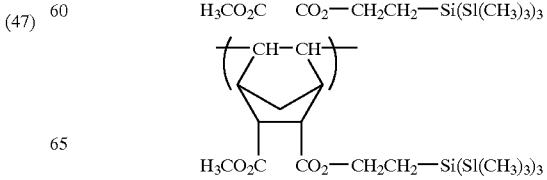

-continued
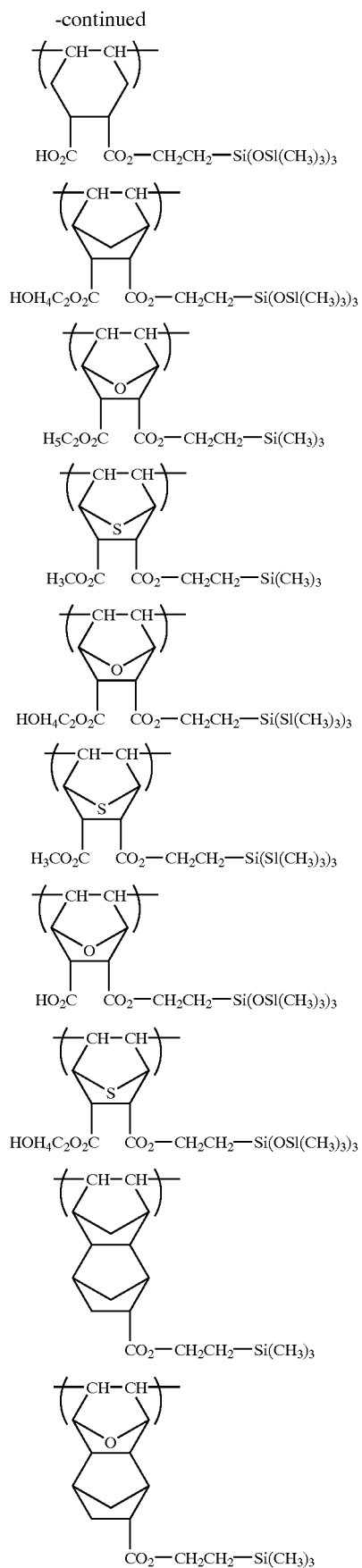
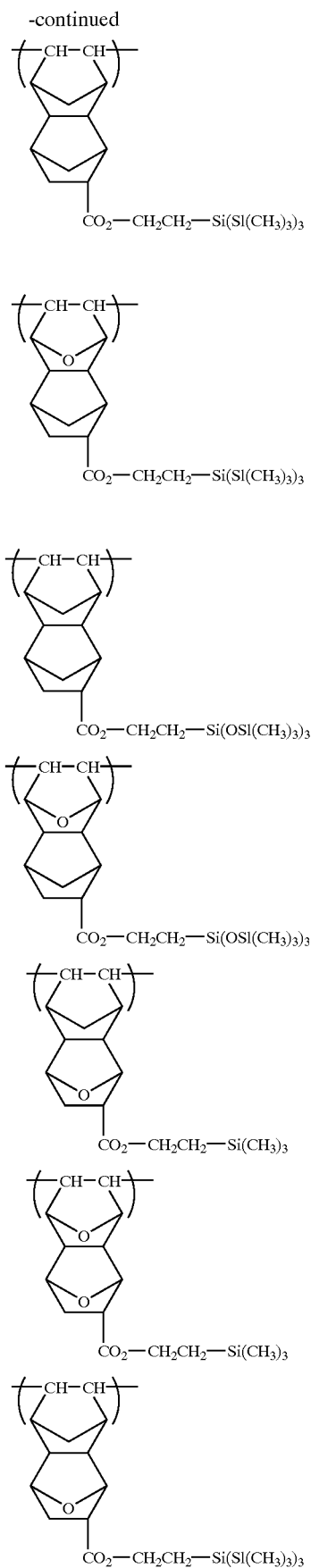

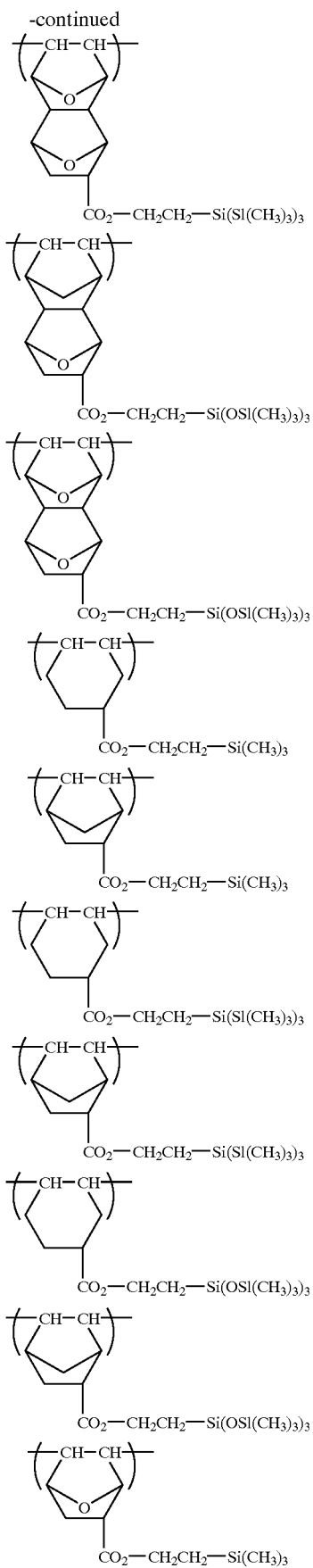
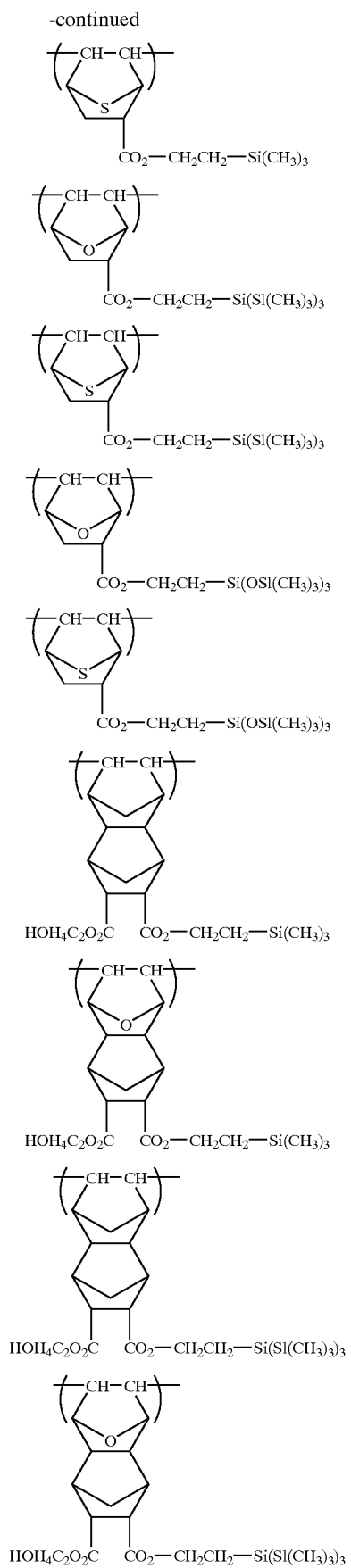

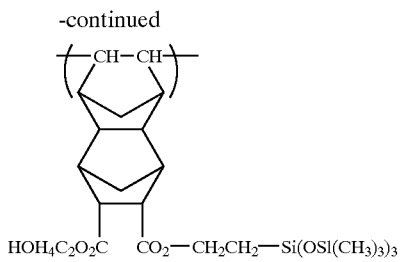

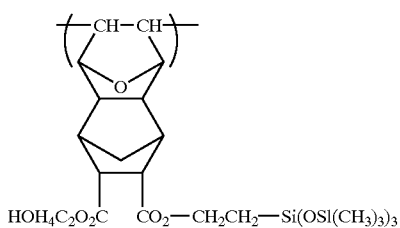

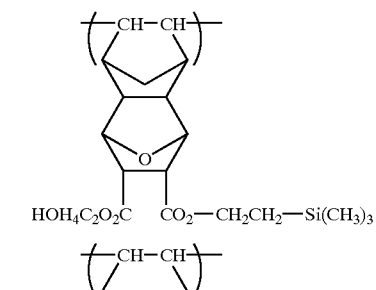

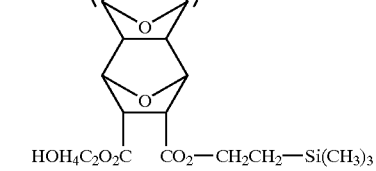

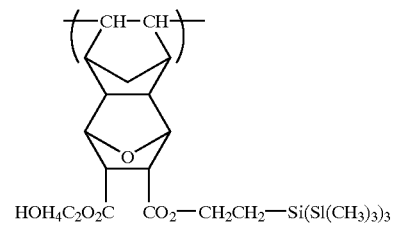

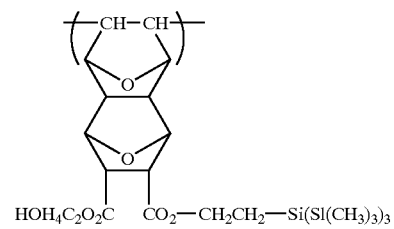

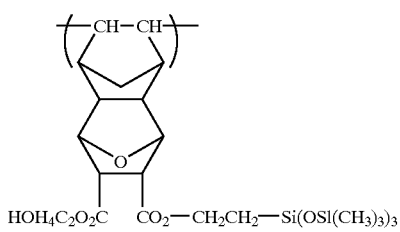

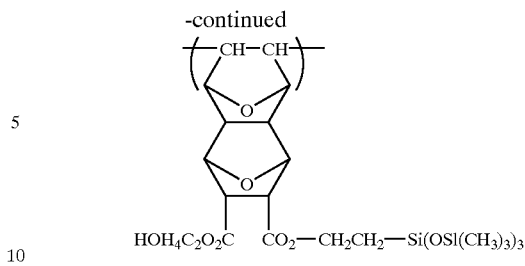

In formulae (IIa) and (IIb), Z represents oxygen atom or —N($R^3$)—. $R^3$ represents hydrogen atom, a hydroxyl group, an alkyl group having a linear or branched chain, or —O—$SO_2R^4$. $R^4$ represents an alkyl group or a trihalomethyl group. The alkyl group represented by $R^3$ and $R^4$ is preferably a linear or branched alkyl group having from 1 to 10 carbon atoms, more preferably a linear or branched alkyl group having from 1 to 6 carbon atoms, still more preferably a methyl group, an ethyl group, a n-propyl group, an i-propyl group, a n-butyl group, an i-butyl group, a sec-butyl group and a tert-butyl group.

$X^1$ and $X^2$ each independently represents oxygen atom, sulfur atom, —NH— or —$NHSO_2$—. $A^1$ and $A^2$ each independently represents a single bond or a divalent linking group. The divalent linking group is a group selected from the group consisting of an alkylene group, a substituted alkylene group, an ether group, a thioether group, a carbonyl group, an ester group, an amide group, a sulfonamide group, a urethane group and a urea group, or a combination of two or more thereof. Examples of the substituent of the substituted alkylene group include a halogen atom, a hydroxyl group and an alkoxy group having from 1 to 4 carbon atoms.

$R^1$ and $R^2$ each independently represents hydrogen atom, a cyano group, a hydroxyl group, —COOH, —$COOR^5$, —CO—NH—$R^6$, an alkyl group which may be substituted, an alkoxy group which may be substituted or a cyclic hydrocarbon group (which may have an ester group or a carbonyl group in the bond of forming a ring) which may be substituted. $R^5$ represents an alkyl group which may have a substituent or a cyclic hydrocarbon group (which may have an ester group or a carbonyl group in the bond of forming a ring) which may have a substituent. $R^6$ represents an alkyl group which may have a substituent. The substituent in which the above-described groups may have is preferably an alkoxy group having from 1 to 4 carbon atoms, such as methoxy, ethoxy, propoxy and butoxy, or a halogen atom.

The alkyl group represented by $R^1$, $R^2$, $R^5$ and $R^6$ is preferably a linear or branched alkyl group having from 1 to 10 carbon atoms, more preferably a linear or branched alkyl group having from 1 to 6 carbon atoms, still more preferably a methyl group, an ethyl group, a n-propyl group, an i-propyl group, a n-butyl group, an i-butyl group, a sec-butyl group or a tert-butyl group.

The alkoxy group represented by $R^1$ and $R^2$ is preferably a linear or branched alkyl group having from 1 to 6 carbon atoms, more preferably a methoxy group, an ethoxy group, a n-propoxy group, an i-propoxy group, a n-butoxy group, an i-butoxy group, a sec-butoxy group or a tert-butoxy group.

Specific examples of the repeating unit represented by formula (IIa) include the followings, however, the present invention is by no means limited to these specific examples.

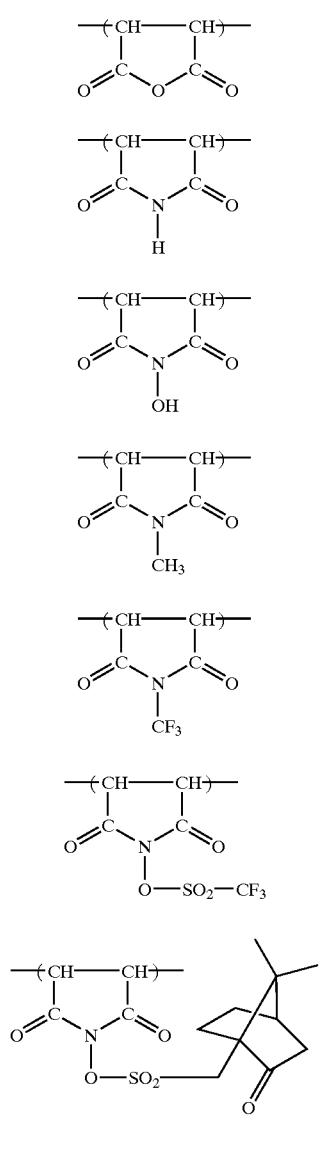
[IIa-1]
[IIa-2]
[IIa-3]
[IIa-4]
[IIa-5]
[IIa-6]
[IIa-7]
Specific examples of the repeating unit represented by formula (IIb) include the followings, however, the present invention is by no means limited to these specific examples.
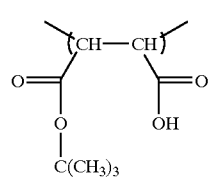
[IIb-1]
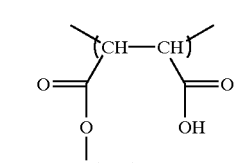
[IIb-2]
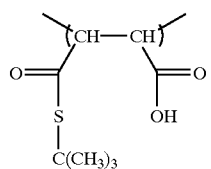
[IIb-3]
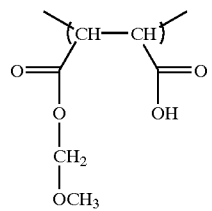
[IIb-4]
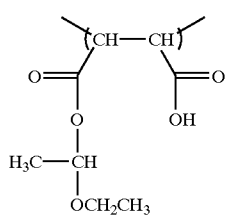
[IIb-5]
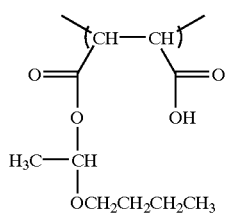
[IIb-6]
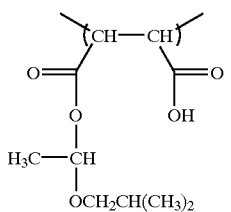
[IIb-7]
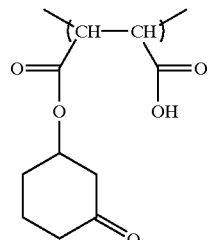
[IIb-8]
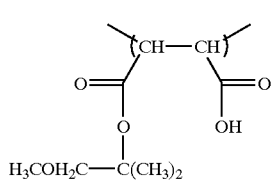
[IIb-9]

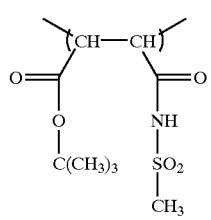
[IIb-10]
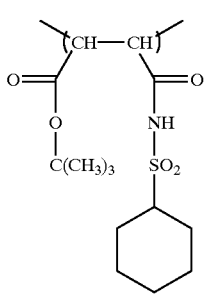
[IIb-11]
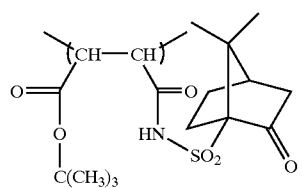
[IIb-12]
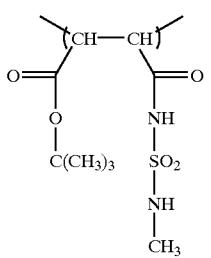
[IIb-13]
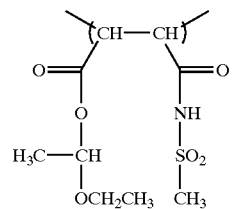
[IIb-14]
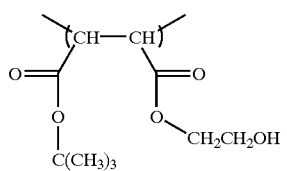
[IIb-15]
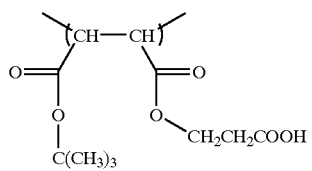
[IIb-16]
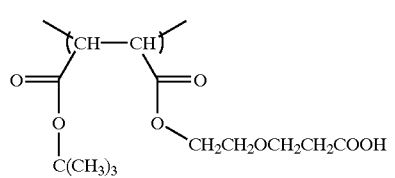
[IIb-17]
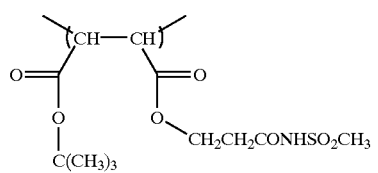
[IIb-18]
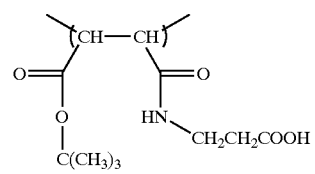
[IIb-19]
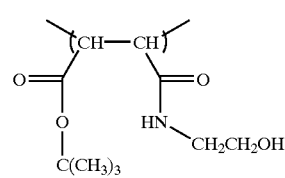
[IIb-20]
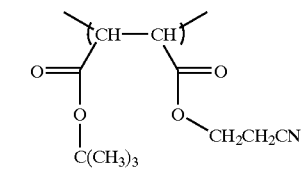
[IIb-21]
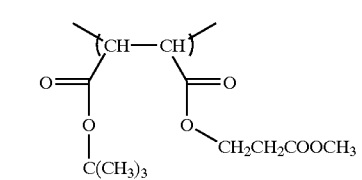
[IIb-22]
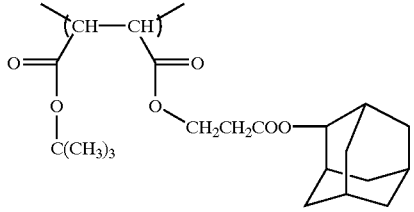
[IIb-23]
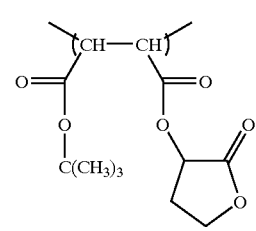
[IIb-24]

-continued
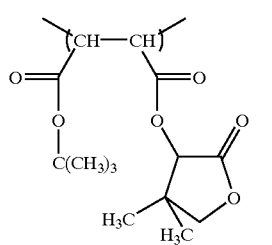
[IIb-25]
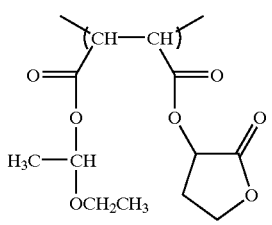
[IIb-26]
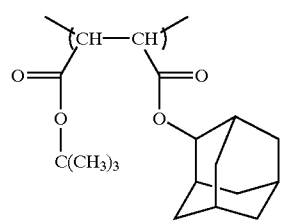
[IIb-27]
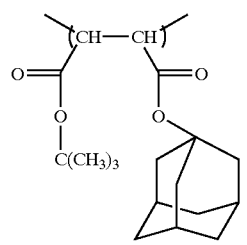
[IIb-28]
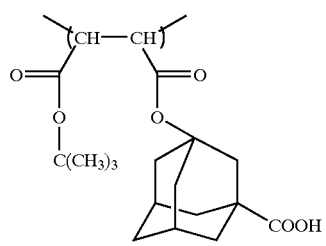
[IIb-29]
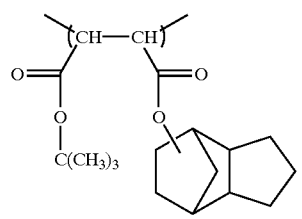
[IIb-30]
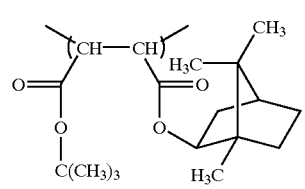
[IIb-31]
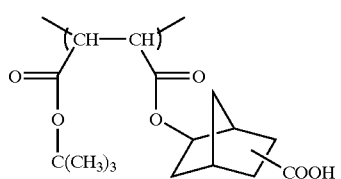
[IIb-32]
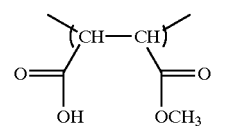
[IIb-33]
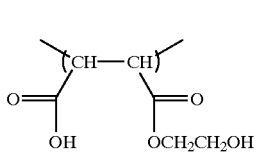
[IIb-34]
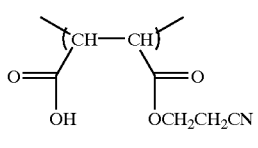
[IIb-35]
[IIb-36]
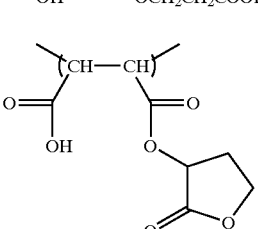
[IIb-37]
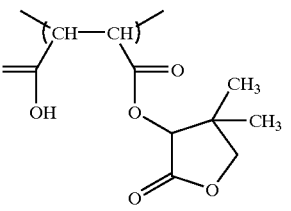
[IIb-38]
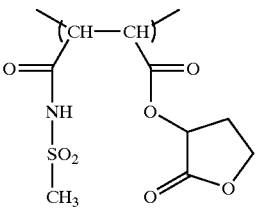
[IIb-39]
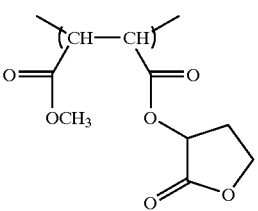
[IIb-40]

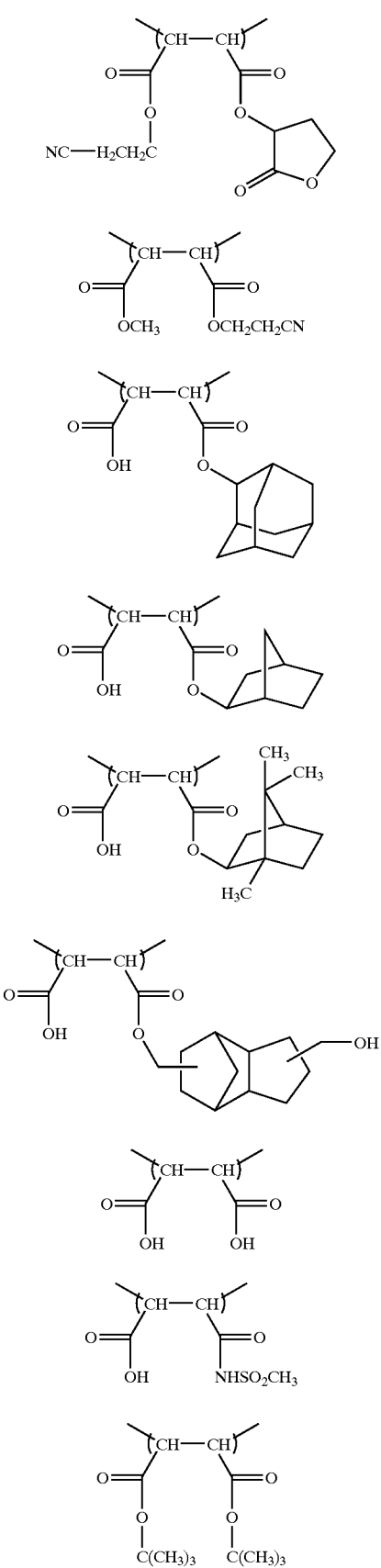
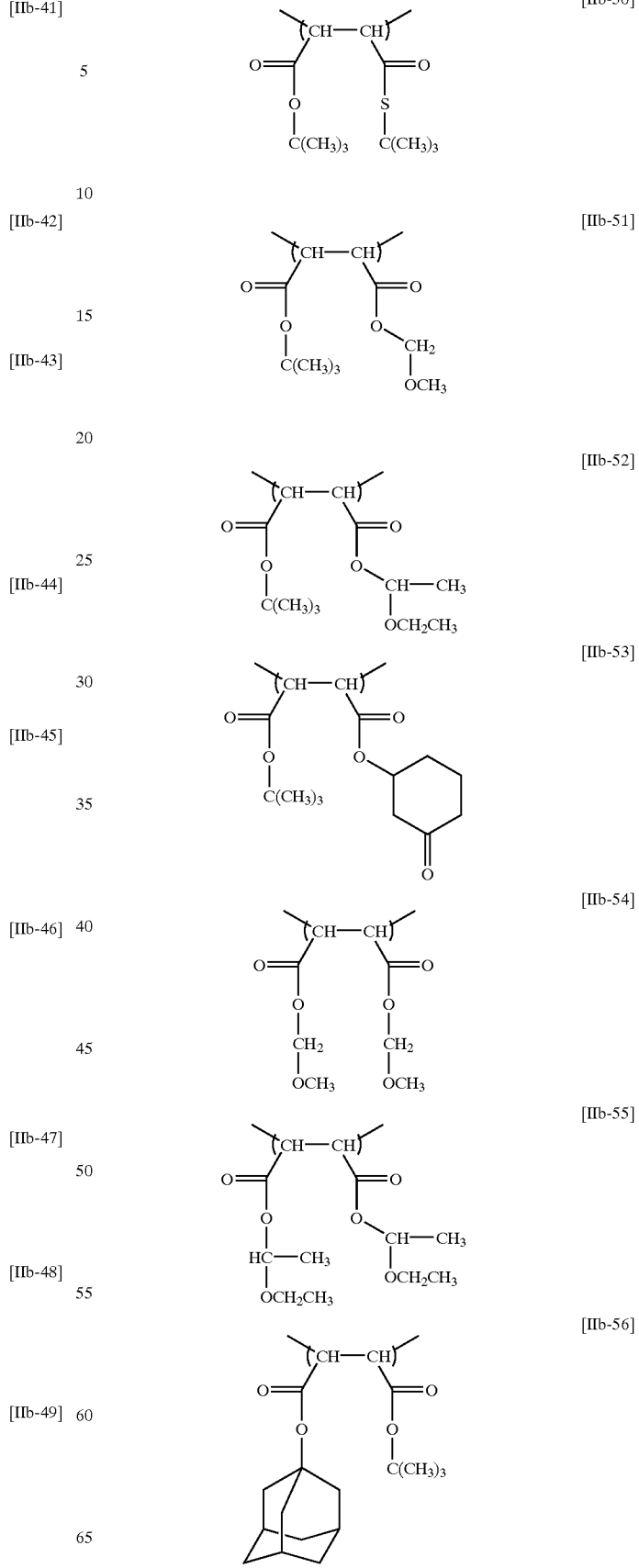

[IIb-57] 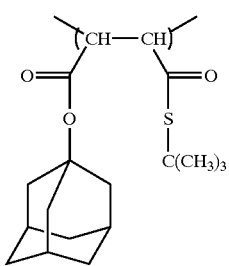

[IIb-58] 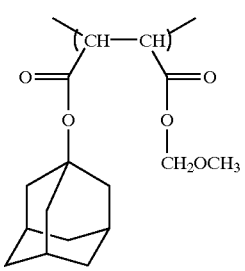

[IIb-59] 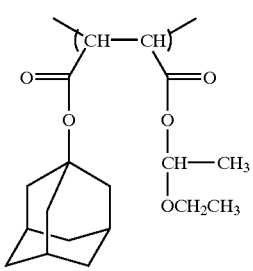

[IIb-60] 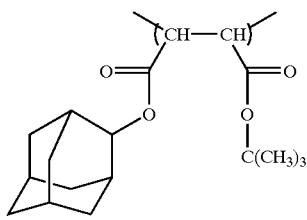

[IIb-61] 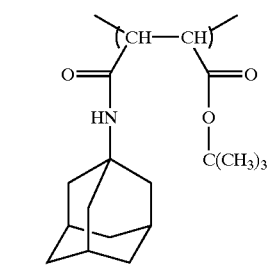

[IIb-62] 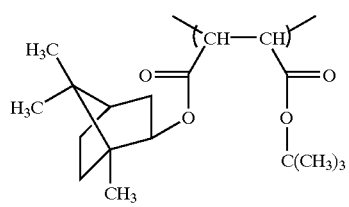

[IIb-63] 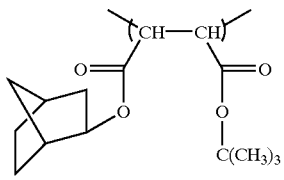

[IIb-64] 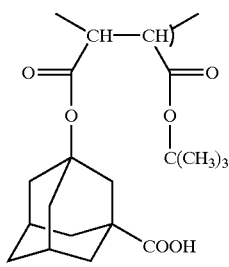

[IIb-65] 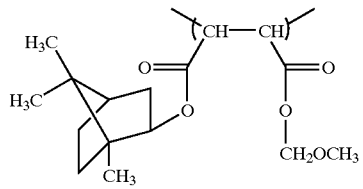

In formula (III), $M^2$ represents an atomic group for forming an alicyclic structure which contains two bonded carbon atoms (C—C) and which may have a substituent. $R^{11}$ and $R^{12}$ each independently represents hydrogen atom, a cyano group, a halogen atom or an alkyl group which may have a substituent.

Examples of the halogen atom represented by $R^{11}$ and $R^{12}$ include chlorine atom, bromine atom, fluorine atom and iodine atom.

The alkyl group represented by $R^{11}$ and $R^{12}$ is preferably a linear or branched alkyl group having from 1 to 10 carbon atoms, more preferably a linear or branched alkyl group having from 1 to 6 carbon atoms, still more preferably a methyl group, an ethyl group, a propyl group, an isopropyl group, a n-butyl group, an isobutyl group, a sec-butyl group or a tert-butyl group.

Examples of the substituent of the alkyl group represented by $R^{11}$ and $R^{12}$ include a hydroxyl group, a halogen atom, a carboxyl group, an alkoxy group, an acyl group, a cyano group and an acyloxy group. Examples of the halogen atom include chlorine atom, bromine atom, fluorine atom and iodine atom; examples of the alkoxy group include an alkoxy group having from 1 to 4 carbon atoms, such as methoxy group, ethoxy group, propoxy group and butoxy group; examples of the acyl group include a formyl group and an acetyl group; and examples of the acyloxy group include an acetoxy group.

The atomic group for forming an alicyclic structure, represented by $M^2$ is an atomic group for forming a repeating unit of an alicyclic hydrocarbon which may have a substituent, and the atomic group is preferably an atomic group for forming a 5-, 6-, 7- or 8-membered monocyclic alicyclic structure or a cross-linked alicyclic structure in which a repeating unit of cross-linked alicyclic hydrocarbons is formed.

Examples of the skeleton for the cross-linked alicyclic hydrocarbons include those having the following structures.

-continued
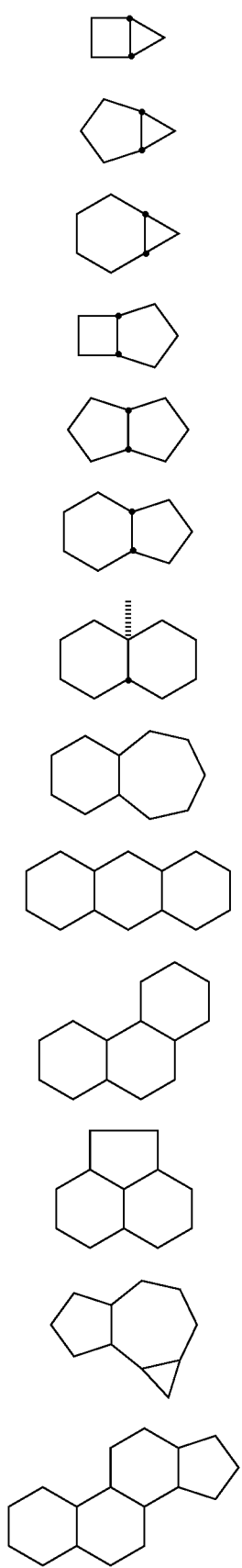
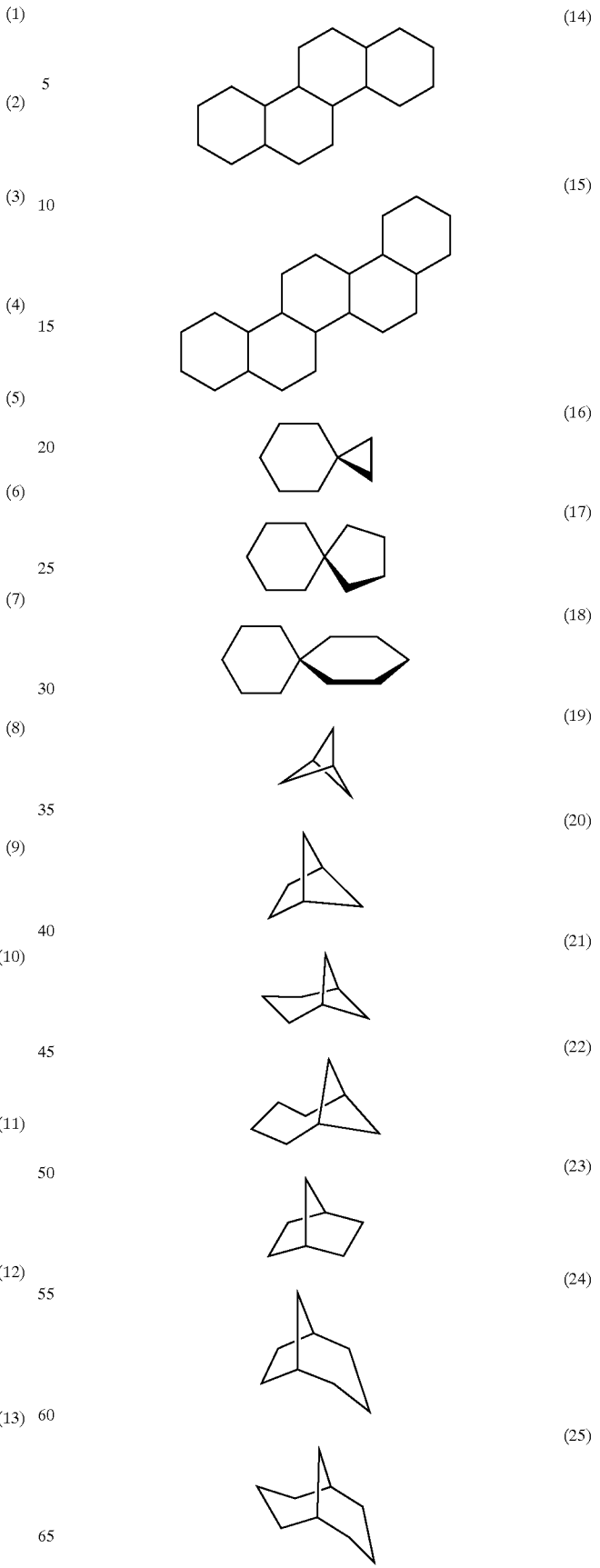

(26) 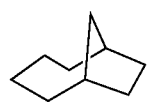

(27) 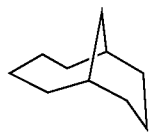

(28) 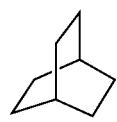

(29) 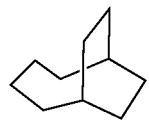

(30) 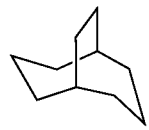

(31) 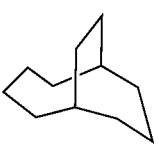

(32) 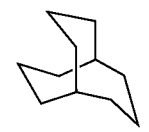

(33) 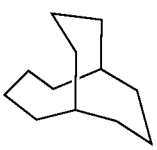

(34) 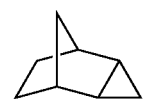

(35) 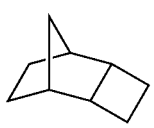

(36) 

(37) 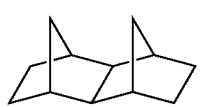

(38) 

(39) 

(40) 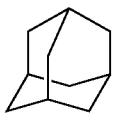

(41) 

(42) 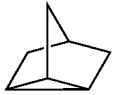

(43) 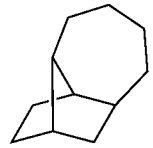

(44) 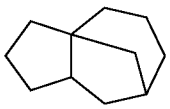

(45) 

(46) 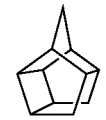

(47) 

The skeleton of the alicyclic hydrocarbon may have a substituent. Examples of the substituent include a halogen atom, a cyano group, —COOH, —COOR (wherein R represents an alkyl group, a cyclic hydrocarbon group or a group capable of decomposing under the action of an acid), —CO—X—A—R (wherein X, A and R are the same as $X^1$, $A^1$ and $R^1$ in formula (IIb), respectively), an alkyl group which may have a substituent, or a cyclic hydrocarbon group which may have a substituent.

Among those repeating units having cross-linked alicyclic hydrocarbon groups, those having the following structures are more preferred.

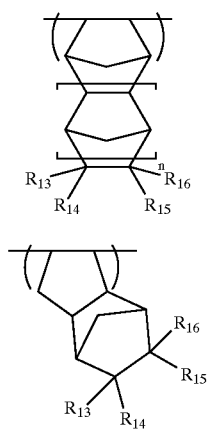

(IIIa)

(IIIb)

wherein $R_{13}$ to $R_{16}$ each independently represents hydrogen atom, a halogen atom, a cyano group, —COOH, —COOR$_5$ (wherein $R_5$ is the same as defined above), a group capable of decomposing under the action of an acid, —C(=O)—X—A—R$_{17}$ (wherein X and A are the same as defined above, and $R_{17}$ represents —COOH, —COOR$_5$, —CN, a hydroxyl group, an alkoxy group which may have a substituent, —CO—NH—R$_6$, —CO—NH—SO$_2$—R$_6$ (wherein $R_5$ and $R_6$ are the same as defined above) or a —Y group shown above), an alkyl group which may have a substituent or a cyclic hydrocarbon group which may have a substituent, at least two of $R_{13}$ to $R_{16}$ may be combined to form a ring, and n represents 0 or 1.

In formulae (IIIa) and (IIIb), $R_{13}$ to $R_{16}$ each independently represents hydrogen atom, a halogen atom, a cyano group, —COOH, —COOR$_5$ (wherein $R_5$ is an alkyl group which may have a substituent, or a cyclic hydrocarbon group which may have a substituent, or has the same meaning as —Y in formula (I)), a group capable of decomposing under the action of an acid, —C(=O)—X—A—R$_{17}$, an alkyl group which may have a substituent or a cyclic hydrocarbon group which may have a substituent. n represents 0 or 1. X represents oxygen atom, sulfur atom, —NH—, —NHSO$_2$— or —NHSO$_2$NH—. $R_{17}$ represents —COOH, —COOR$_5$, —CN, a hydroxyl group, an alkoxy group which may have a substituent, —CO—NH—R$_6$, —CO—NH—SO$_2$—R$_6$ (wherein $R_5$ and $R_6$ are the same as defined above) or a —Y group in formula (Ia) above. A represents a single bond or a divalent linking group.

In the resin according to the present invention, the acid-decomposable group may be contained in the above-described —C(=O)—X—A—R$_1$ or —C(=O)—X—A—R$_2$, or may contained as a substituent of $Z_1$ in formula (II).

The structure of the acid-decomposable group is represented by —C(=O)—X$_1$R$_0$ (wherein R$_0$ is a tertiary alkyl group such as tert-butyl group and tert-amyl group, an isoboronyl group, a 1-alkoxyethyl group such as 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a tetrahydropyranyl group, a tetrahydrofuranyl group, a trialkylsilyl ester group, a 3-oxocyclohexyl ester group, a 2-methyl-2-adamantyl group, a mevalonic lactone residue, or a 2-(γ-butyrolactonyloxycarbonyl)-2-propyl group, and $X_1$ has the same meaning as X above).

Examples of the halogen atom represented by $R_{13}$ to $R_{16}$ include chlorine atom, bromine atom, fluorine atom and iodine atom.

The alkyl group represented by $R_{13}$ to $R_{16}$ is preferably a linear or branched alkyl group having from 1 to 10 carbon atoms, more preferably a linear or branched alkyl group having from 1 to 6 carbon atoms, still more preferably a methyl group, an ethyl group, a propyl group, an isopropyl group, a n-butyl group, an isobutyl group, a sec-butyl group or a tert-butyl group.

Examples of the cyclic hydrocarbon group by $R_{13}$ to $R_{16}$ include a cyclic alkyl group and a cross-linked hydrocarbon, such as cyclopropyl group, cyclopentyl group, cyclohexyl group, adamantyl group, 2-methyl-2-adamantyl group, norbornyl group, boronyl group, isoboronyl group, tricyclodecanyl group, dicyclopentenyl group, norbornane epoxy group, menthyl group, isomenthyl group, neomenthyl group and tetracyclododecanyl group.

Examples of the ring formed by the combining of at least two of $R_{13}$ to $R_{16}$ include a ring having from 5 to 12 carbon atoms, such as cyclopentene, cyclohexene, cycloheptene and cyclooctene.

Examples of the alkoxy group represented by $R_{17}$ include an alkoxy group having from 1 to 4 carbon atoms, such as methoxy group, ethoxy group, propoxy group and butoxy group.

Examples of the substituent of these alkyl group, cyclic hydrocarbon group and alkoxy group include a hydroxy group, a halogen atom, a carboxy group, an alkoxy group, an acyl group, a cyano group and an acyloxy group. Examples of the halogen atom include chlorine atom, bromine atom, fluorine atom and iodine atom; examples of the alkoxy group include an alkoxy group having from 1 to 4 carbon atoms, such as methoxy group, ethoxy group, propoxy group and butoxy group; examples of the acyl group include a formyl group and an acetyl group; and examples of the acyloxy group include an acetoxy group.

The divalent linking group represented by A is a group selected from the group consisting of an alkylene group, a substituted alkylene group, an ether group, a thioether group, a carbonyl group, an ester group, an amide group, a sulfonamide group, a urethane group and a urea group, or a combination of two or more thereof. Examples of the substituent of the substituted alkylene group include a halogen atom, a hydroxy group and an alkoxy group having from 1 to 6 carbon atoms.

Respective substituents $R_{13}$ to $R_{16}$ in formula (IIIa) or (IIIb) work out to a substituent of an atomic group Z for forming an alicyclic structure or for forming a cross-linked alicyclic structure in formula (II).

Specific examples of the repeating units represented by formulae (IIIa) and (IIIb) include the following [III-1] to [III-166], however, the present invention is by no means limited to these specific examples.

[III-1]

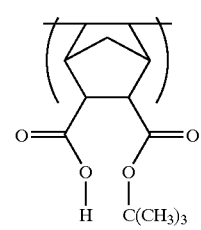

-continued
[III-2]
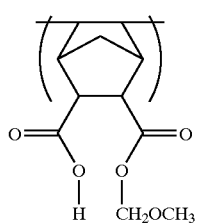
[III-3]
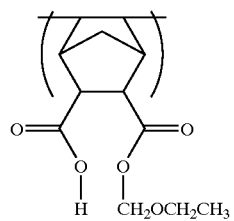
[III-4]
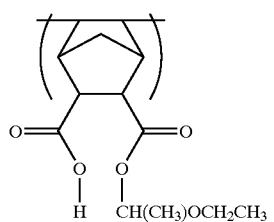
[III-5]
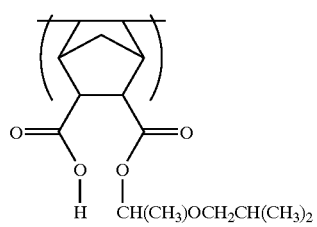
[III-6]
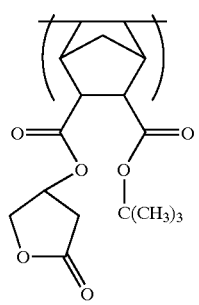
[III-7]
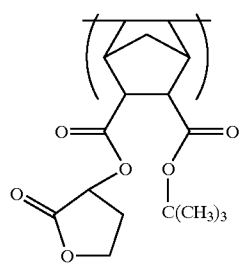
[III-8]
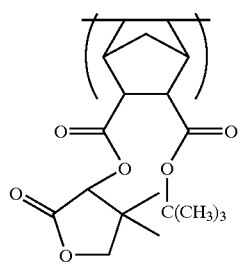
[III-9]
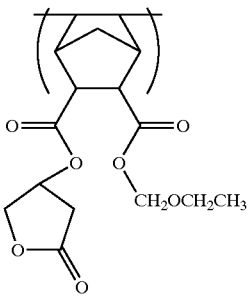
[III-10]
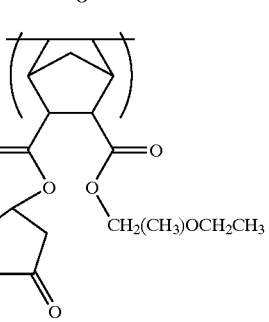
[III-11]
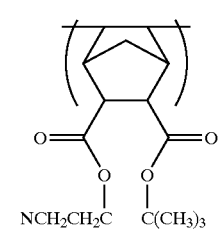
[III-12]
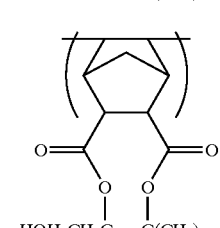
[III-13]
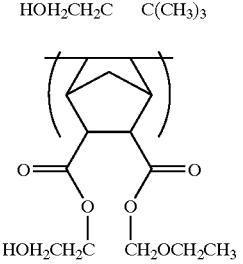

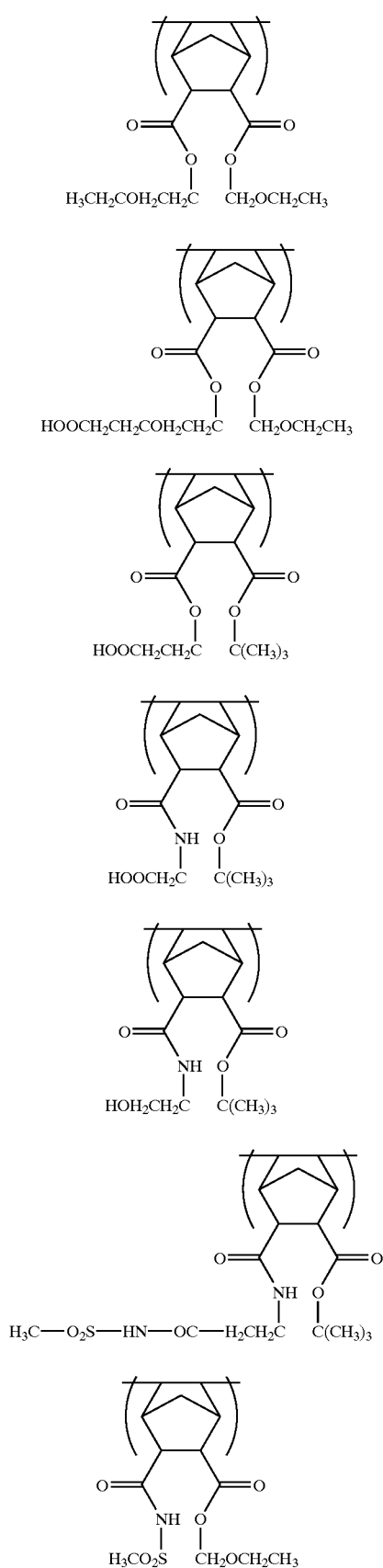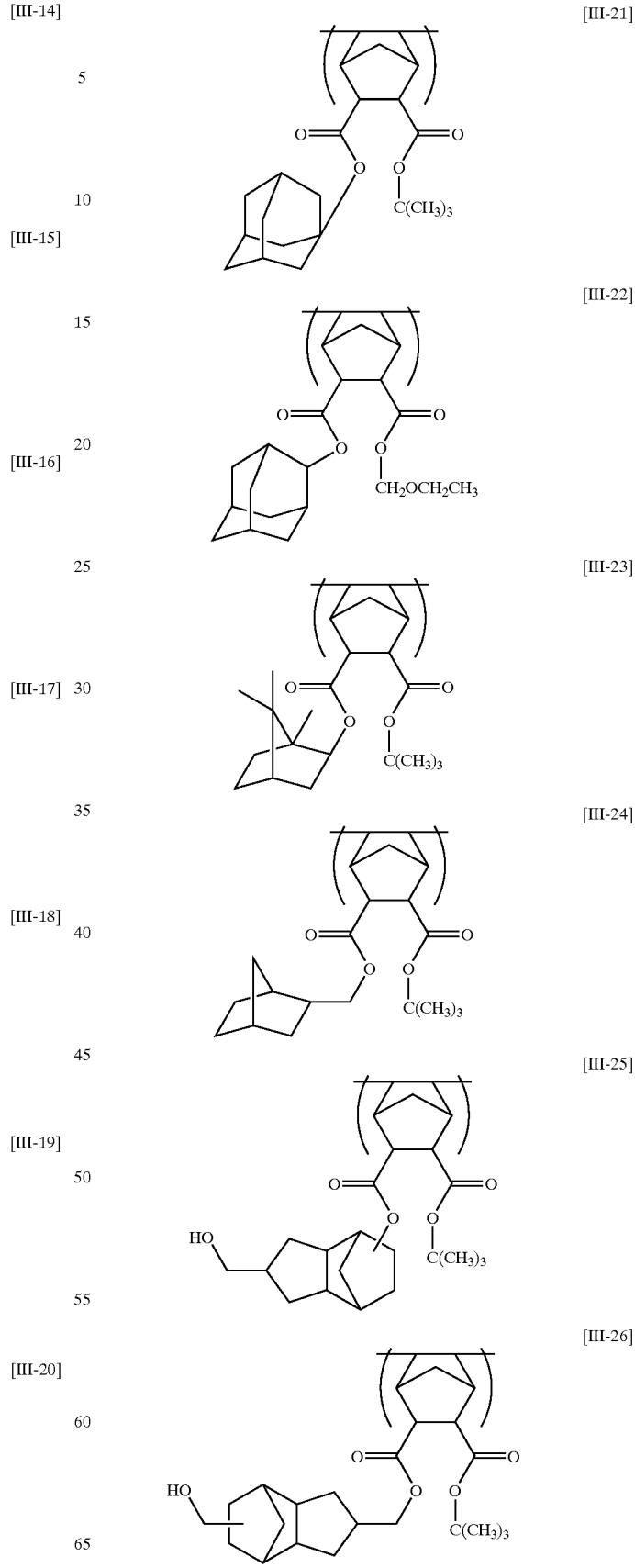

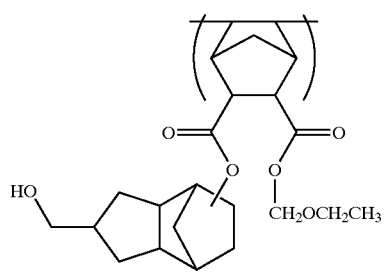 [III-27]
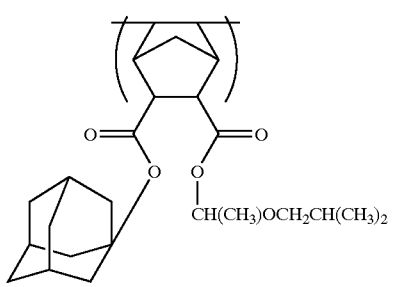 [III-28]
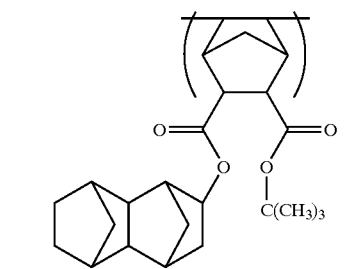 [III-29]
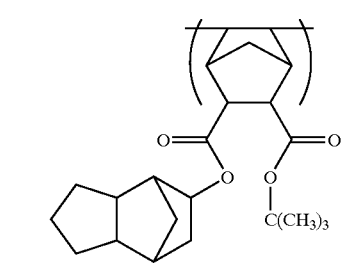 [III-30]
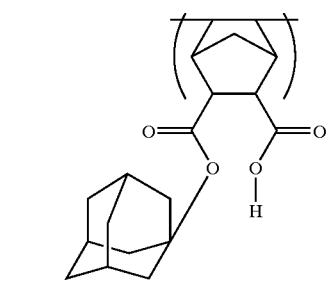 [III-31]
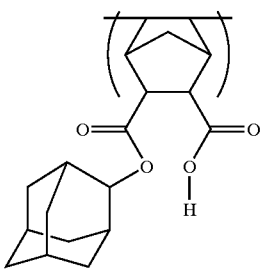 [III-32]
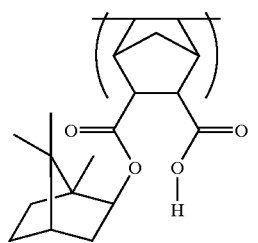 [III-33]
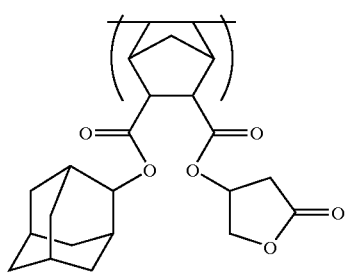 [III-34]
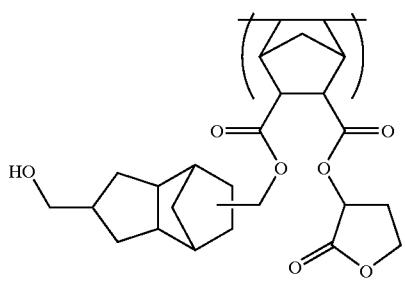 [III-35]
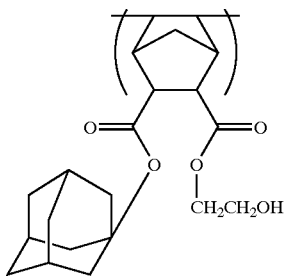 [III-36]
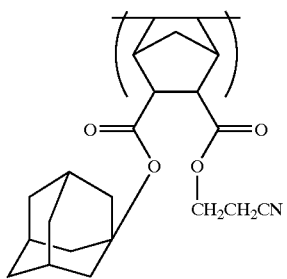 [III-37]

[III-38]
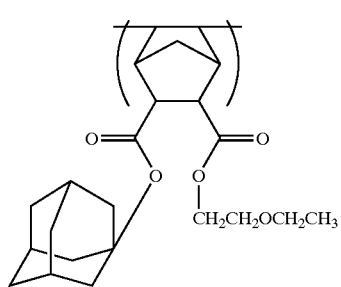
[III-39]
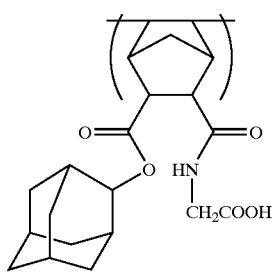
[III-40]
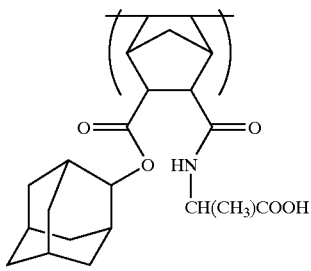
[III-41]
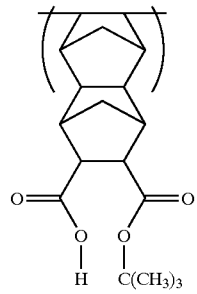
[III-42]
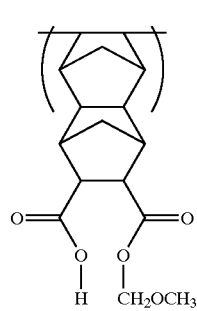
[III-43]
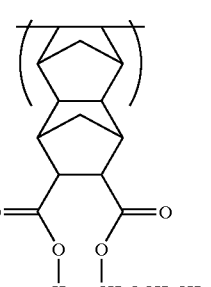
[III-44]
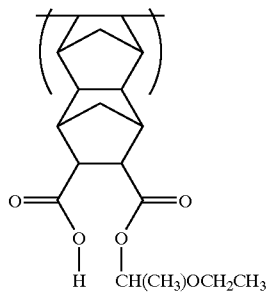
[III-45]
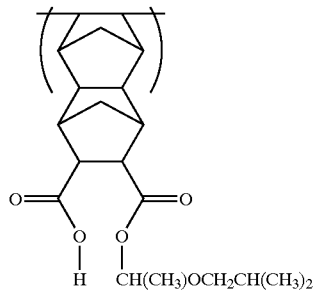
[III-46]
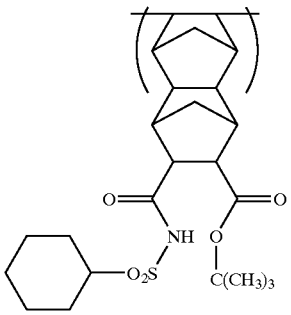
[III-47]
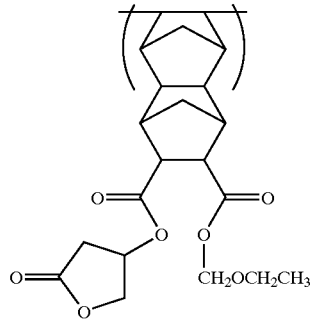

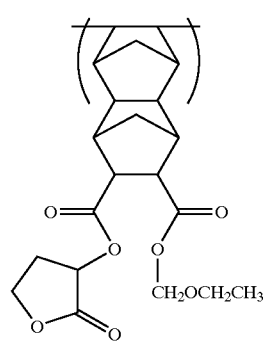
[III-48]
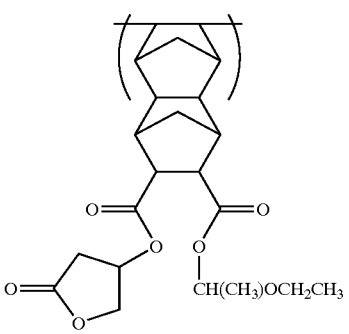
[III-49]
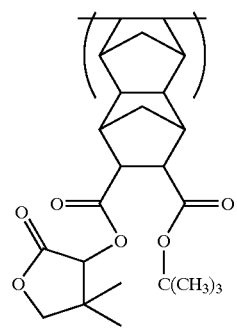
[III-50]
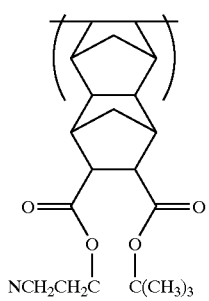
[III-51]
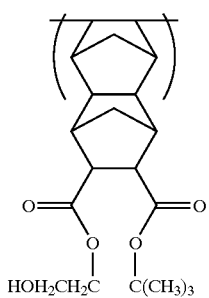
[III-52]
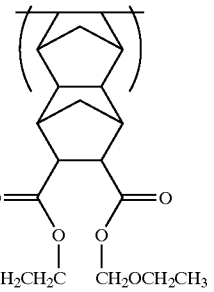
[III-53]
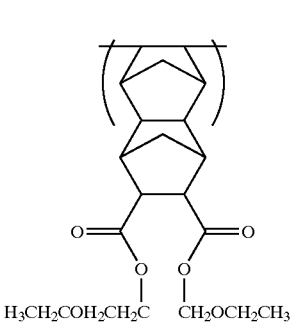
[III-54]
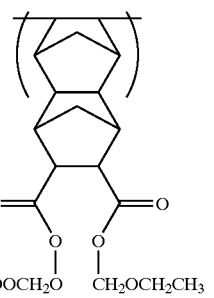
[III-55]
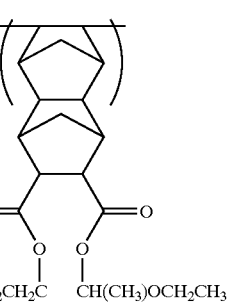
[III-56]
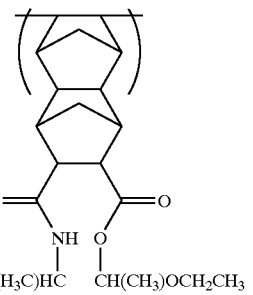
[III-57]

-continued
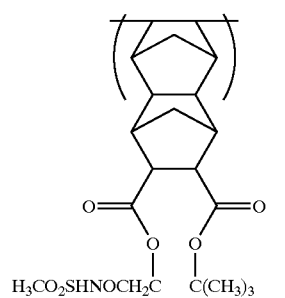
[III-58]
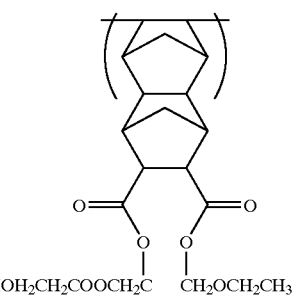
[III-59]
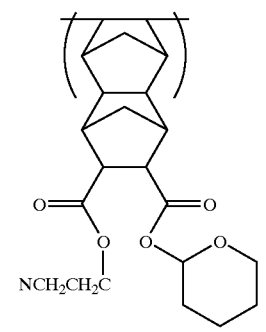
[III-60]
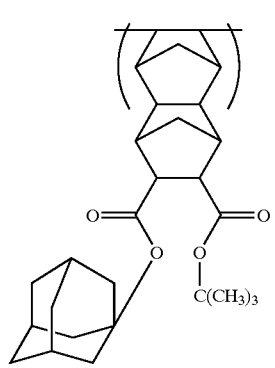
[III-61]
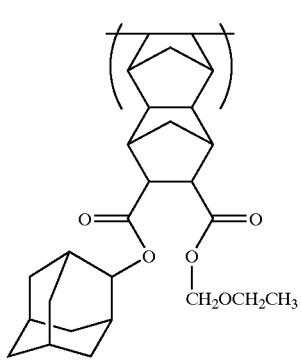
[III-62]
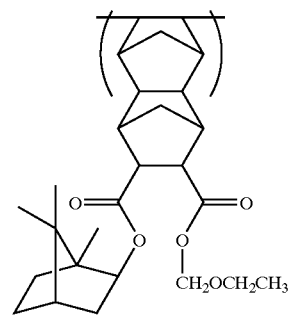
[III-63]
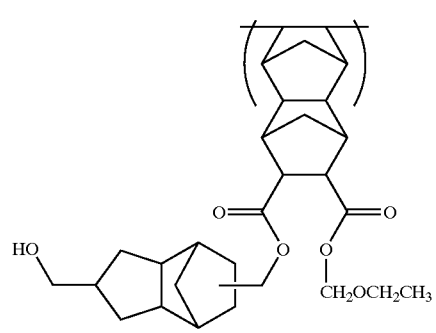
[III-64]
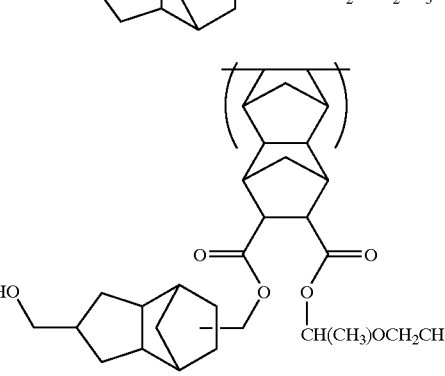
[III-65]
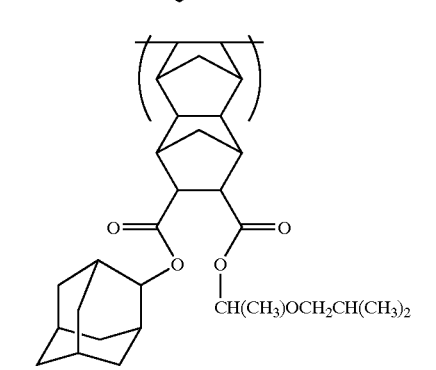
[III-66]
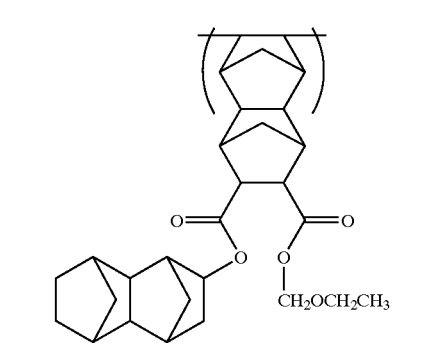
[III-67]

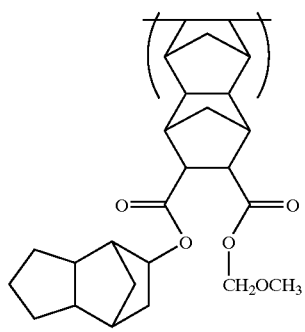
[III-68]
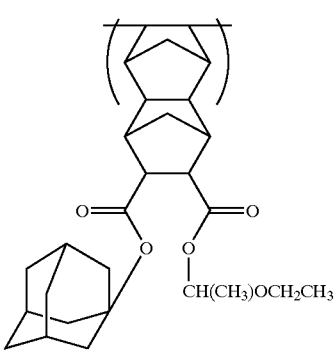
[III-69]
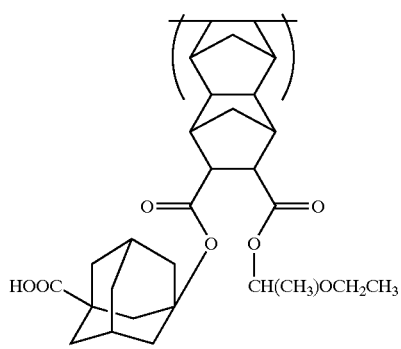
[III-70]
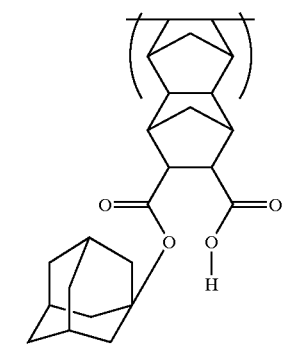
[III-71]
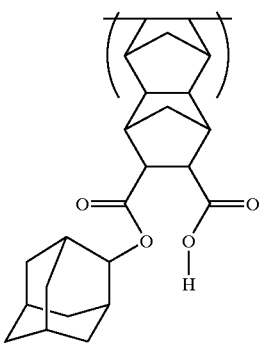
[III-72]
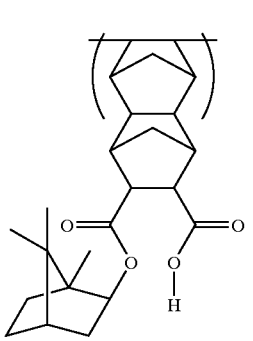
[III-73]
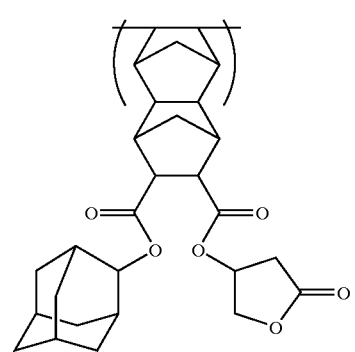
[III-74]
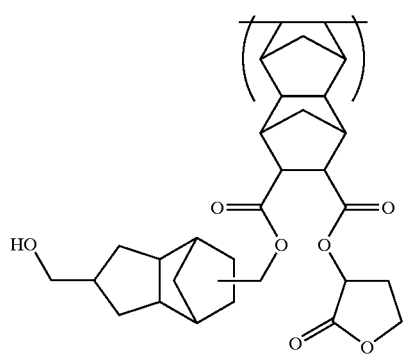
[III-75]

-continued
[III-76]
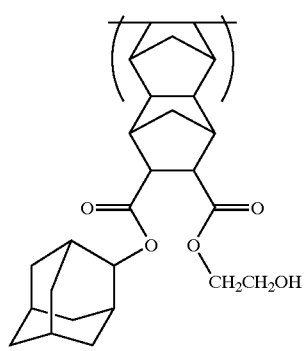
[III-77]
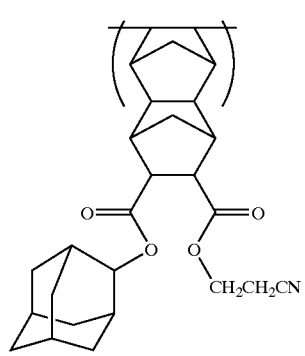
[III-78]
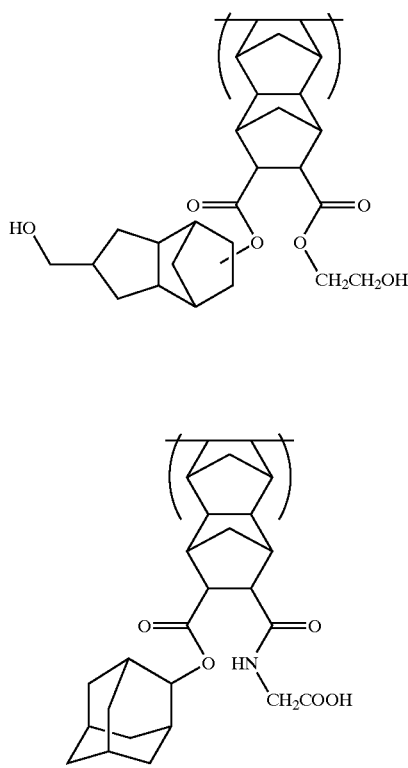
[III-79]
-continued
[III-80]
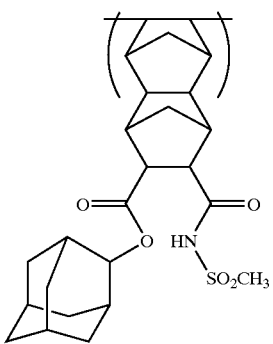
[III-81]
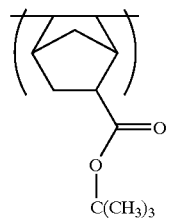
[III-82]
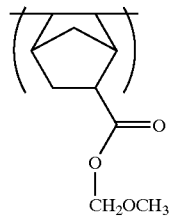
[III-83]
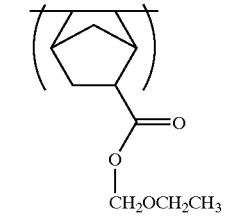
[III-84]
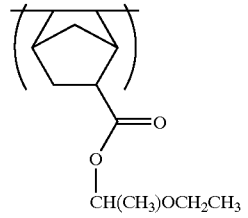
[III-85]
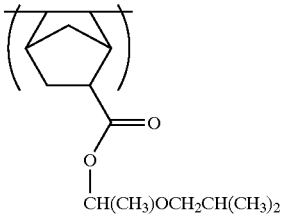

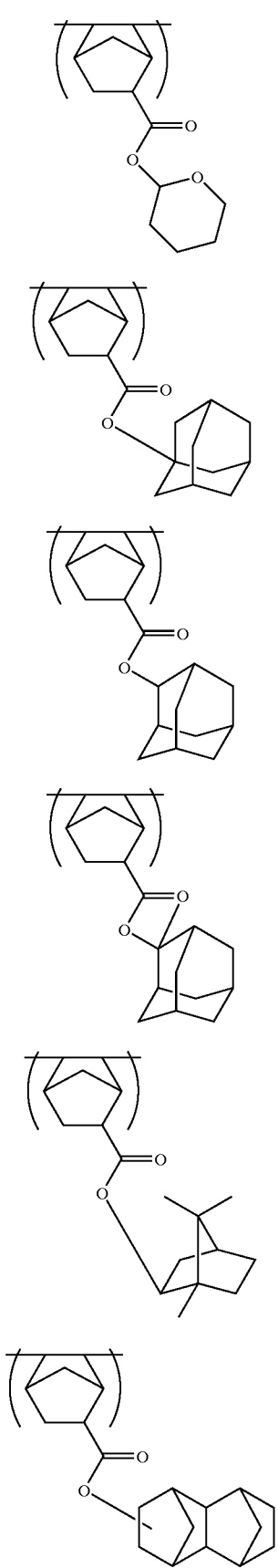
[III-86]
[III-87]
[III-88]
[III-89]
[III-90]
[III-91]
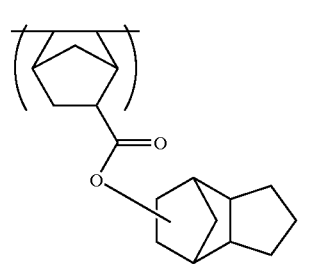
[III-92]
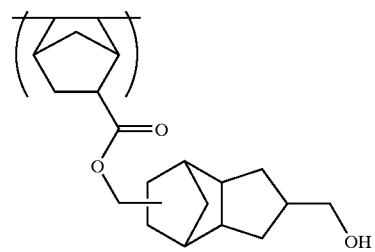
[III-93]
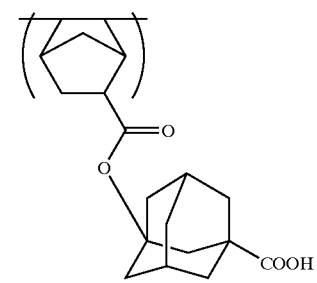
[III-94]
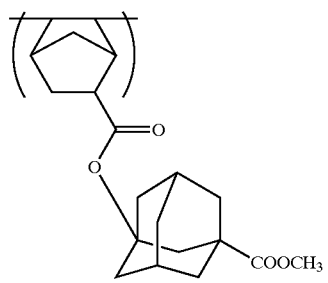
[III-95]
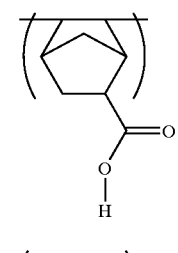
[III-96]
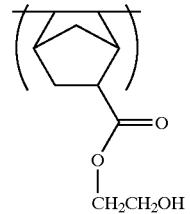
[III-97]

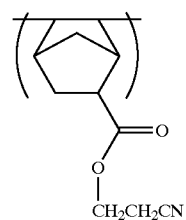 [III-98]
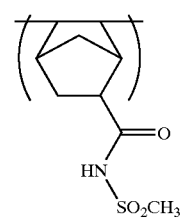 [III-99]
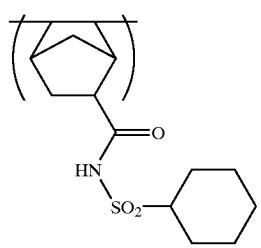 [III-100]
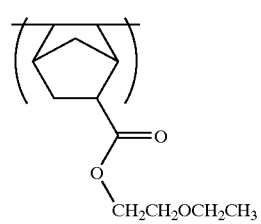 [III-101]
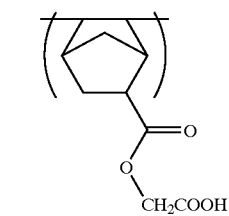 [III-102]
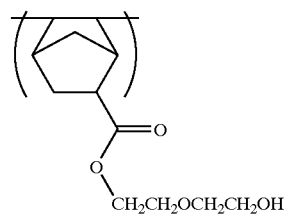 [III-103]
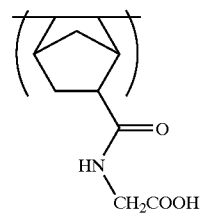 [III-104]
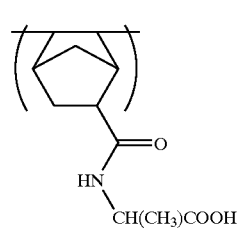 [III-105]
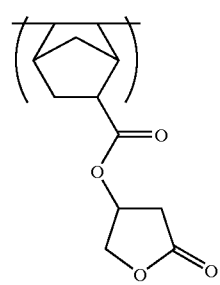 [III-106]
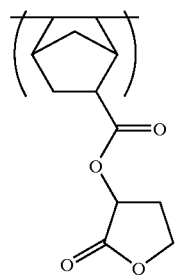 [III-107]
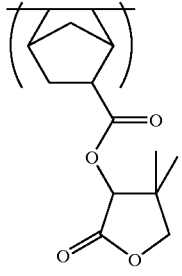 [III-108]
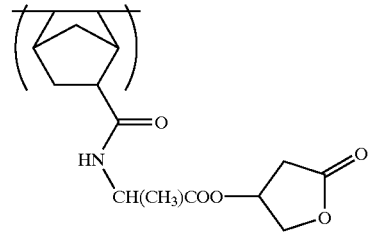 [III-109]
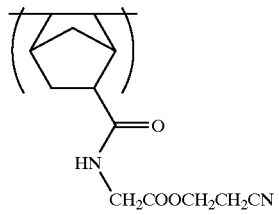 [III-110]

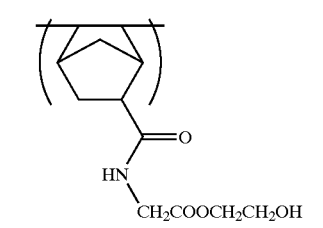
[III-111]
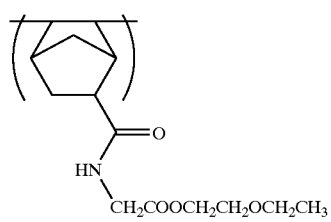
[III-112]
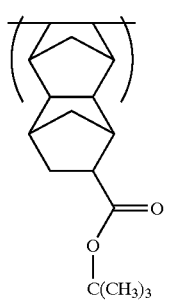
[III-113]
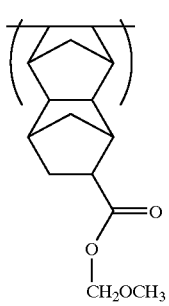
[III-114]
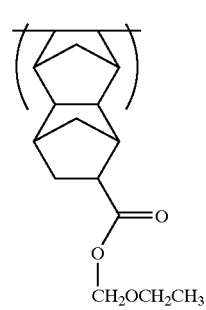
[III-115]
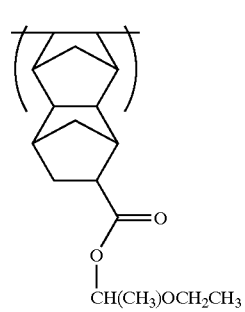
[III-116]
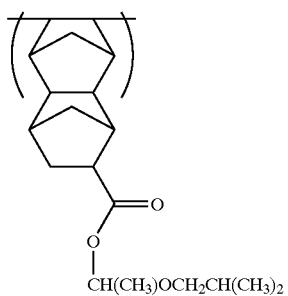
[III-117]
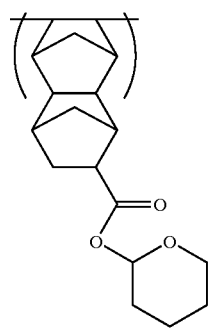
[III-118]
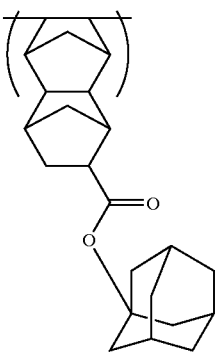
[III-119]
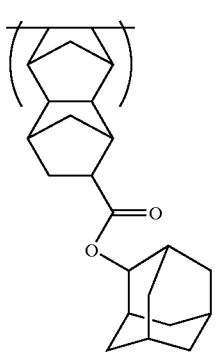
[III-120]

[III-121]
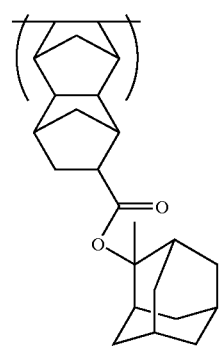
[III-122]
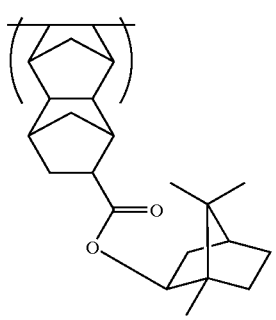
[III-123]
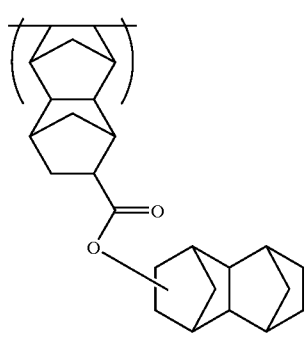
[III-124]
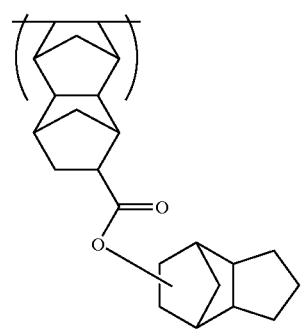
[III-125]
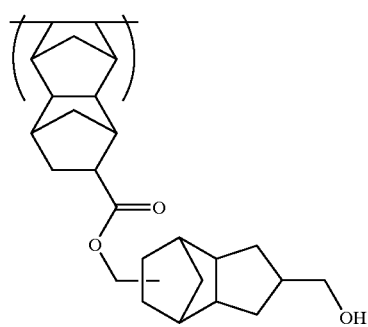
[III-126]
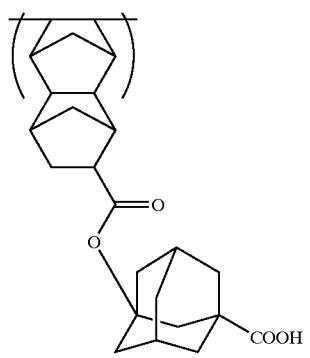
[III-127]
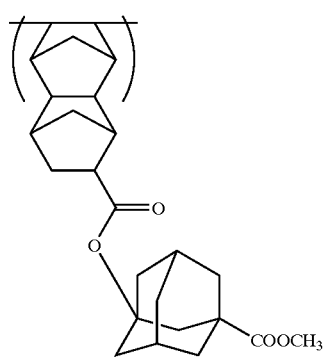
[III-128]
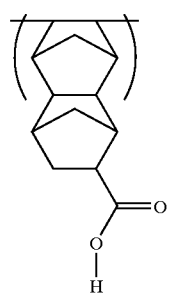
[III-129]
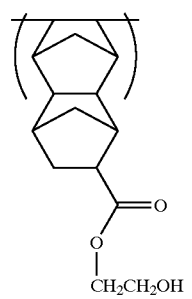
[III-130]
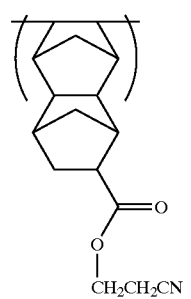

[III-131]
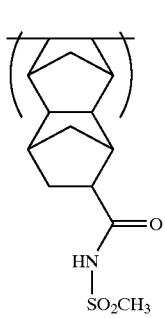
[III-132]
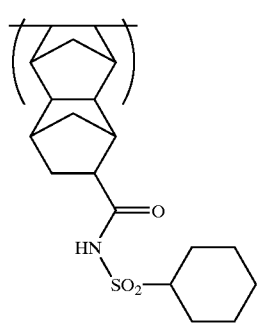
[III-133]
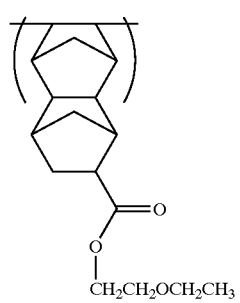
[III-134]
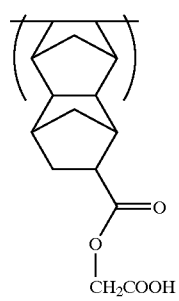
[III-135]
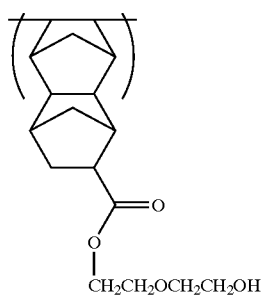
[III-136]
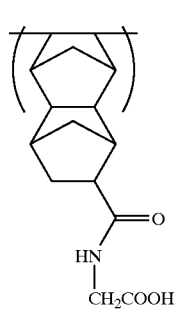
[III-137]
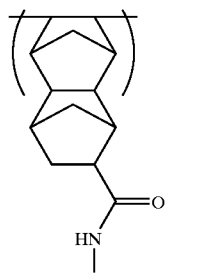
[III-138]
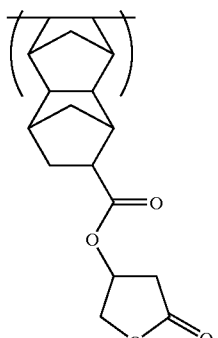
[III-139]
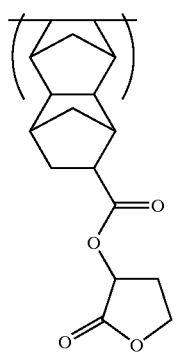
[III-140]
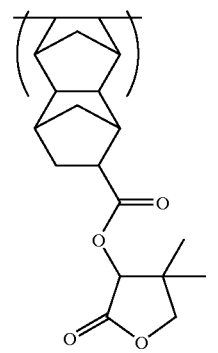

[III-141]
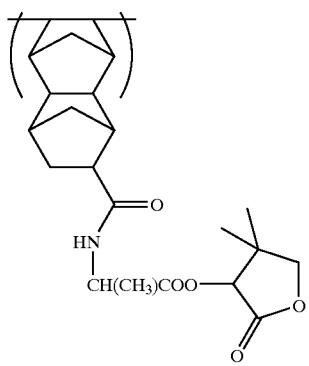
[III-142]
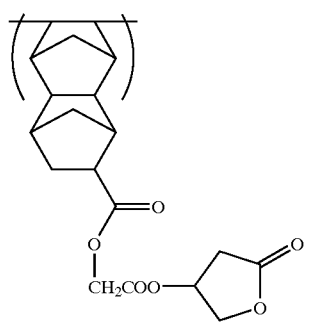
[III-143]
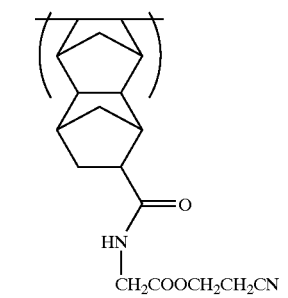
[III-144]
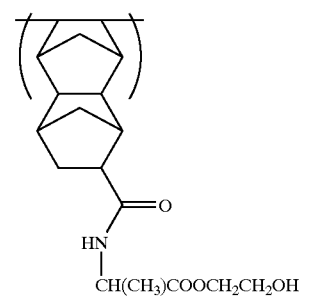
[III-145]
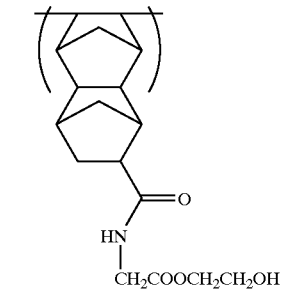
[III-146]
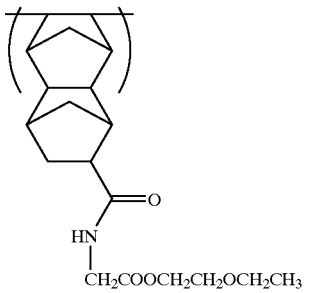
[III-147]
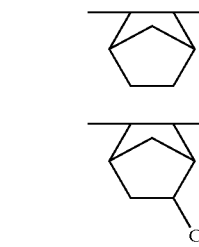
[III-148]
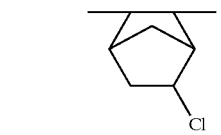
[III-149]
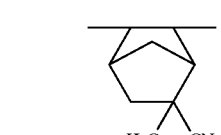
[III-149]
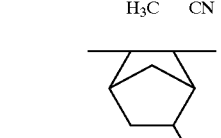
[III-150]
[III-151]
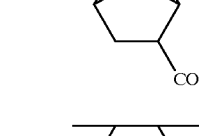
[III-152]
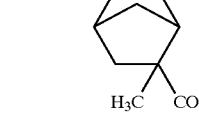
[III-153]
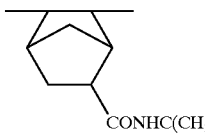
[III-154]
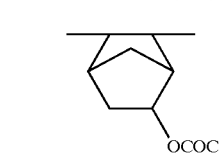

-continued

[III-155] 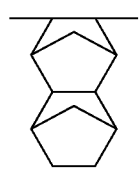

[III-156] 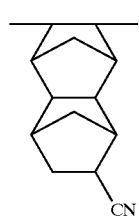

[III-157] 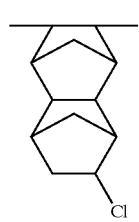

[III-158] 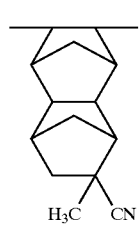

[III-159] 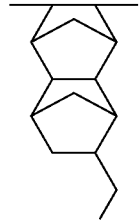

[III-160] 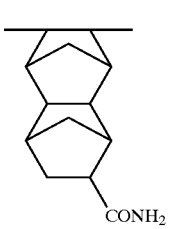

[III-161] 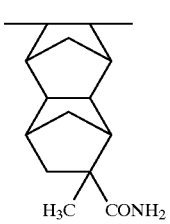

-continued

[III-162] 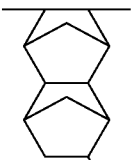

[III-163] 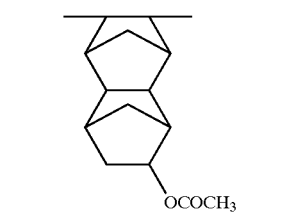

[III-164] 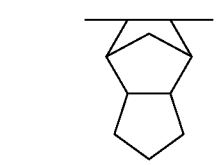

[III-165] 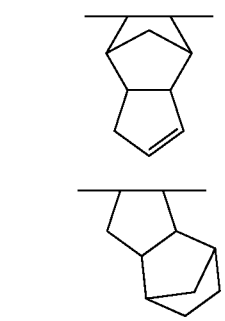

[III-166] 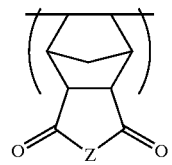

For the purpose of controlling the dry etching resistance, suitability for the standard developer, adhesion to the substrate, resist profile and as factors generally required for resists, the resolution, heat resistance, sensitivity and the like, the resin according to the present invention may be a copolymer containing various monomer repeating units in addition to those repeating units, namely, one or a plurality of the repeating unit represented by formula (I), one or a plurality of at least either one repeating unit represented by formula (IIa) or (IIb) and if desired, one or a plurality of the repeating unit represented by formula (III).

Preferred examples of the copolymerization component which is additionally contained include the repeating units represented by the following formulae (IV') and (V'):

(IV')

(V')

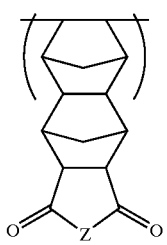

wherein Z represents oxygen atom, —NH—, —N($R_{50}$)—, —N(—$OSO_2R_{50}$)—, and $R_{50}$ represents a (substituted) alkyl group or a (substituted) cyclic hydrocarbon group which are the same as described above.

Specific examples of the repeating units represented by formulae (IV') and (V') include the following [IV'-9] to [IV'-16] and [V'-9] to [V'-16], however, the present invention is by no means limited to these specific examples.

[IV'-9]
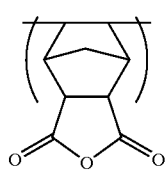

[IV'-10]
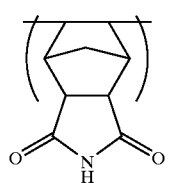

[IV'-11]
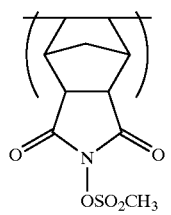

[IV'-12]
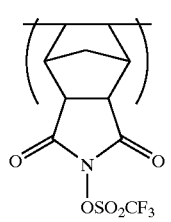

[IV'-13]
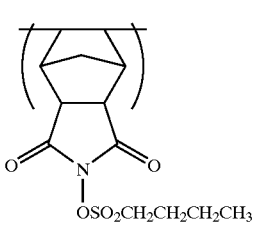

[IV'-14]
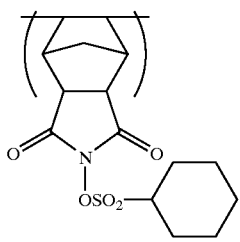

[IV'-15]
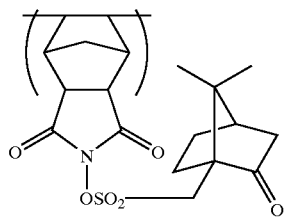

[IV'-16]
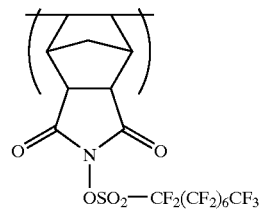

[V'-9]
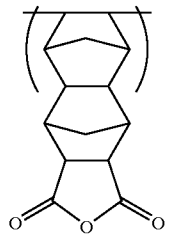

[V'-10]
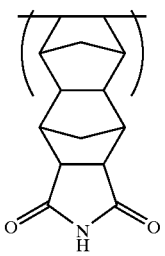

[V'-11]
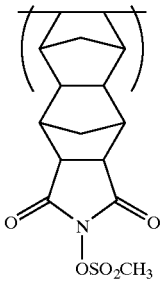

[V'-12]
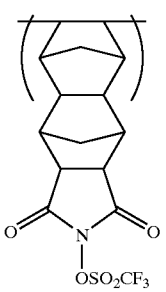
OSO₂CF₃

[V'-13]
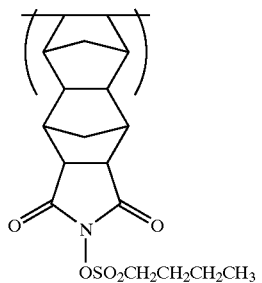
OSO₂CH₂CH₂CH₂CH₃

[V'-14]
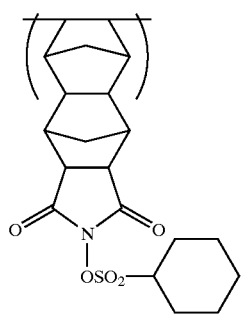
OSO₂—

[V'-15]
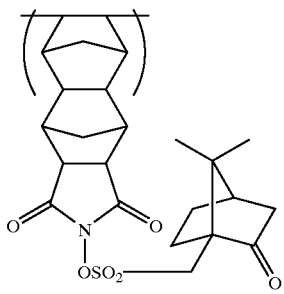
OSO₂—

[V'-16]
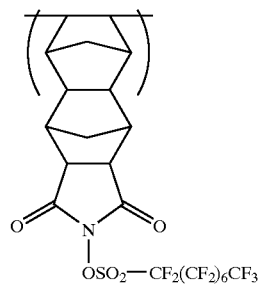
OSO₂—CF₂(CF₂)₆CF₃

In the resin according to the present invention, the following monomers may be further copolymerized to provide a repeating unit constituting the resin within the range of ensuring the effect of the present invention, however, the monomer which can be further copolymerized is not limited to the following monomers.

By the copolymerization of such monomers, the capabilities required for the resin, particularly (1) solubility in the coating solvent, (2) film-forming property (glass transition point), (3) alkali developability, (4) film loss (selection of hydrophilic/hydrophobic or alkali-soluble group), (5) adhesion to a substrate in the unexposed area and (6) dry etching resistance, can be subtly controlled.

Examples of such copolymerization monomers include compounds having one addition-polymerizable unsaturated bond selected from acrylic acid esters, methacrylic acid esters, acrylamides, methacrylamides, allyl compounds, vinyl ethers and vinyl esters.

Specific examples thereof include acrylic acid esters such as alkyl (the alkyl group preferably has from 1 to 10 carbon atoms) acrylates (e.g., methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate); methacrylic acid esters such as alkyl (the alkyl group preferably has from 1 to 10 carbon atoms) methacrylates (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate); acrylamides such as acrylamide, N-alkylacrylamide (where the alkyl group has from 1 to 10 carbon atoms, such as methyl group, ethyl group, propyl group, butyl group, tert-butyl group, heptyl group, octyl group, cyclohexyl group and hydroxyethyl group), N,N-dialkylacrylamide (where the alkyl group has from 1 to 10 carbon atoms, such as methyl group, ethyl group, butyl group, isobutyl group, ethylhexyl group and cyclohexyl group), N-hydroxyethyl-N-methylacrylamide and N-2-acetamidoethyl-N-acetylacrylamide; methacrylamides such as methacrylamide, N-alkylmethacrylamide (where the alkyl group has from 1 to 10 carbon atoms, such as methyl group, ethyl group, tert-butyl group, ethylhexyl group, hydroxyethyl group and cyclohexyl group), N,N-dialkylmethacrylamide (where the alkyl group is an ethyl group, a propyl group or a butyl group) and N-hydroxyethyl-N-methylmethacrylamide; allyl compounds such as allyl esters (e.g., allyl acetate, allyl caproate, allyl caprate, allyl laurate, allyl palmitate, allyl stearate, allyl benzoate, allyl acetoacetate, allyl lactate) and allyloxy ethanol; vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether); vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl-β-phenylbutyrate and vinyl chlorohexylcarboxylate; dialkyl itaconates such as dimethyl itaconate, diethyl itaconate and dibutyl itaconate; an acrylic acid, a methacrylic acid, a crotonic acid, an itaconic acid, an acrylonitrile and a methacrylonitrile.

In the acid-decomposable polymer containing the repeating unit represented by formula (I) and at least either one repeating unit represented by formula (IIa) or (IIb), the contents of the repeating unit represented by formula (I) and at least either one repeating unit represented by formula (IIa) or (IIb) may be appropriately selected by taking account of the desired dry etching resistance of the resist, the sensitivity, the prevention of cracking of the pattern, the adhesion to the substrate, the resist profile and as the factors generally required for resists, the resolution, heat resistance and the like. In the polymer compound (A) for use in the present invention, the content of the repeating unit represented by formula (I) is generally from 10 to 90 mol %, preferably from 15 to 70 mol %, more preferably from 20 to 50 mol %. The content of at least either one repeating unit represented by formula (IIa) or (IIb) is from 10 to 90 mol %, preferably from 20 to 80 mol %, more preferably from 25 to 50 mol %.

Also, in the acid-decomposable polymer containing the repeating unit represented by formula (I), at least either one repeating unit represented by formula (IIa) or (IIb) and the repeating unit represented by formula (III), the contents of the repeating units may be appropriately selected from the same standpoint as above. In the polymer compound (B) for use in the present invention, the content of the repeating unit represented by formula (I) is generally from 10 to 90 mol %, preferably from 15 to 70 mol %, more preferably from 20 to 50 mol %. The content of at least either one repeating unit represented by formula (IIa) or (IIb) is from 5 to 50 mol %, preferably from 10 to 40 mol %. The content of the repeating unit represented by formula (III) is from 10 to 90 mol %, preferably from 15 to 70 mol %, more preferably from 20 to 60 mol %.

The resin according to the present invention may also be synthesized by a method of copolymerizing a monomer corresponding to the repeating unit represented by formula (II), maleic acid anhydride and in the case of using an additional copolymerization component, a monomer of the copolymerization component in the presence of a polymerization catalyst, ring-open esterifying or hydrolyzing the repeating unit derived from the maleic acid anhydride in the copolymer obtained with an alcohol under basic or acidic conditions, and then bonding a desired substituent to the carboxylic acid site produced.

The resin according to the present invention preferably has a weight average molecular weight on a polystyrene basis by GPC method, of 1,000 to 200,000. If the weight average molecular weight is less than 1,000, the heat resistance or the dry etching resistance decreases and this is not preferred, whereas if it exceeds 200,000, disadvantageous results may occur, for example, the developability deteriorates or due to extremely high viscosity, the film-forming property changes for the worse.

In the positive working photoresist composition for far ultraviolet exposure of the present invention, the amount of the resin according to the present invention blended in the entire composition is preferably from 40 to 99.99 wt %, more preferably from 50 to 99.97 wt %, based on all solid contents in the resist.

The positive working photoresist composition of the present invention preferably contains an organic basic compound (component (D)). Examples of the organic basic compound include the following compounds:

(A)

wherein $R^{250}$, $R^{251}$ and $R^{252}$, which may be the same or different, each represents hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, provided that $R^{251}$ and $R^{252}$ may be combined with each other to form a ring;

(B)

(C)

(D)

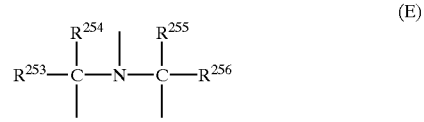
(E)

wherein $R^{253}$, $R^{254}$, $R^{255}$ and $R^{256}$, which may be the same or different, each represents an alkyl group having from 1 to 6 carbon atoms.

The compound is more preferably a nitrogen-containing basic compound having two or more nitrogen atoms different in the chemical environment within one molecule, still more preferably a compound having both a substituted or unsubstituted amino group and a ring structure containing nitrogen atom, or a compound having an alkylamino group. Specific preferred examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Specific examples of preferred compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)

pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4,3,0]nona-5-ene, 1,8-diazabicyclo[5,4,0]undeca-7-ene, 2,4,5-triphenylimidazole, N-methylmorpholine, N-ethylmorpholine, N-hydroxyethylmorpholine, N-benzylmorpholine, tertiary morpholine derivatives such as cyclohexyl-morpholinoethylthiourea (CHMETU), and hindered amines described in JP-A-11-52575 (for example, those described in [0005]), however, the present invention is by no means limited thereto.

Among these, more preferred are 1,5-diazabicyclo[4.3.0]-5-nonene, 1,8-diazabicyclo[5.4.0]-7-undecene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines such as CHMETU, and hindered amines such as bis(1,2,2,6,6-pentamethyl-4-piperidyl)sebacate, and still more preferred are 1,5-diazabicyclo[4,3,0]nona-5-ene, 1,8-diazabicyclo[5,4,0]undeca-7-ene, 1,4-diazabicyclo[2,2,2]octane, 4-dimethylaminopyridine, hexamethylenetetramine, CHMETU and bis(1,2,2,6,6-pentamethyl-4-piperidyl) sebacate.

These nitrogen-containing basic compounds may be used either individually or in combination of two or more thereof. The amount of the nitrogen-containing basic compound used is usually from 0.001 to 10 wt %, preferably from 0.01 to 5 wt %, based on all solid contents of the resist composition. If the amount used is less than 0.001 wt %, the effect by the addition of the nitrogen-containing basic compound may not be obtained, whereas if it exceeds 10 wt %, the sensitivity readily decreases or the developability in the unexposed area is liable to deteriorate.

The positive working photoresist composition for far ultraviolet exposure of the present invention preferably contains at least one surfactant (component (E)) selected from a fluorine-containing surfactant, a silicon-containing surfactant and a nonionic surfactant.

When the positive working photoresist composition for far ultraviolet exposure of the present invention contains the above-described acid-decomposable resin and the surfactant, the resist pattern obtained using an exposure light source of 250 nm or less, even 220 nm or less, can be not only reduced in the development defects and scumming but also favored with excellent line width reproducibility.

Examples of the surfactant include surfactants described in JP-A-62-36663, JP-A-61 -226746, JP-A-61-226745, JP-A-62-170950, JP-A-63-34540, JP-A-7-230165, JP-A-8-62834, JP-A-9-54432 and JP-A-9-5988. Also, the commercially available surfactants described below each may be used as it is.

Examples of the commercially available surfactants which can be used include fluorine-containing surfactants and silicon-containing surfactants, such as EFtop EF301 and EF303 (produced by Shin-Akita Kasei K.K.), Florad FC430 and 431 (produced by Sumitomo 3M Inc.), Megafac F171, F173, F176, F189 and R08 (produced by Dainippon Ink & Chemicals, Inc.), Serflon S-382, SC101, 102, 103, 104, 105 and 106 (produced by Asahi Glass Co., Ltd.). In addition, polysiloxane polymer KP-341 (produced by Shin-Etsu Chemical Co., Ltd.) may also be used as a silicon-containing surfactant.

Specific examples of other surfactants include nonionic surfactants including polyoxyethylene alkyl ethers such as polyoxyethylene lauryl ether, polyoxyethylene stearyl ether, polyoxyethylene cetyl ether and polyoxyethylene oleyl ether, polyoxyethylene alkylaryl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

The amount of the surfactant blended is usually from 0.001 to 2 wt %, preferably from 0.01 to 1 wt %, based on the solid content in the composition of the present invention.

These surfactants may be used either individually or in combination of two or more thereof.

The positive photosensitive composition of the present invention is coated using as the coating solvent (component (C)) at least one solvent selected from propylene glycol monoalkyl ether acetates such as propylene glycol monomethyl ether acetate and propylene glycol monoethyl ether acetate, alkyl lactate esters such as methyl lactate and ethyl lactate, propylene glycol monoalkyl ethers such as propylene glycol monomethyl ether and propylene glycol monoethyl ether, ethylene glycol monoalkyl ethers such as ethylene glycol monomethyl ether and ethylene glycol monoethyl ether, ethylene glycol monoalkyl ether acetates such as ethylene glycol monomethyl ether acetate and ethylene glycol monoethyl ether acetate, 2-heptanone, γ-butyrolactone, alkyl alkoxypropionates such as methyl methoxypropionate and ethyl ethoxypropionate, alkyl pyruvate esters such as methyl pyruvate and ethyl pyruvate, N-methylpyrrolidone, N,N-dimethylacetamide and dimethylsulfoxide.

Among these, preferred are propylene glycol monomethyl ether acetate, propylene glycol monoethyl ether acetate, methyl lactate and ethyl lactate. These solvents may be used individually or in combination, however, one or more of propylene glycol monoalkyl ether acetates and one or more of alkyl lactate esters are preferably selected and used as a mixed solvent.

The mixed solvent as the component (C) is preferably a mixed solvent containing at least one propylene glycol monoalkyl ether carboxylate (solvent of Group A), at least one of propylene glycol monoalkyl ether, alkyl lactate and alkoxyalkyl propionate (solvent of Group B) and/or at least one of γ-butyrolactone, ethylene carbonate and propylene carbonate (solvent of Group C). That is, for the component (C), a combination of a solvent of Group A and a solvent of Group B, a combination of a solvent of Group A and a solvent of Group C or a combination of a solvent of Group A, a solvent of Group B and a solvent of Group C is used. With use of a combination of solvent of Group A and a solvent of Group C, excellent results can be obtained particularly in the edge roughness. With a combination of a solvent of Group A and a solvent of Group C, the resist solution can be excellent particularly in the aging stability. With a combination of a solvent of Group A, a solvent of Group B and a solvent of Group C, excellent results can be obtained particularly in both the edge roughness and the aging stability of the resist solution.

Preferred examples of the propylene glycol monoalkyl ether carboxylate include propylene glycol monomethyl ether acetate, propylene glycol monomethyl ether propionate, propylene glycol monoethyl ether acetate and propylene glycol monoethyl ether propionate.

Preferred examples of the propylene glycol monoalkyl ether include propylene glycol monomethyl ether and propylene glycol monoethyl ether. Preferred examples of the alkyl lactate include methyl lactate and ethyl lactate. Preferred examples of the alkoxyalkyl propionate include 3-ethoxyethyl propionate, 3-methoxymethyl propionate, 3-methoxyethyl propionate and 3-ethoxymethyl propionate.

The weight ratio (A:B) between the solvent of Group A and the solvent of Group B used is preferably from 90:10 to 15:85, more preferably from 85:15 to 20:80, still more preferably from 80:20 to 25:75.

The weight ratio (A:C) between the solvent of Group A and the solvent of Group C used is preferably from 99.9:0.1 to 75:25, more preferably from 99:1 to 80:20, still more preferably from 97:3 to 85:15.

In the case of combining these three kinds of solvents, the weight ratio of the solvent of Group C used is preferably from 0.1 to 25 wt %, more preferably from 1 to 20 wt %, still more preferably from 3 to 17 wt %, based on all solvents.

In the present invention, the solid contents of the resist composition containing the above-described respective components are preferably dissolved in the mixed solvent to have a solid concentration of 3 to 25 wt %, more preferably from 5 to 22 wt %, still more preferably from 7 to 20 wt %.

Preferred combinations in the mixed solvent containing propylene glycol monoalkyl ether carboxylate for use in the present invention are set forth below:

propylene glycol monomethyl ether acetate+propylene glycol monomethyl ether,
propylene glycol monomethyl ether acetate+ethyl lactate,
propylene glycol monomethyl ether acetate+3-ethoxyethyl propionate,
propylene glycol monomethyl ether acetate+γ-butyrolactone,
propylene glycol monomethyl ether acetate+ethylene carbonate,
propylene glycol monomethyl ether acetate+propylene carbonate,
propylene glycol monomethyl ether acetate+propylene glycol monomethyl ether+γ-butyrolactone,
propylene glycol monomethyl ether acetate+ethyl lactate+γ-butyrolactone,
propylene glycol monomethyl ether acetate+3-ethoxyethyl propionate+γ-butyrolactone,
propylene glycol monomethyl ether acetate+propylene glycol monomethyl ether+ethylene carbonate,
propylene glycol monomethyl ether acetate+ethyl lactate+ethylene carbonate,
propylene glycol monomethyl ether acetate+3-ethoxyethyl propionate+ethylene carbonate,
propylene glycol monomethyl ether acetate+propylene glycol monomethyl ether+propylene carbonate,
propylene glycol monomethyl ether acetate+ethyl lactate+propylene carbonate, and
propylene glycol monomethyl ether acetate+3-ethoxyethyl propionate+propylene carbonate.

Among these, preferred are the following combinations:
propylene glycol monomethyl ether acetate+propylene glycol monomethyl ether+γ-butyrolactone,
propylene glycol monomethyl ether acetate+ethyl lactate+γ-butyrolactone,
propylene glycol monomethyl ether acetate+3-ethoxyethyl propionate+γ-butyrolactone,
propylene glycol monomethyl ether acetate+propylene glycol monomethyl ether+ethylene carbonate,
propylene glycol monomethyl ether acetate+ethyl lactate+ethylene carbonate,
propylene glycol monomethyl ether acetate+3-ethoxyethyl propionate+ethylene carbonate,
propylene glycol monomethyl ether acetate+propylene glycol monomethyl ether+propylene carbonate,
propylene glycol monomethyl ether acetate+ethyl lactate+propylene carbonate, and
propylene glycol monomethyl ether acetate+3-ethoxyethyl propionate+propylene carbonate.

In another embodiment, the component (C) for use in the present invention is a mixed solvent containing at least one alkyl lactate (a solvent of (1)) and at least one of an ester solvent and an alkoxyalkyl propionate (a solvent of (2)). When a combination of a solvent of (1) and a solvent of (2) is used, excellent results can be obtained particularly in the edge roughness. Preferred examples of the alkyl lactate include methyl lactate and ethyl lactate.

Preferred examples of the ester solvent include butyl acetate, pentyl acetate, hexyl acetate and butyl propionate, with butyl acetate being more preferred. Preferred examples of the alkoxyalkyl propionate include 3-ethoxyethyl propionate, 3-methoxymethyl propionate, 3-methoxyethyl propionate and 3-ethoxymethyl propionate.

The weight ratio ((1):(2)) between the solvent of (1) and the solvent of (2) is preferably from 90:10 to 15:85, more preferably from 85:15 to 20:80, still more preferably from 80:20 to 25:75.

In the present invention, the mixed solvent as the component (C) preferably further contains at least one of γ-butyrolactone, ethylene carbonate and propylene carbonate (a solvent of (3)). By adding the solvent of (3), generation of particles in the resist composition solution can be prevented and also, generation of particles in aging of the solution can be prevented.

The weight ratio of the solvent of (3) used is preferably from 0.1 to 25 wt %, more preferably from 1 to 20 wt %, still more preferably from 3 to 15 wt %, based on all solvents.

In the present invention, the solid contents of the resist composition containing the above-described respective components are preferably dissolved in this mixed solvent to have a solid concentration of 3 to 25 wt %, more preferably from 5 to 22 wt %, still more preferably from 7 to 20 wt %.

Preferred combinations in the mixed solvent containing alkyl lactate for use in the present invention are ethyl lactate+butyl acetate, ethyl lactate+butyl acetate+γ-butyrolactone, ethyl lactate+butyl acetate+ethylene carbonate, ethyl lactate+butyl acetate+propylene carbonate, ethyl lactate+3-ethoxyethyl propionate+γ-butyrolactone, ethyl lactate+3-ethoxyethyl propionate+ethylene carbonate, and ethyl lactate+3-ethoxyethyl propionate+propylene carbonate. Among these, more preferred are ethyl lactate+butyl acetate+γ-butyrolactone, ethyl lactate+butyl acetate+ethylene carbonate, ethyl lactate+butyl acetate+propylene carbonate, ethyl lactate+3-ethoxyethyl propionate+γ-butyrolactone, ethyl lactate+3-ethoxyethyl propionate+ethylene carbonate, and ethyl lactate+3-ethoxyethyl propionate+propylene carbonate.

In still another embodiment, the component (C) for use in the present invention is a solvent containing heptanone (a solvent of (4)). Examples of the heptanone include 2-heptanone, 3-heptanone and 4-heptanone, with 2-heptanone being preferred. By using a heptanone-type solvent, good results can be obtained in the edge roughness of the resist pattern. The component (C) preferably further contains at least one of propylene glycol monoalkyl ether, alkyl lactate and alkoxyalkyl propionate (a solvent of (5)).

By containing this solvent, the edge roughness of the resist pattern can be more improved.

Preferred examples of the propylene glycol monoalkyl ether include propylene glycol monoethyl ether and propylene glycol monoethyl ether. Preferred examples of the alkyl lactate include methyl lactate and ethyl lactate. Preferred examples of the alkoxyalkyl propionate include 3-ethoxyethyl propionate, 3-methoxymethyl propionate, 3-methoxyethyl propionate and 3-ethoxymethyl propionate.

The amount of the solvent of (4) used is usually 30 wt % or more, preferably 40 wt % or more, more preferably 50 wt % or more, based on all solvents. The amount of the solvent of (5) used is usually from 5 to 70 wt %, preferably from 10 to 60 wt %, more preferably from 15 to 50 wt %, based on all solvents. If the amount of the solvent of (5) used is less than this range, the effect by the addition decreases, whereas if it exceeds 70 wt %, there arise problems, for example, the coatability deteriorates, and this is not preferred.

In the present invention, the component (C) preferably further contains at least one of γ-butyrolactone, ethylene carbonate and propylene carbonate (a solvent of (6)). By containing the solvent of (6), generation of particles in the resist composition solution can be prevented and also, generation of particles in aging of the solution can be prevented.

The weight ratio of the solvent of (6) used is preferably from 0.1 to 25 wt %, more preferably from 1 to 20 wt %, still more preferably from 3 to 15 wt %, based on all solvents.

In the present invention, the solid contents of the resist composition containing the above-described respective components are preferably dissolved in this mixed solvent to have a solid concentration of 3 to 25 wt %, more preferably from 5 to 22 wt %, still more preferably from 7 to 20 wt %.

Preferred combinations in the mixed solvent containing heptanone for use in the present invention are 2-heptanone+propylene glycol monomethyl ether, 2-heptanone+ethyl lactate, 2-heptanone+3-ethoxyethyl propionate, 2-heptanone+γ-butyrolactone, 2-heptanone+ethylene carbonate, 2-heptanone+propylene carbonate, 2-heptanone+propylene glycol monomethyl ether+γ-butyrolactone, 2-heptanone+ethyl lactate+γ-butyrolactone, 2-heptanone+3-ethoxyethyl propionate+γ-butyrolactone, 2-heptanone+propylene glycol monomethyl ether+ethylene carbonate, 2-heptanone+ethyl lactate+ethylene carbonate, 2-heptanone+3-ethoxyethyl propionate+ethylene carbonate, 2-heptanone+propylene glycol monomethyl ether+propylene carbonate, 2-heptanone+ethyl lactate+propylene carbonate, and 2-heptanone+3-ethoxyethyl propionate+propylene carbonate. Among these, more preferred are 2-heptanone+propylene glycol monomethyl ether+γ-butyrolactone, 2-heptanone+ethyl lactate+γ-butyrolactone, 2-heptanone+3-ethoxyethyl propionate+γ-butyrolactone, 2-heptanone+propylene glycol monomethyl ether+ethylene carbonate, 2-heptanone+ethyl lactate+ethylene carbonate, 2-heptanone+3-ethoxyethyl propionate+ethylene carbonate, 2-heptanone+propylene glycol monomethyl ether+propylene carbonate, 2-heptanone+ethyl lactate+propylene carbonate, and 2-heptanone+3-ethoxyethyl propionate+propylene carbonate.

The positive working photoresist composition of the present invention may additionally contain, if desired, an acid-decomposable dissolution inhibiting compound, a dye, a plasticizer, a surfactant other than those described above, a photosensitizer, a compound capable of accelerating the solubility in the developer, and the like.

The positive working photoresist composition of the present invention is coated on a substrate to form a thin film.

The thickness of the coated film is preferably from 0.05 μm (50 nm) to 1.5 μm (1,500 nm), more preferably from 0.4 to 1.5 μm.

The composition is coated on a substrate (a substrate coated, for example, with silicon/silicon dioxide) for use in the production of precision integrated circuit devices by an appropriate coating method such as spinner and coater, exposed through a predetermined mask, baked and then developed, whereby a good resist pattern can be obtained. The exposure light used here is preferably a far ultraviolet ray at a wavelength of 250 nm or less, more preferably 220 nm or less. More specifically, a KrF eximer laser (248 nm), an ArF eximer laser (193 nm), an $F_2$ eximer laser (157 nm), an X ray, an electron beam and the like may be used. Among these, an ArF eximer laser (193 nm) is preferred.

The developer which can be used for the positive working photoresist composition for far ultraviolet exposure of the present invention is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcoholamines such as dimetylethanolamine and triethanolamine, quaternary ammonium salts such as tetramethylammonium hydroxide and tetraethylammonium hydroxide, and cyclic amines such as pyrrole and piperidine.

The alkaline aqueous solution may further contain an alcohol and a surfactant each in an appropriate amount.

EXAMPLES

The present invention is described in greater detail below by referring to the Examples, however, the present invention should not be construed as being limited thereto.

Synthesis Example (1)
(Synthesis of Resin (1))

29.1 g of tris(trimethylsilyl)-2-hydroxyethylsilane was added to 200 ml of dry THF and thereto 11.2 g of 4-dimethylaminopyridine was added. After cooling the reaction solution to 0° C., 13.7 g of 1-norbornene-4-carboxylic acid chloride was added dropwise thereto over 1 hour. While returning the reaction solution to room temperature, the reaction was continued for another 5 hours. The resulting reaction solution was concentrated under reduced pressure and then subjected to silica gel chromatography to obtain a cyclic olefin monomer.

19.6 g of this cyclic olefin monomer, 9.8 g of maleic acid anhydride and 4.3 g of methyl acrylate were dissolved in THF to prepare a solution having a solid content of 50%. This solution was charged into a three-neck flack and heated at 60° C. in a nitrogen stream. When the reaction solution was stabilized, 5 mol % of an initiator V-60 produced by Wako Junyaku was added to initiate the reaction. After the reaction for 6 hours, the reaction mixture was 2-fold diluted with THF, and a large amount of hexane was charged thereinto to precipitate a white powdered material. The precipitated powdered material was collected by filtration and dried to obtain Resin (1).

As a result of GPC measurement, Resin (1) obtained had a molecular weight of 5,600 in terms of the weight average using polystyrene as the standard sample.

Resins (2) to (8) were obtained in the same manner as above.

The molar ratios of respective repeating units and the weight average molecular weights of Resins (1) to (8) are shown in Table I-1 below.

TABLE I-1

|  | Repeating Unit (I) | Repeating Unit (IIa) or (IIb) | Repeating Unit (III) | Repeating Unit of Other Copolymerization Component | Mw |
|---|---|---|---|---|---|
| Resin (1) | 25 | 50 |  | 25 | 5700 |
| Resin (2) | 30 | 40 |  | 30 | 4500 |
| Resin (3) | 50 | 40/10 |  |  | 6400 |
| Resin (4) | 30 | 50 | 20 |  | 6500 |
| Resin (5) | 35 | 50 | 15 |  | 2200 |
| Resin (6) | 40 | 50 | 10 |  | 5600 |
| Resin (7) | 35 | 50/15 |  |  | 7200 |
| Resin (8) | 35 | 40 | 25 |  | 4300 |

Resin (1)

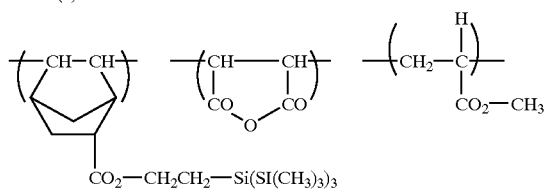

Resin (2)

Resin (3)

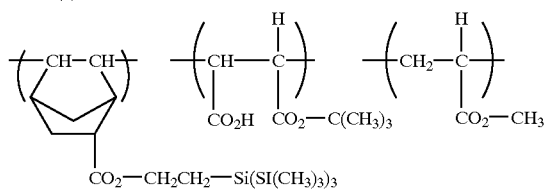

Resin (4)

Resin (5)

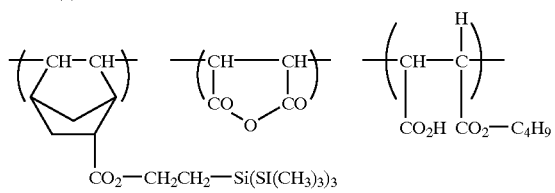

Resin (6)

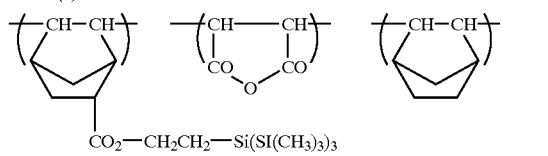

Resin (7)

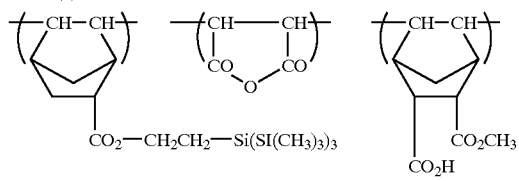

Resin (8)

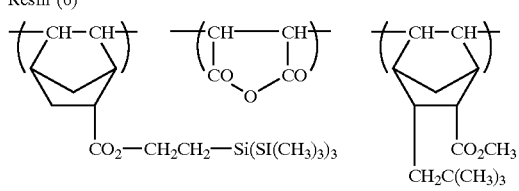

In Table I-2, PAG-1 indicates triphenylsulfonium triflate and PAG-2 indicates (PAG4-36) synthesized above. In Table I-1, Resin R1 in Comparative Examples has the following structure:

Resin (R1)

$$-(SO_{3/2})-\quad -(SO_{3/2})-$$
$$(CH_2)_2-CO_2H \quad (CH_2)_2-CO_2C(CH_3)_3$$

This compound was synthesized by the method described in JP-A-8-160623.

The surfactants used are:

W-1: Megafac F176 (produced by Dainippon Ink & Chemicals, Inc.) (fluorine-containing surfactant)
W-2: Megafac R08 (produced by Dainippon Ink & Chemicals, Inc.) (fluorine and silicone-containing surfactant)
W-3: polysiloxane polymer KP-341 (produced by Shin-Etsu Chemical Co., Ltd.)
W-4: polyoxyethylene nonyl phenyl ether.

Example I-1

2 g of Resin (1) as the acid-decomposable polymer component, 0.12 g of triphenylsulfonium perfluorooctane sulfonate as the compound component capable of generating an acid upon exposure and 0.012 g of DBU were dissolved in 19.2 g of propylene glycol monomethyl ether acetate and the resulting mixture was precision-filtered through a 0.1-μm membrane filter.

FHi-028D resist (resist for i-ray, produced by Fuji Film Olin) was coated on a silicon wafer using a coater CDS-650 manufactured by Canon and baked at 90° C. for 90 seconds to form a uniform film having a thickness of 0.83 μm. This was further heated at 200° C. for 3 minutes and then the film thickness was reduced to 0.71 μm. On this film, the silicon-containing resist prepared above was coated and baked at 90° C. for 90 seconds to have a layer thickness of 0.20 μm.

The thus-obtained wafer was exposed by an ArF stepper in which a resolution mask was loaded, while varying the exposure amount and the focus. Thereafter, the wafer was heated at 120° C. for 90 seconds in a clean room, developed with tetramethylammonium hydroxide developer (2.38%) for 60 seconds, rinsed with distilled water and dried to obtain a pattern. This pattern was observed by a scanning-type electron microscope, as a result, a line/space of 0.12 μm was resolved with a sensitivity of 30 mJ/cm². The rectangularity of the section was rated A.

The rectangularity of the section was compared according to the three-stage evaluation as follows. The angles of the substrate and resist pattern to the side wall were measured and those having an angle of 80° to 90° were rated A, those of 70° to less than 80° were rated B, and those of less than 70° were rated C. The wafer was further etched with oxygen as the etching gas using a parallel plate-type reactive ion etching apparatus manufactured by Albak for 15 minutes under the conditions that the pressure was 20 mTorr and the applied power was 100 mW/cm², and then observed through a scanning-type electron microscope. As a result, the dimensional shift of the 0.12-μm pattern was 0.005 μm.

(Evaluation Test)

The positive working photoresist composition solution obtained was coated on a silicon wafer using a spin coater and dried at 140° C. for 90 seconds to form an about 0.5-μm positive photoresist film, and this resist film was exposed by an ArF eximer laser (193 nm). After the exposure, the wafer with resist was heat treated at 140° C. for 90 seconds, developed with an aqueous 2.38% tetramethylammonium hydroxide solution and rinsed with distilled water to obtain a resist pattern profile.

Examples I-2 to I-8

Positive working photoresists were prepared thoroughly in the same manner as in Example I-1 except that the acid decomposable polysiloxane and acid generator shown in Table I-2 were used in place of the acid-decomposable polysiloxane and acid generator in Example I-1, respectively. Thereafter, the resists obtained each was exposed, developed and etched in the same manner as in Example I-1. The capabilities obtained are shown together in Table I-3.

TABLE I-2

| Sample | Acid Generator | Solvent | Organic Basic | Surfactant |
|---|---|---|---|---|
| Example | | | | |
| 1 | Resin (1) | PAG4-5 | PGMEA | DBU | W-1 |
| 2 | Resin (2) | PAG3-5 | PGMEA | DBU | W-1 |
| 3 | Resin (3) | PAG4-29 | PGMEA | TRI | W-2 |
| 4 | Resin (4) | PAG4-6 | EL | DBU | W-3 |
| 5 | Resin (5) | PAG3-29 | PGMEA | DMAP | W-4 |
| 6 | Resin (6) | PAG3-5 | PGMEA | TPI | W-1 |
| 7 | Resin (7) | PAG4-7 | EL | DBU | W-1 |
| 8 | Resin (8) | PAG4-26 | PGMEA | DBU | W-2 |
| 9 | Resin (1) | PAG4-5 | PGMEA:EL (8:2) | DBU | W-1 |
| 10 | Resin (1) | PAG4-2/ PAG4-5 (8:2) | PGMEA | DBU | W-1 |
| 11 | Resin (1) | PAG4-5 | PGMEA | DBU/DMAP (8:2) | W-2 |
| Comparative Example | R1 | PAG4-5 | PGMEA | DBU | W-1 |

TABLE I-3

| | Resolution (μm) | Sensitivity (mj/cm²) | Rectangularity | Dimensional Shift | Number of Development Defects |
|---|---|---|---|---|---|
| Example 1 | 0.12 | 18 | A | 0.004 | 46 |
| Example 2 | 0.13 | 21 | A | 0.006 | 59 |
| Example 3 | 0.12 | 17 | B | 0.005 | 45 |
| Example 4 | 0.13 | 18 | A | 0.004 | 56 |
| Example 5 | 0.12 | 17 | A | 0.005 | 64 |
| Example 6 | 0.12 | 19 | A | 0.006 | 58 |
| Example 7 | 0.13 | 15 | A | 0.004 | 55 |
| Example 8 | 0.12 | 14 | A | 0.005 | 51 |
| Example 9 | 0.13 | 18 | A | 0.006 | 46 |
| Example 10 | 0.12 | 29 | B | 0.004 | 57 |
| Example 11 | 0.12 | 26 | B | 0.011 | 94 |
| Comparative Example | 0.15 | 24 | C | 0.015 | 95 |

The positive working resist composition of the present invention can provide, in the production of semiconductor devices, a photoresist having high sensitivity, high resolution of 0.15 μm or less, and a rectangular shape, and can ensure good wettability to the developer, reduction in the development defects and at the transfer of a pattern to the lower layer in the process of oxygen plasma etching, small dimensional shift.

Examples II-1 to II-16 and Comparative Examples II-1 to II-3

(Preparation and Evaluation of Positive Working Resist Composition)

2 g of each resin shown in Table II-2 synthesized according to Synthesis Example described above was blended with 90 mg of photo-acid generator, 20 mg of organic basic compound and 30 mg of surfactant shown in Table II-2. Each mixture was dissolved in propylene glycol monoethyl ether acetate (PGMEA) to have a solid content of 14 wt % and the resulting solution was filtered through a 0.1-μm microfilter to prepare positive working resist compositions of Examples II-1 to II-16.

Positive working resist compositions of Comparative Examples II-1 to II-3 were also prepared in the same manner as in Examples II-1 to II-16 except that the resin and the photo-acid generator shown in above were used.

The surfactants used are:
W-1: Megafac F176 (produced by Dainippon Ink & Chemicals, Inc.) (fluorine-containing surfactant)
W-2: Megafac R08 (produced by Dainippon Ink & Chemicals, Inc.) (fluorine and silicone-containing surfactant)
W-3: polysiloxane polymer KP-341 (produced by Shin-Etsu Chemical Co., Ltd.)
W-4: polyoxyethylene nonyl phenyl ether.

The organic basic compounds used are:
1: DBU (1,8-diazabicyclo[5.4.0]-7-undecene)
2: DMAP (4-dimethylaminopyridine)
3: TPI (2,4,5-triphenylimidazole)

(Evaluation Test)

FHi-028D resist (resist for i-ray, produced by Fuji Film Olin) was coated on a silicon wafer using a coater CDS-650 manufactured by Canon and baked at 90° C. for 90 seconds to form a uniform film having a thickness of 0.83 μm. This was further heated at 200° C. for 3 minutes and then the film thickness was reduced to 0.71 μm. On this film, the resist solution prepared above was coated and baked at 90° C. for 90 seconds to have a layer thickness of 0.20 μm.

The thus-obtained wafer was exposed by an ArF eximer laser stepper in which a resolution mask was loaded, while varying the exposure amount and the focus. Thereafter, the wafer was heated at 120° C. for 90 seconds in a clean room, developed with tetramethylammonium hydroxide developer (2.38%) for 60 seconds, rinsed with distilled water and dried to obtain a pattern.

This pattern on the silicon wafer was observed by a scanning-type electron microscope and the resist was evaluated as follows.

The evaluation results obtained are shown in Table II-2.
[Sensitivity]

The exposure amount necessary for reproducing a 0.18-μm contact hole size with a pitch width of 1/10 was defined as the sensitivity, and the relative exposure amount assuming that the exposure amount of the resist in Example II-1 is 1.0 was shown as the relative sensitivity (exposure amount of other resist/exposure amount in Example 1).
[Resolution]

The resolution of contact hole was shown by the limiting contact hole size (μm) which can be resolved with the ately after the preparation (exposure amount before storage) as described above and after allowing the solution to stand at 40° C. for 1 week (exposure amount after storage), and then the coefficient of fluctuation of sensitivity was evaluated according to the following formula:

Coefficient of fluctuation of sensitivity (%)={(exposure amount before storage)−(exposure amount after storage)}/(exposure amount before storage)×100

[Defocus Latitude Depended on Line Pitch]

In a line-and-space pattern having a line width of 0.20 μm (dense pattern) and in an isolated line pattern (sparse pattern), the overlap range of focus depth was determined with a tolerance of 0.20 μm±10%. The larger range reveals better defocus latitude depended on line pitch.

TABLE II-2

| Example | Resin | Photo-Acid Generator | Organic Basic Compound | Surfactant | Sensitivity | Resolution (μm) | Particle Initial Value | Number of Particles Increased | Coefficient Fluctuation of Sensitivity (%) | Defocus Latitude Depended on Line Pitch (μm) |
|---|---|---|---|---|---|---|---|---|---|---|
| II-1 | 1 | PAG4-5 | 1 | 3 | 1.0 | 0.15 | 10 | 20 | 10 | 0.7 |
| II-2 | 2 | PAG4-7 | 2 | 2 | 1.0 | 0.15 | 10 | 20 | 10 | 0.7 |
| II-3 | 3 | PAG4-18 | 3 | 1 | 1.0 | 0.15 | 10 | 20 | 10 | 0.7 |
| II-4 | 4 | PAG4-26 | 1 | 2 | 1.0 | 0.15 | 10 | 20 | 10 | 0.7 |
| II-5 | 5 | PAG4-28 | 2 | 3 | 1.0 | 0.15 | 10 | 20 | 10 | 0.7 |
| II-6 | 6 | SI-1 | 3 | 2 | 0.9 | 0.14 | <5 | 10 | 5 | 0.9 |
| II-7 | 7 | SI-3 | 1 | 1 | 0.9 | 0.14 | <5 | 10 | 5 | 0.9 |
| II-8 | 8 | SI-4 | 2 | 2 | 0.9 | 0.14 | <5 | 10 | 5 | 0.9 |
| II-9 | 1 | SI-12 | 3 | 3 | 0.9 | 0.14 | <5 | 10 | 5 | 0.9 |
| II-10 | 2 | SI-14 | 1 | 1 | 0.9 | 0.14 | <5 | 10 | 5 | 0.9 |
| II-11 | 3 | SI-17 | 2 | 2 | 0.9 | 0.14 | <5 | 10 | 5 | 0.9 |
| II-12 | 4 | SI-3/SI-1 = 4/1 | 3 | 3 | 0.9 | 0.14 | <5 | 10 | 5 | 0.9 |
| II-13 | 5 | SI-4/PAG4-18 = 3/1 | 2 | 1 | 1.0 | 0.14 | 5 | 10 | 5 | 0.9 |
| II-14 | 6 | SI-3/PAG7-1 = 4/1 | 3 | 2 | 1.0 | 0.14 | 5 | 15 | 5 | 0.9 |
| II-15 | 7 | SI-3/PAG7-2 = 5/1 | 1 | 3 | 1.0 | 0.14 | 5 | 15 | 5 | 0.9 |
| II-16 | 8 | SI-4/PAG6-15 = 5/1 | 2 | 4 | 1.0 | 0.15 | 10 | 15 | 5 | 0.7 |
| Comparative Example II-1 | 1 | PAG4-5 | None | none | 1.5 | 0.16 | 30 | 45 | 50 | 0.2 |
| Comparative Exarnple II-2 | 2 | PAG3-5 | 1 | 1 | 2.0 | 0.18 | 65 | 350 | 70 | 0.1 |
| Comparative Example II-3 | 3 | PAG6-2 | 2 | 2 | 3.2 | 0.18 | 260 | 1200 | 120 | 0.1 |

PAG7-1: dicyclohexyldiazodisulfone
PAG7-2: bis(2,4-dimethylphenyl)diazosulfone exposure amount for reproducing a 0.18-μm contact hole size with a pitch width of 1/10.
[Number of Particles and Number of Particles Increased after Aging Storage]

The number of particles in the positive working photoresist composition solution (coating solution) prepared above was counted by means of a particle counter manufactured by Lion immediately after the preparation (particle initial value) and after allowing the solution to stand at 4° C. for 1 week (number of particles after aging). Both the particle initial value and the number of particles increased which was calculated by (number of particles after aging)−(particle initial value) were evaluated.
[Coefficient of Fluctuation of Sensitivity]

The positive working photoresist composition solution (coating solution) was evaluated on the sensitivity immedi- As seen from Table II-2, the positive working photoresist composition of the present invention exhibits excellent resolution of contact hole, particularly, a contact hole pattern having a broad space with a pitch of 1/10 or more. With respect to the storability, the change in aging (increase of particles) at 40° C. is reduced and excellent results are obtained in the defocus latitude depended on line pitch.

According to the present invention, a positive working photoresist composition for use in the production of semiconductor device can be provided, which is favored with high sensitivity, high resolution of 0.15 μm or less, good storage stability in aging and excellent defocus latitude depended on line pitch.

Examples III-1 to III-60 and Comparative Examples III-1 to III-8

(Preparation and Evaluation of Positive Working Resist Composition)

2 g of each resin shown in Tables III-2 to III-5 synthesized according to Synthesis Example described above was blended with 100 mg of photo-acid generator, 4 mg of organic basic compound and 5 mg of surfactant shown in Tables III-2 to III-5. Each mixture was dissolved in a solvent shown in Tables III-2 to III-5 to have a solid content of 10 wt % and the resulting solution was filtered through a 0.1-μm micro-filter to prepare positive working resist compositions of Examples III-1 to III-60.

Positive working resist compositions of Comparative Examples III-1 to III-8 were also prepared in the same manner as in Examples III-1 to III-60 except that the resin and the photo-acid generator shown in Table III-5 were used. The solvents used are:

S1: propylene glycol monomethyl ether acetate
S2: propylene glycol monomethyl ether propionate
S3: ethyl lactate
S4: butyl acetate
S5: 2-heptanone
S6: propylene glycol monomethyl ether
S7: ethoxyethyl propionate
S8: γ-butyrolactone
S9: ethylene carbonate
S10: propylene carbonate
S11: cyclohexanone.

The surfactants used are:
W-1: Megafac F176 (produced by Dainippon Ink & Chemicals, Inc.) (fluorine-containing surfactant)
W-2: Megafac R08 (produced by Dainippon Ink & Chemicals, Inc.) (fluorine and silicone-containing surfactant)
W-3: polysiloxane polymer KP-341 (produced by Shin-Etsu Chemical Co., Ltd.)
W-4: polyoxyethylene nonyl phenyl ether.

The organic basic compounds used are:
1: DBU (1,8-diazabicyclo[5.4.0]-7-undecene)
2: 4-DMAP (4-dimethylaminopyridine)
3: TPI (2,4,5-triphenylimidazole)

TABLE III-2

| Example | (B) Resin Component | (A) Photo-Acid Generator | (C) Solvent | (E) Surfactant | (D) Organic Basic Compound |
|---|---|---|---|---|---|
| III-1 | Resin (1) | PAG4-5 | S1/S3 = 75/25 | 1 | 1 |
| III-2 | Resin (2) | PAG4-6 | S1/S3/S8 = 70/27/3 | 2 | 2 |
| III-3 | Resin (3) | PAG4-7 | S1/S6 = 80/20 | 4 | 3 |
| III-4 | Resin (4) | PAG4-18 | S1/S6/S10 = 70/26/4 | 3 | 1 |
| III-5 | Resin (5) | PAG4-26 | S1/S7/S9 = 60/35/5 | 2 | 2 |
| III-6 | Resin (6) | PAG4-28 | S1/S7 = 70/30 | 1 | 3 |
| III-7 | Resin (7) | PAG4-35 | S1/S7/S10 = 65/28/7 | 3 | 1 |
| III-8 | Resin (8) | PAG3-29 | S1/S3/S8 = 60/35/5 | 2 | 2 |
| III-9 | Resin (1) | PAG3-5 | S2/S6/S9 = 70/26/4 | 1 | 3 |
| III-10 | Resin (2) | PAG6-14 | S2/S7/S10 = 66/30/4 | 2 | 1 |
| III-11 | Resin (3) | PAG6-19 | S1/S8 = 92/8 | 3 | 2 |
| III-12 | Resin (4) | PAG7-1/PAG4-5 = 1/2 | S1/S7/S10 = 70/26/4 | 1 | 3 |
| III-13 | Resin (5) | PAG7-2 | S2/S9 = 90/10 | 2 | 1 |
| III-14 | Resin (6) | PAG3-29/PAG7-2 = 3/1 | S1/S3/S8 = 70/25/5 | 3 | 2 |
| III-15 | Resin (7) | PAG4-6/PAG6-19 = 4/1 | S1/S7/S8 = 60/32/8 | 1 | 3 |
| III-16 | Resin (8) | PAG4-7/PAG7-1 = 5/1 | S1/S3/S9 = 70/25/5 | 2 | 1 |
| III-17 | Resin (1) | PAG3-5/PAG4-7 = 1/2 | S1/S3/S10 = 72/20/8 | 3 | 2 |
| III-18 | Resin (2) | PAG4-18/PAG7-1 = 3/1 | S1/S6/S8 = 80/17/3 | 1 | 3 |
| III-19 | Resin (3) | PAG4-28/PAG7-1 = 4/1 | S1/S10 = 90/10 | 2 | 2 |
| III-20 | Resin (4) | PAG3-29/PAG7-2 = 4/1 | S1/S7/S9 = 60/32/8 | 3 | 1 |

PAG7-1 dicyclohexyldiazomethane
PAG7-2 bis(2,4-dimethylphenyl)diazomethane

TABLE III-3

| Example | (B) Resin Component | (A) Photo-Acid Generator | (C) Solvent | (E) Surfactant | (D) Organic Basic Compound |
|---|---|---|---|---|---|
| III-21 | Resin (5) | PAG4-5 | S3/S4 = 60/40 | 3 | 1 |
| III-22 | Resin (6) | PAG4-6 | S3/S7 = 75/25 | 4 | 2 |
| III-23 | Resin (7) | PAG4-7 | S3/S4/S8 = 55/40/5 | 1 | 3 |
| III-24 | Resin (8) | PAG4-18 | S3/S4/S9 = 70/26/4 | 2 | 1 |
| III-25 | Resin (1) | PAG4-26 | S3/S7/S9 = 70/25/5 | 3 | 2 |
| III-26 | Resin (2) | PAG4-28 | S3/S7/S10 = 70/24/6 | 1 | 3 |
| III-27 | Resin (3) | PAG4-35 | S3/S4/S10 = 55/40/10 | 2 | 2 |
| III-28 | Resin (4) | PAG3-29 | S3/S4/S8 = 50/46/4 | 3 | 1 |
| III-29 | Resin (5) | PAG3-5 | S3/S7 = 70/30 | 1 | 2 |
| III-30 | Resin (6) | PAG6-14 | S3/S4 = 65/35 | 2 | 1 |
| III-31 | Resin (7) | PAG6-19 | S3/S4/S8 = 60/38/2 | 3 | 3 |
| III-32 | Resin (8) | PAG7-1/PAG4-5 = 1/2 | S3/S7 = 72/28 | 1 | 2 |
| III-33 | Resin (1) | PAG7-2 | S3/S4 = 70/30 | 2 | 1 |
| III-34 | Resin (2) | PAG3-29/PAG7-2 = 3/1 | S3/S4/S9 = 70/25/5 | 3 | 3 |
| III-35 | Resin (3) | PAG4-6/PAG6-19 = 4/1 | S3/S4/S10 = 67/29/4 | 2 | 2 |
| III-36 | Resin (4) | PAG4-7/PAG7-1 = 5/1 | S3/S7/S19 = 80/15/5 | 1 | 1 |
| III-37 | Resin (5) | PAG3-5/PAG4-7 = 1/2 | S3/S7/S9 = 70/23/7 | 3 | 3 |
| III-38 | Resin (6) | PAG4-18/PAG7-1 = 3/1 | S3/S7/S10 = 70/22/8 | 1 | 2 |
| III-39 | Resin (7) | PAG4-28/PAG7-1 = 4/1 | S3/S4/S9 = 60/37/3 | 2 | 1 |
| III-40 | Resin (8) | PAG3-29/PAG7-2 = 4/1 | S3/S7/S9 = 77/20/3 | 3 | 2 |

TABLE III-4

| Example | (B) Resin Component | (A) Photo-Acid Generator | (C) Solvent | (E) Surfactant | (D) Organic Basic Compound |
|---|---|---|---|---|---|
| III-41 | Resin (1) | PAG7-2 | S5 | 1 | 2 |
| III-42 | Resin (2) | PAG4-5/PAG2-1 = 3/1 | S5/S3/S8 = 70/27/3 | 2 | 3 |
| III-43 | Resin (3) | PAG3-5 | S5/S3 = 80/20 | 3 | 1 |
| III-44 | Resin (4) | PAG4-5 | S5 | 4 | 1 |
| III-45 | Resin (5) | PAG4-6 | S5/S3/S9 = 70/25/5 | 1 | 2 |
| III-46 | Resin (6) | PAG4-7 | S5/S8 = 90/10 | 2 | 3 |
| III-47 | Resin (7) | PAG4-7/PAG6-19 = 4/1 | S5/S9 = 88/12 | 3 | 2 |
| III-48 | Resin (8) | PAG4-18 | S5/S6/S10 = 70/20/10 | 1 | 1 |
| III-49 | Resin (1) | PAG4-26 | S5/S6 = 75/25 | 2 | 2 |
| III-50 | Resin (2) | PAG4-28 | S5/S6/S8 = 80/15/5 | 3 | 3 |
| III-51 | Resin (3) | PAG4-35 | S5/S6/S9 = 75/18/7 | 1 | 2 |
| III-52 | Resin (4) | PAG3/29 | S5/S10 = 88/12 | 2 | 1 |
| III-53 | Resin (5) | PAG6-14 | S5/S1 = 70/30 | 3 | 3 |
| III-54 | Resin (6) | PAG6-19 | S5/S7/S10 = 70/25/5 | 2 | 2 |
| III-55 | Resin (7) | PAG3-5/PAG7-2 = 5/1 | S5/S7/S8 = 70/22/8 | 1 | 1 |
| III-56 | Resin (8) | PAG4-7/PAG7-2 = 4/1 | S5/S7/S9 = 60/32/8 | 2 | 3 |
| III-57 | Resin (1) | PAG4-28/PAG7-1 = 5/1 | S5/S3/S10 = 67/28/5 | 3 | 2 |

TABLE III-4-continued

| Example | (B) Resin Component | (A) Photo-Acid Generator | (C) Solvent | (E) Surfactant | (D) Organic Basic Compound |
|---|---|---|---|---|---|
| III-58 | Resin (2) | PAG4-35/PAG4-5 = 1/1 | S5/S3/S8 = 60/30/10 | 2 | 1 |
| III-59 | Resin (3) | PAG4-7/PAG7-1 = 3/1 | S5/S7/S9 = 70/26/4 | 1 | 2 |
| III-60 | Resin (4) | PAG4-26/PAG7-1 = 2/1 | S5/S7/S10 = 70/27/3 | 2 | 3 |

TABLE III-5

| Comparative Example | (B) Resin Component | (A) Photo-Acid Generator | (C) Solvent | (E) Surfactant | (D) Organic Basic Compound |
|---|---|---|---|---|---|
| III-1 | Resin (1) | PAG4-5 | S1 | 1 | 1 |
| III-2 | Resin (2) | PAG3-5 | S3 | 2 | 2 |
| III-3 | Resin (3) | PAG7-2 | S11 | 3 | 3 |
| III-4 | Resin (4) | PAG6-19 | S2 | 4 | 1 |
| III-5 | Resin (5) | PAG4-18 | S1/S3 = 70/30 | none | None |
| III-6 | Resin (6) | PAG4-26 | S1 | none | None |
| III-7 | Resin (7) | PAG4-5/PAG7-1 = 2/1 | S5 | none | None |
| III-8 | Resin (8) | PAG4-28/PAG6-14 = 3/1 | S3/S6 = 80/20 | none | None |

(Evaluation Test)

FHi-028D resist (resist for i-ray, produced by Fuji Film Olin) was coated on a silicon wafer using a coater CDS-650 manufactured by Canon and baked at 90° C. for 90 seconds to form a uniform film having a thickness of 0.83 μm. This was further heated at 200° C. for 3 minutes and then the film thickness was reduced to 0.71 μm. On this film, the resist solution prepared above was coated and baked at 130° C. for 90 seconds to have a layer thickness of 0.20 μm.

The thus-obtained wafer was exposed by an ArF ecimer laser stepper in which a resolution mask was loaded, while varying the exposure amount and the focus. Thereafter, the wafer was heated at 130° C. for 90 seconds in a clean room, developed with tetramethylammonium hydroxide developer (2.38%) for 60 seconds, rinsed with distilled water and dried to obtain a pattern.

This pattern on the silicon wafer was observed by a scanning-type electron microscope and the resist was evaluated as follows.

The evaluation results obtained are shown in Tables III-6 to III-9.

[Edge Roughness]

The measurement of edge roughness was performed on the edge roughness of a 0.13-μm line-and-space (line/space= 1/1.2) pattern using a length measuring scanning-type electron microscope. The line pattern edge was detected in the measuring monitor at multiple positions and the variance ($3\sigma$) in the dispersion of detected positions was used as the index for the edge roughness. The smaller this value is, the better the edge roughness.

[Number of Particles and Number of Particles Increased after Aging Storage]

The number of particles in the positive working photoresist composition solution (coating solution) prepared above was counted by means of a particle counter manufactured by Lion immediately after the preparation (particle initial value) and after allowing the solution to stand at 40° C. for 1 week (number of particles after aging). Both the particle initial value and the number of particles increased which was calculated by (number of particles after aging)– (particle initial value) were evaluated.

[Coefficient of Fluctuation of Sensitivity]

The positive working photoresist composition solution (coating solution) was evaluated on the sensitivity immediately after the preparation (exposure amount before storage) as described above and after allowing the solution to stand at 40° C. for 1 week (exposure amount after storage) and then the coefficient of fluctuation of sensitivity was evaluated according to the following formula:

Coefficient of fluctuation of sensitivity (%)={(exposure amount before storage)–(exposure amount after storage)}/(exposure amount before storage)×100

[Defocus Latitude Depended on Line Pitch]

In a line-and-space pattern having a line width of 0.20 μm (dense pattern) and in an isolated line pattern (sparse pattern), the overlap range of focus depth was determined with a tolerance of 0.20 μm ±10%. The larger range reveals better defocus latitude depended on line pitch.

TABLE III-6

| Example | Roughness (nm) | Particle Initial Value | Number of Particles Increased | Coefficient of Fluctuation of Sensitivity (%) | Defocus Latitude Depended on Line Pitch (μm) |
|---|---|---|---|---|---|
| III-1 | 12 | 10 | 20 | 5 | 0.8 |
| III-2 | 11 | 5 | 5 | 5 | 0.8 |
| III-3 | 12 | 10 | 20 | 5 | 0.7 |
| III-4 | 11 | 5 | 5 | 5 | 0.8 |
| III-5 | 11 | 5 | 5 | 5 | 0.8 |

TABLE III-6-continued

| Example | Roughness (nm) | Particle Initial Value | Number of Particles Increased | Coefficient of Fluctuation of Sensitivity (%) | Defocus Latitude Depended on Line Pitch (μm) |
|---|---|---|---|---|---|
| III-6 | 12 | 10 | 20 | <5 | 0.8 |
| III-7 | 11 | <5 | <5 | 5 | 0.9 |
| III-8 | 12 | 5 | 10 | 5 | 0.7 |
| III-9 | 13 | 10 | 10 | 5 | 0.7 |
| III-10 | 13 | 10 | 15 | 5 | 0.6 |
| III-11 | 15 | 10 | 10 | 5 | 0.6 |
| III-12 | 11 | 5 | 5 | 5 | 0.8 |
| III-13 | 15 | 10 | 20 | 5 | 0.6 |
| III-14 | 12 | 5 | 10 | 5 | 0.6 |
| III-15 | 11 | 5 | 5 | 5 | 0.7 |
| III-16 | 11 | 5 | 5 | 5 | 0.8 |
| III-17 | 11 | 5 | 5 | 5 | 0.8 |
| III-18 | 11 | 5 | 5 | 5 | 0.8 |
| III-19 | 13 | 5 | 5 | 5 | 0.8 |
| III-20 | 12 | 5 | 10 | 5 | 0.7 |

TABLE III-7

| Example | Roughness (nm) | Particle Initial Value | Number of Particles Increased | Coefficient of Fluctuation of Sensitivity (%) | Defocus Latitude Depended on Line Pitch (μm) |
|---|---|---|---|---|---|
| III-21 | 13 | 10 | 15 | 5 | 0.8 |
| III-22 | 13 | 10 | 15 | 5 | 0.7 |
| III-23 | 12 | 5 | 10 | 5 | 0.8 |
| III-24 | 12 | 5 | 10 | 5 | 0.8 |
| III-25 | 12 | 5 | 10 | 5 | 0.8 |
| III-26 | 12 | 5 | 10 | 5 | 0.8 |
| III-27 | 11 | <5 | 5 | <5 | 0.9 |
| III-28 | 13 | 5 | 10 | 5 | 0.7 |
| III-29 | 14 | 10 | 20 | 5 | 0.7 |
| III-30 | 15 | 10 | 25 | 5 | 0.6 |
| III-31 | 14 | 10 | 20 | 5 | 0.6 |
| III-32 | 13 | 5 | 10 | 5 | 0.8 |
| III-33 | 15 | 10 | 25 | 5 | 0.6 |
| III-34 | 14 | 10 | 15 | 5 | 0.6 |
| III-35 | 12 | 5 | 10 | 5 | 0.7 |
| III-36 | 12 | 5 | 10 | 5 | 0.8 |
| III-37 | 12 | 5 | 10 | 5 | 0.8 |
| III-38 | 12 | 5 | 10 | 5 | 0.8 |
| III-39 | 12 | 5 | 10 | 5 | 0.8 |
| III-40 | 13 | 10 | 5 | 5 | 0.7 |

TABLE III-8

| Example | Roughness (nm) | Particle Initial Value | Number of Particles Increased | Coefficient of Fluctuation of Sensitivity (%) | Defocus Latitude Depended on Line Pitch (μm) |
|---|---|---|---|---|---|
| III-41 | 16 | 20 | 25 | 5 | 0.7 |
| III-42 | 12 | <5 | 5 | 5 | 0.8 |
| III-43 | 14 | 10 | 15 | 5 | 0.7 |
| III-44 | 15 | 20 | 20 | 5 | 0.6 |
| III-45 | 12 | <5 | 5 | 5 | 0.8 |
| III-46 | 14 | 5 | 10 | 5 | 0.8 |
| III-47 | 14 | 5 | 10 | 5 | 0.8 |
| III-48 | 12 | <5 | 5 | 5 | 0.8 |
| III-49 | 13 | 10 | 10 | 5 | 0.8 |
| III-50 | 12 | <5 | 5 | 5 | 0.8 |
| III-51 | 11 | <5 | <5 | <5 | 0.9 |
| III-52 | 15 | 5 | 10 | 5 | 0.7 |
| III-53 | 14 | 10 | 20 | 5 | 0.6 |
| III-54 | 13 | 5 | 10 | 5 | 0.6 |
| III-55 | 13 | 5 | 5 | 5 | 0.7 |

TABLE III-8-continued

| Example | Roughness (nm) | Particle Initial Value | Number of Particles Increased | Coefficient of Fluctuation of Sensitivity (%) | Defocus Latitude Depended on Line Pitch (μm) |
|---|---|---|---|---|---|
| III-56 | 12 | <5 | 5 | 5 | 0.8 |
| III-57 | 12 | <5 | 5 | 5 | 0.8 |
| III-58 | 11 | <5 | <5 | <5 | 0.9 |
| III-59 | 12 | <5 | 5 | 5 | 0.8 |
| III-60 | 12 | <5 | 5 | 5 | 0.8 |

TABLE III-9

| Comparative Example | Roughness (nm) | Particle Initial Value | Number of Particles Increased | Coefficient of Fluctuation of Sensitivity (%) | Defocus Latitude Depended on Line Pitch (μm) |
|---|---|---|---|---|---|
| III-1 | 23 | 460 | 860 | 25 | 0.2 |
| III-2 | 22 | 570 | 680 | 25 | 0.2 |
| III-3 | 25 | 1190 | 1640 | 25 | 0.2 |
| III-4 | 24 | 710 | 940 | 25 | 0.1 |
| III-5 | 20 | 370 | 720 | 40 | 0.1 |
| III-6 | 24 | 840 | 1030 | 50 | 0.1 |
| III-7 | 21 | 210 | 340 | 40 | 0.1 |
| III-8 | 22 | 230 | 310 | 40 | 0.1 |

As seen from Tables III-6 to III-9, the positive working photoresist composition of the present invention exhibited excellent capabilities in all of the evaluation items.

According to the present invention, a positive working photoresist composition for use in the production of semiconductor device can be provided, which is improved in the edge roughness of a resist pattern. Furthermore, a positive working photoresist composition favored with excellent storability, to speak specifically, reduced in aging changes (increase of particles, fluctuation of sensitivity) under the conditions at an elevated temperature of 40° C., and also with excellent defocus latitude depended on line pitch can be provided.

Synthesis Example (1')
(Synthesis of Resin (1'))

29.1 g of tris(trimethylsilyl)-2-hydroxyethylsilane was added to 200 ml of dry THF and thereto 11.2 g of 4-dimethylaminopyridine was added. After cooling the reaction solution to 0° C., 13.7 g of 1-norbornene-4-carboxylic acid chloride was added dropwise thereto over 1 hour. While returning the reaction solution to room temperature, the reaction was continued for another 5 hours. The resulting reaction solution was concentrated under reduced pressure and then subjected to silica gel chromatography to obtain a cyclic olefin monomer.

19.6 g of this cyclic olefin monomer, 9.8 g of maleic acid anhydride and 4.3 g of methyl acrylate were dissolved in THF to prepare a solution having a solid content of 50%. This solution was charged into a three-neck flack and heated at 60° C. in a nitrogen stream. When the reaction solution was stabilized, 2.5 mol % of an initiator V-601 produced by Wako Junyaku was added to initiate the reaction. After the reaction for 6 hours, the reaction mixture was 2-fold diluted with THF, and a large amount of hexane was charged thereinto to precipitate a white powdered material. The precipitated powdered material was collected by filtration and dried to obtain Resin (1').

As a result of GPC measurement, Resin (1') obtained had a molecular weight of 9,800 in terms of the weight average using polystyrene as the standard sample.

Resins (2') to (8') were obtained in the same manner as above.

The molar ratios of respective repeating units and the weight average molecular weights of Resins (1') to (8') are shown in Table IV-1 below.

TABLE IV-1

|  | Repeating Unit (I) | Repeating Unit (IIa) or (IIb) | Repeating Unit (III) | Repeating Unit of Other Co-polymerization Component | Mw |
| --- | --- | --- | --- | --- | --- |
| Resin (1') | 25 | 50 |  | 25 | 9800 |
| Resin (2') | 30 | 40 |  | 30 | 9600 |
| Resin (3') | 50 | 40/10 |  |  | 10300 |
| Resin (4') | 30 | 50 | 20 |  | 10200 |
| Resin (5') | 35 | 50 | 15 |  | 8300 |
| Resin (6') | 40 | 50 | 10 |  | 8600 |
| Resin (7') | 35 | 50/15 |  |  | 9100 |
| Resin (8') | 35 | 40 | 25 |  | 8700 |

Resin (1')

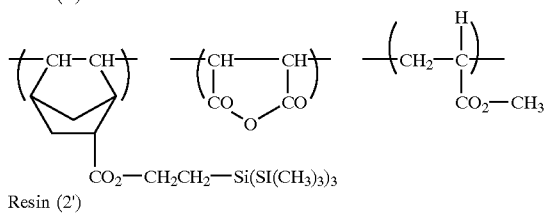

Resin (2')

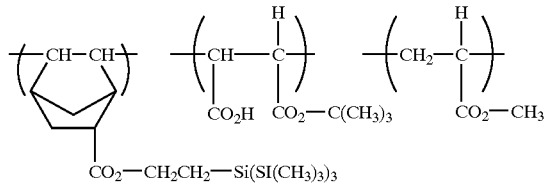

Resin (3')

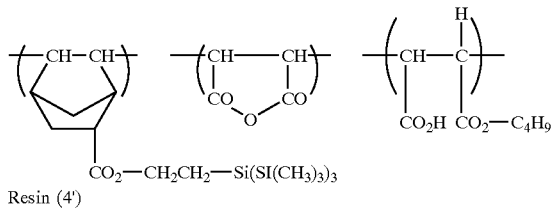

Resin (4')

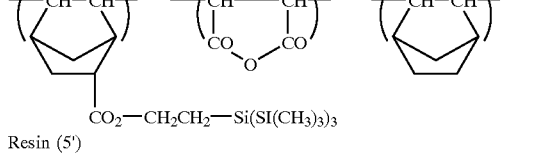

Resin (5')

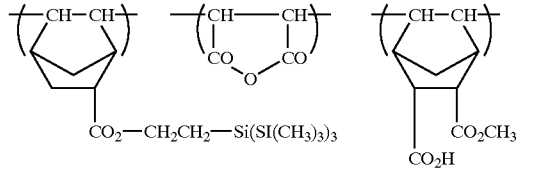

Resin (6')

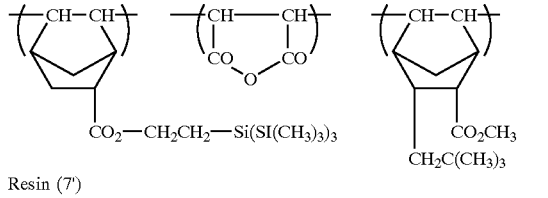

Resin (7')

TABLE IV-1-continued

|  | Repeating Unit (I) | Repeating Unit (IIa) or (IIb) | Repeating Unit (III) | Repeating Unit of Other Co-polymerization Component | Mw |
| --- | --- | --- | --- | --- | --- |

Resin (8')

Examples IV-1 to IV-24 and Comparative Examples IV-1 to IV-4

(Preparation and Evaluation of Positive Working Resist Composition)

2 g of each resin shown in Table IV-2 synthesized according to Synthesis Example described above was blended with 150 mg of photo-acid generator, 10 mg of organic basic compound and 10 mg of surfactant shown in Table IV-2. Each mixture was dissolved in propylene glycol monoethyl ether acetate to have a solid content of 10 wt % and the resulting solution was filtered through a 0.1 $\mu$m micro-filter to prepare positive working resist compositions of Examples IV-1 to IV-24.

Positive working resist compositions of Comparative Examples IV-1 to IV-4 were also prepared in the same manner as in Examples IV-1 to IV-24 except that the resin and the photo-acid generator shown above were used.

The surfactants used are:
W-1: Megafac F176 (produced by Dainippon Ink & Chemicals, Inc.) (fluorine-containing surfactant)
W-2: Megafac R08 (produced by Dainippon Ink & Chemicals, Inc.) (fluorine and silicone-containing surfactant)
W-3: polysiloxane polymer KP-341 (produced by Shin-Etsu Chemical Co., Ltd.)
W-4: polyoxyethylene nonyl phenyl ether.

The organic basic compounds used are:
1: DBU (1,8-diazabicyclo[5.4.0]-7-undecene)
2: 4-DMAP (4-dimethylaminopyridine)
3: TPI (2,4,5-triphenylimidazole)

(Evaluation Test)

FHi-028D resist (resist for i-ray, produced by Fuji Film Olin) was coated on a silicon wafer using a coater CDS-650 manufactured by Canon and baked at 90° C. for 90 seconds to form a uniform film having a thickness of 0.83 $\mu$m. This was further heated at 200° C. for 3 minutes and then the film thickness was reduced to 0.71 $\mu$m. On this film, the resist solution prepared above was coated and baked at 130° C. for 90 seconds to have a layer thickness of 0.20 $\mu$m.

The thus-obtained wafer was exposed by an ArF eximer laser stepper in which a resolution mask was loaded, while varying the exposure amount and the focus. Thereafter, the wafer was heated at 130° C. for 90 seconds in a clean room, developed with tetramethylammonium hydroxide developer (2.38%) for 60 seconds, rinsed with distilled water and dried to obtain a pattern.

This resist pattern on the silicon wafer was observed by a scanning-type electron microscope and the resist was evaluated as follows.

The evaluation results obtained are shown in Table IV-2.

[Exposure Margin]

The coefficient of fluctuation (%) in the line width of a pattern, obtained when the exposure amount necessary for reproducing a mask line width of a 0.13-μm isolated line was fluctuated by ±5% was used as the index for the exposure margin. The smaller this value, the better the exposure margin.

TABLE IV-2

| Example | Resin | Photo-Acid Generator | Organic Basic Compound | Surfactant | Exposure Margin (%) |
|---|---|---|---|---|---|
| IV-1 | 1 | I-3 | 1 | 1 | <5 |
| IV-2 | 2 | I-7 | 2 | 2 | <5 |
| IV-3 | 3 | I-15 | 3 | 3 | <5 |
| IV-4 | 4 | I-28 | 1 | 1 | <5 |
| IV-5 | 5 | I-29 | 2 | 2 | <5 |
| IV-6 | 6 | II-3 | 3 | 3 | <5 |
| IV-7 | 7 | II-5 | 1 | 1 | <5 |
| IV-8 | 8 | III-3 | 2 | 2 | <5 |
| IV-9 | 1 | III-15 | 3 | 3 | <5 |
| IV-10 | 2 | I-2 | 1 | 1 | 5 |
| IV-11 | 3 | I-4 | 2 | 2 | <5 |
| IV-12 | 4 | I-5 | 3 | 3 | 5 |
| IV-13 | 5 | I-30 | 1 | 1 | <5 |
| IV-14 | 6 | II-1 | 2 | 2 | 5 |
| IV-15 | 7 | III-1 | 3 | 3 | 7 |
| IV-16 | 8 | III-2 | 1 | 4 | 6 |
| IV-17 | 1 | I-3/PAG4-5 = 5/1 | 2 | 1 | <5 |
| IV-18 | 2 | I-7/PAG4-2 = 8/1 | 3 | 2 | <5 |
| IV-19 | 3 | I-29/PAG4-31 = 4/1 | 1 | 3 | <5 |
| IV-20 | 4 | II-3/PAG6-4 = 5/1 | 2 | 1 | <5 |
| IV-21 | 5 | III-3/PAG6-15 = 4/1 | 3 | 2 | <5 |
| IV-22 | 6 | I-28/PAG7-1 = 5/1 | 1 | 3 | <5 |
| IV-23 | 7 | I-4/PAG7-2 = 3/1 | 2 | 1 | <5 |
| IV-24 | 8 | I-10/PAG3-18 = 7/1 | 3 | 2 | 5 |
| Comparative Example IV-1 | 1 | PAG4-5 | 2 | 1 | 30 |
| Comparative Example IV-2 | 2 | PAG4-28 | 3 | 2 | 25 |
| Comparative Example IV-3 | 3 | PAG3-5 | 1 | 3 | 40 |
| Comparative Example IV-4 | 4 | I-3 | none | none | 20 |

PAG7-1: dicyclohexylsulfonyldiazomethane
PAG7-2: bis(2,4-dimethylphenylsulfonyl)diazomethane As seen from Table IV-2, the positive working photoresist composition of the present invention exhibited excellent capability with respect to the exposure margin.

According to the present invention, a positive working photoresist composition for the use in the production of semiconductor device can be provided, which has an improvement effect on the exposure margin (particularly on the exposure margin of isolated lines), in other words, the fluctuation of line width of an isolated line is small when the exposure amount is changed.

While the invention has been described in detail and with reference to specific embodiments thereof, it will be apparent to one skilled in the art that various changes and modifications can be made therein without departing from the spirit and scope thereof.

What is claimed is:

1. A positive working photoresist composition comprising an acid-decomposable polymer containing at least a repeating unit represented by the following formula (I) and at least one repeating unit selected from the group consisting of repeating units represented by the following formula (IIa) and (IIb):

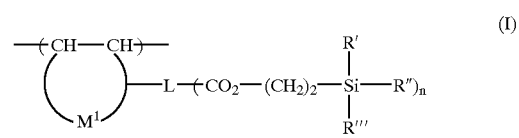

wherein $M^1$ represents an atomic group for forming an alicyclic structure which contains two bonded carbon atoms (C—C) and which may have a substituent, n represents 1 or 2, L represents a single bond or a (n+1)-valent linking group with one end being connected to the carbon atom participating in the formulation of a ring, R', R" and R'" each independently represents an alkyl, phenyl, trialkylsilyl or trialkylsilyloxy group having a linear or branched chain:

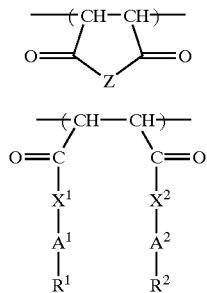

(IIa)

(IIb)

wherein Z represents oxygen atom or —N($R^3$)—, $R^3$ represents hydrogen atom, a hydroxyl group, an alkyl group having a linear or branched chain or —O—$SO_2$—$R^4$, $R^4$ represents an alkyl group or a trihalomethyl group, $X^1$ and $X^2$ each independently represents oxygen atom, sulfur atom, —NH— or —$NHSO_2$—, $A^1$ and $A^2$ each independently represents a single bond or a divalent linking group, $R^1$ and $R^2$ each represents hydrogen atom, a cyano group, a hydroxyl group, —COOH, —$COOR^5$, —CO—NH—$R^6$, an alkyl group which may be substituted, an alkoxy group which may be substituted, or a cyclic hydrocarbon group which may be substituted, $R^5$ represents an alkyl group which may be substituted, or a cyclic hydrocarbon group which may be substituted, and $R^6$ represents an alkyl group which may be substituted.

2. The positive working photoresist composition as claimed in claim 1, wherein the acid-decomposable polymer further contains a repeating unit represented by the following formula (III):

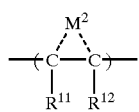

(III)

wherein $M^2$ represents an atomic group for forming an alicyclic structure which contains two bonded carbon atoms (C—C) and which may have a substituent, and $R^{11}$ and $R^{12}$ each independently represents hydrogen atom, a cyano group, a halogen atom or an alkyl group which may have a substituent.

3. A positive working photoresist composition comprising:

(A) a compound capable of generating an acid upon irradiation with actinic rays or radiation, (B) an acid-decomposable polymer containing at least a repeating unit represented by the following formula (I) and at least one repeating unit selected from the group consisting of repeating units represented by the following formula (IIa) or (IIb), (C) at least one solvent capable of dissolving the components (A) and (B), (D) an organic basic compound, and (E) at least one surfactant selected from fluorine-containing surfactants, silicon-containing surfactants and nonionic surfactants:

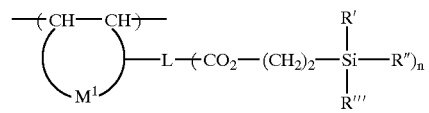

(I)

wherein $M^1$ represents an atomic group for forming an alicyclic structure which contains two bonded carbon atoms (C—C) and which may have a substituent, n represents 1 or 2, L single bond or a (n+1)-valent linking group with one end being connected to the carbon atom participating in the formation of a ring, R', R", and R'" each independently represents an alkyl, phenyl, trialkylsilyl or trialkylsilyloxy group having a linear or branched chain:

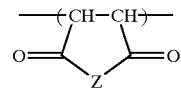

(IIa)

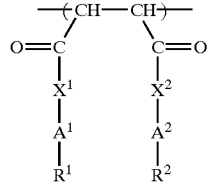

(IIb)

wherein Z represents oxygen atom or —N($R^3$)—, $R^3$ represents hydrogen atom, a hydroxyl group, an alkyl group having a linear or branched chain or —O—$SO_2$—$R^4$, $R^4$ represents an alkyl group or a trihalomethyl group, $X^1$ and $X^2$ each independently represents oxygen atom, sulfur atom, —NH— or —$NHSO_2$—, A1 and $A^2$ each independently represents a single bond or a divalent linking group, $R^1$ and $R^2$ each represents hydrogen atom, a cyano group, a hydroxyl group, —COOH, —$COOR^5$, —CO—NH—$R^6$, an alkyl group which may be substituted, an alkoxy group which may be substituted, or a cyclic hydrocarbon group which may be substituted, $R^5$ represents an alkyl group which may be substituted, or a cyclic hydrocarbon group which may be substituted, and $R^6$ represents an alkyl group which may be substituted.

4. The positive working photoresist composition as claimed in claim 3, wherein the compound (A) capable of generating an acid upon irradiation with actinic rays or radiation generates an acid having one structure selected from the following groups (A1) to (A3) upon irradiation with actinic rays or radiation:

(A1) $CF_3SO_3H$, (A2) $CF_3(CF_2)_nSO_3H$, wherein n represents an integer of 1 to 9, and (A3) $C_6F_mH_{5-m}SO_3H$, wherein m represents an integer of 1 to 5.

5. The positive working photoresist composition as claimed in claim 3, wherein the compound (A) capable of generating an acid upon irradiation with actinic rays or radiation is a sulfonium salt compound represented by the following formula (PAG4):

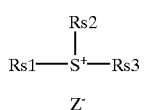

(PAG4)

wherein Rs1 to Rs3 each independently represents an alkyl group which may have a substituent or an aryl group which may have a substituent, each pair out of Rs1 to Rs3 may be combined through a single bond or a substituent, and Z⁻ represents a counter anion.

6. The positive working photoresist composition as claimed in claim 3, wherein the compound (A) is a sulfonium salt compound capable of generating an acid upon irradiation with actinic rays or radiation, represented by the following formula (sI):

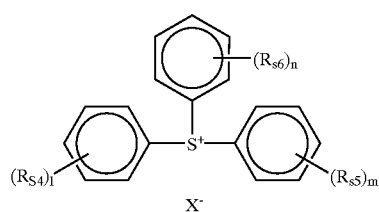

(sI)

wherein Rs4 to Rs6 each represents hydrogen atom, an alkyl group which may have a substituent, a cycloalkyl group which may have a substituent, an alkoxy group which may have a substituent, an alkoxycarbonyl group which may have a substituent, an acyl group which may have a substituent, an acyloxy group which may have a substituent, a nitro group, a halogen atom, a hydroxyl group or a carboxyl group, l represents a number of 1 to 5, m represents a number of 0 to 5, and n represents a number of 0 to 5, with the proviso that when l+m+n is 1, Rs4 represents an alkyl group which may have a substituent, a cycloalkyl group which may have a substituent, an alkoxy group which may have a substituent, an alkoxycarbonyl group which may have a substituent, an acyl group which may have a substituent, or an acyloxy group which may have a substituent, X represents R—SO₃, and R represents an aliphatic hydrocarbon group which may have a substituent or an aromatic hydrocarbon group which may have a substituent.

7. The positive working photoresist composition as claimed in claim 3, wherein the polymer (B) further contains a repeating unit represented by the following formula (III):

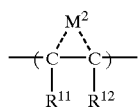

(III)

wherein $M^2$ represents an atomic group for forming an alicyclic structure which contains two bonded carbon atoms (C—C) and which may have a substituent, and $R^{11}$ and $R^{12}$ each independently represents hydrogen atom, a cyano group, a halogen atom or an alkyl group which may have a substituent.

8. The positive working photoresist composition as claimed in claim 3, wherein the solvent (C) is a mixture of at least one selected from propylene glycol monoalkyl ether acetates and at least one selected from alkyl lactates.

9. The positive working photoresist composition as claimed in claim 3, wherein the solvent (C) is a mixed solvent containing at least one solvent selected from the following Group A and at least one solvent selected from the following Group B or containing at least one solvent selected from Group A and at least one solvent selected from the following Group C:

Group A: propylene glycol monoalkyl ether alkoxylate

Group B: propylene glycol monoalkyl ether, alkyl lactate and alkoxyalkyl propionate Group C: γ-butyrolactone, ethylene carbonate and propylene carbonate.

10. The positive working photoresist composition as claimed in claim 3, wherein the solvent (C) is a mixed solvent containing at least one solvent selected from the following Group A, at least one solvent selected from the following Group B and at least one solvent selected from the following Group C:

Group A: propylene glycol monoalkyl ether alkoxylate

Group B: propylene glycol monoalkyl ether, alkyl lactate and alkoxyalkyl propionate Group C: γ-butyrolactone, ethylene carbonate and propylene carbonate.

11. The positive working photoresist composition as claimed in claim 3, wherein the solvent (C) is a mixed solvent containing at least one alkyl lactate and at least one of an ester solvent and an alkoxyalkyl propionate.

12. The positive working photoresist composition as claimed in claim 11, wherein the solvent (C) further contains at least one of γ-butyrolactone, ethylene carbonate and propylene carbonate.

13. The positive working photoresist composition as claimed in claim 3, wherein the solvent (C) is a solvent containing heptane.

14. The positive working photoresist composition as claimed in claim 13, wherein the solvent (C) further contains at least one of propylene glycol monoalkyl ether, alkyl lactate and alkoxyalkyl propionate.

15. The positive working photoresist composition as claimed in claim 3, wherein the compound (A) capable of generating an acid upon irradiation with actinic rays or radiation is at least one compound represented by the following formula (I'), (II') or (III'):

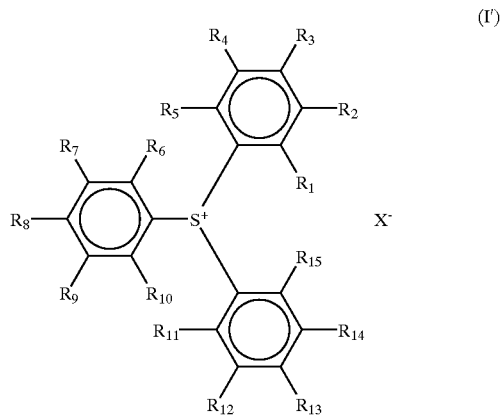

(I')

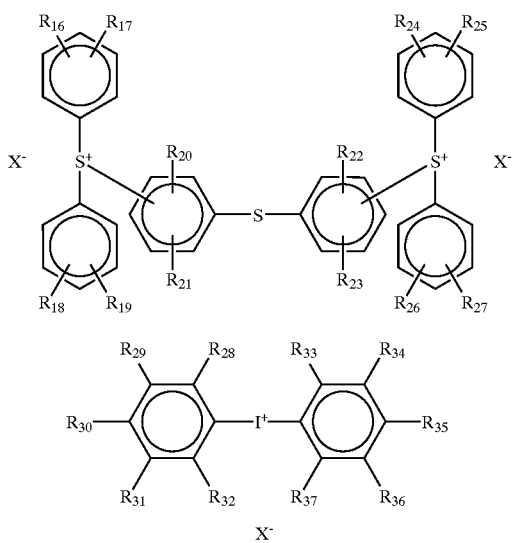

wherein $R_1$ to $R_{37}$, which may be the same or different, each represents hydrogen atom, a linear, branched or cyclic alkyl group, a linear, branched or cyclic alkoxy group, a hydroxyl group, a halogen atom or a —S—$R_{38}$ group; $R_{38}$ represents a linear, branched or cyclic alkyl group or an aryl group; two or more of $R_1$ to $R_{15}$, two or more of $R_{16}$ to $R_{27}$, or two or more of $R_{28}$ to $R_{37}$ may be combined to form a ring containing one or more selected from a single bond, carbon, oxygen, sulfur and nitrogen; and $X^-$ represents $R^F SO_3^-$, wherein $R^F$ represents a fluorine-substituted linear, branched or cyclic alkyl group having two or more carbon atoms.

16. The positive working photoresist composition as claimed in claim 15, wherein $R^F$ represented by $X^-$ is a fluorine-substituted linear alkyl group represented by $CF_3(CF_2)_y$, wherein y is an integer of 1 to 15.

17. The positive working photoresist composition as claimed in claim 16, wherein y is an integer of 3 to 13.

18. The positive working photoresist composition as claimed in claim 17, wherein y is an integer of 7 to 11.

19. The positive working photoresist composition as claimed in claim 3, wherein the acid-decomposable polymer (B) is a resin which increases in the solubility in an alkali developer under the action of an acid.

* * * * *